(12) United States Patent
Nagai

(10) Patent No.: US 8,008,189 B2
(45) Date of Patent: Aug. 30, 2011

(54) SEMICONDUCTOR DEVICE MANUFACTURING METHOD, SEMICONDUCTOR DEVICE, AND SEMICONDUCTOR WAFER STRUCTURE

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 591 days.

(21) Appl. No.: 12/034,976

(22) Filed: Feb. 21, 2008

(65) Prior Publication Data
US 2008/0197506 A1    Aug. 21, 2008

(30) Foreign Application Priority Data
Feb. 21, 2007    (JP) .................................. 2007-040323

(51) Int. Cl.
*H01L 21/4763* (2006.01)
(52) U.S. Cl. ................................. 438/637; 257/E21.585
(58) Field of Classification Search .................. 438/637, 438/638, 639, 640, 689
See application file for complete search history.

(56) References Cited

U.S. PATENT DOCUMENTS

| | | | | |
|---|---|---|---|---|
| 5,356,722 A * | 10/1994 | Nguyen et al. | ................. | 427/569 |
| 6,458,710 B1 * | 10/2002 | Burke | ............................ | 438/713 |
| 6,767,825 B1 * | 7/2004 | Wu | ................................ | 438/633 |
| 6,803,300 B2 * | 10/2004 | Higashi et al. | ................. | 438/598 |
| 7,078,241 B2 * | 7/2006 | Son et al. | ............................ | 438/3 |
| 7,183,202 B2 * | 2/2007 | Lee et al. | ....................... | 438/638 |
| 7,189,650 B2 * | 3/2007 | Liu et al. | ........................ | 438/687 |
| 7,259,093 B2 * | 8/2007 | Hermes | .......................... | 438/638 |

FOREIGN PATENT DOCUMENTS

| | | | |
|---|---|---|---|
| JP | 63-272035 | * | 11/1998 |
| JP | 2002-43237 A | | 2/2002 |
| JP | 3556437 B2 | | 8/2004 |

* cited by examiner

*Primary Examiner* — Charles Garber
*Assistant Examiner* — Reema Patel
(74) *Attorney, Agent, or Firm* — Westerman, Hattori, Daniels & Adrian, LLP

(57) ABSTRACT

A semiconductor device manufacturing method, includes the steps of forming an insulating film over a semiconductor substrate, thinning selectively a thick portion, whose film thickness is thicker than a reference value, of the insulating film, forming contact holes in a thinned portion of the insulating film 25, and forming conductive plugs in the contact holes.

17 Claims, 59 Drawing Sheets

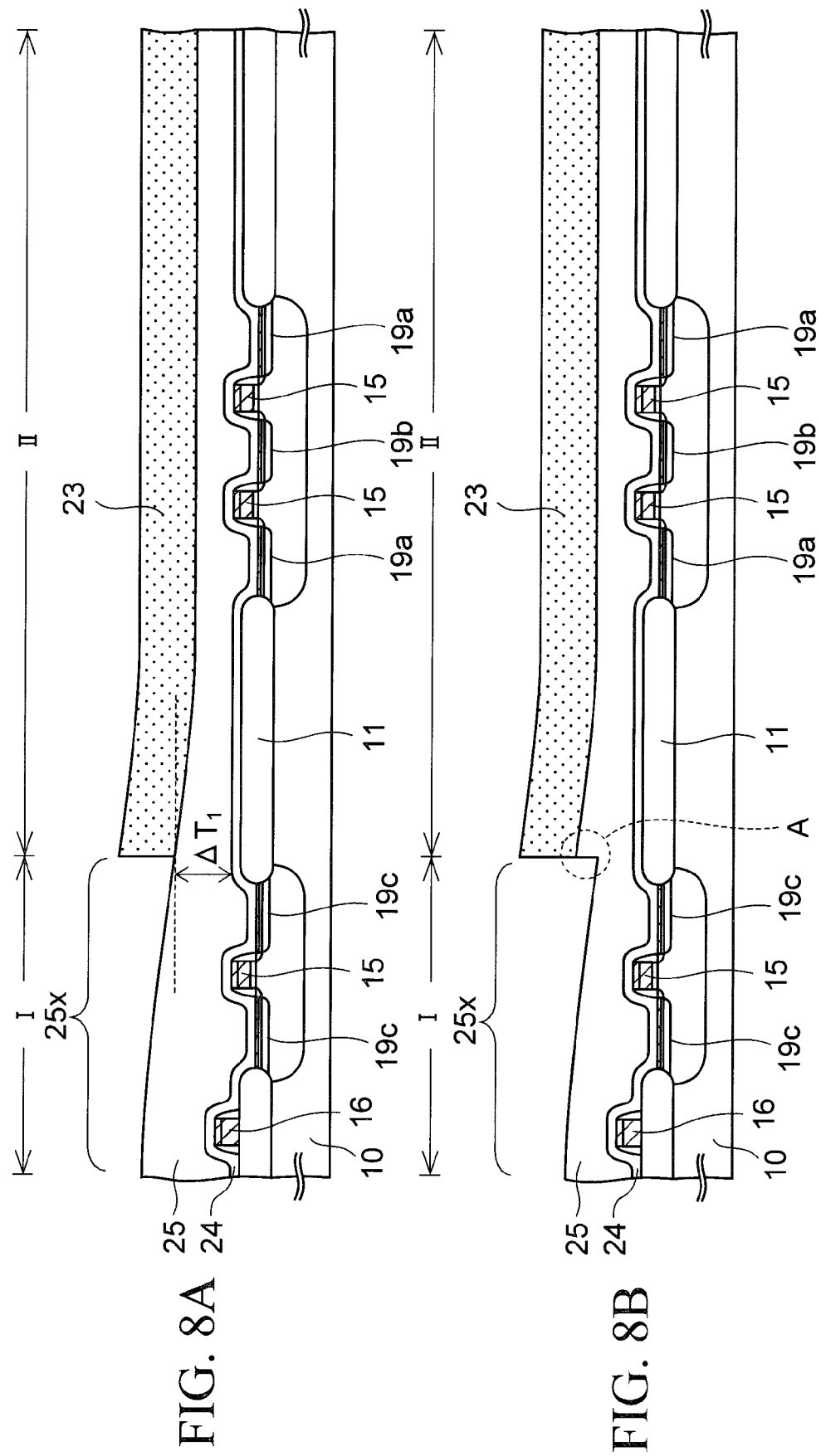

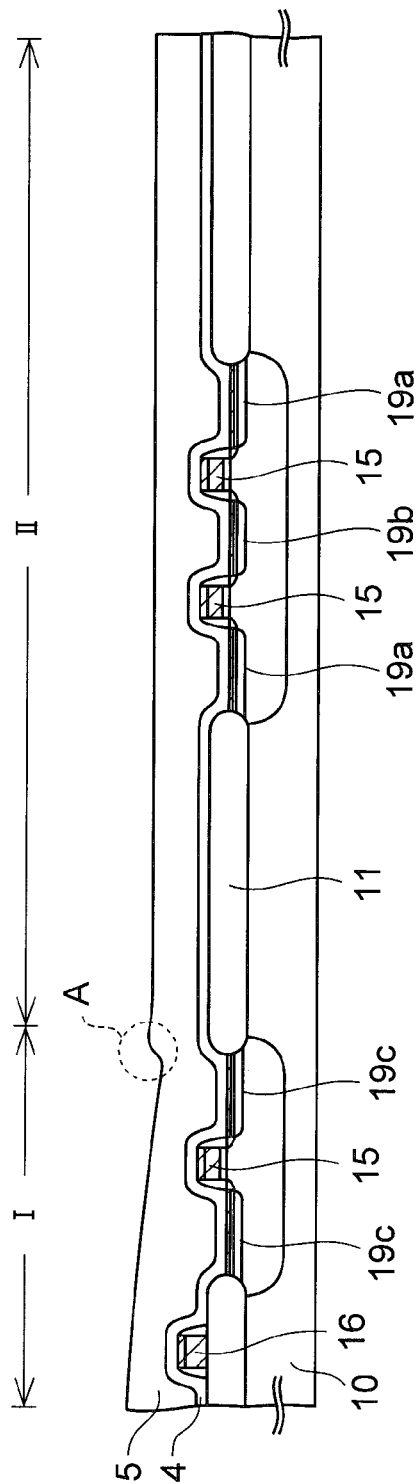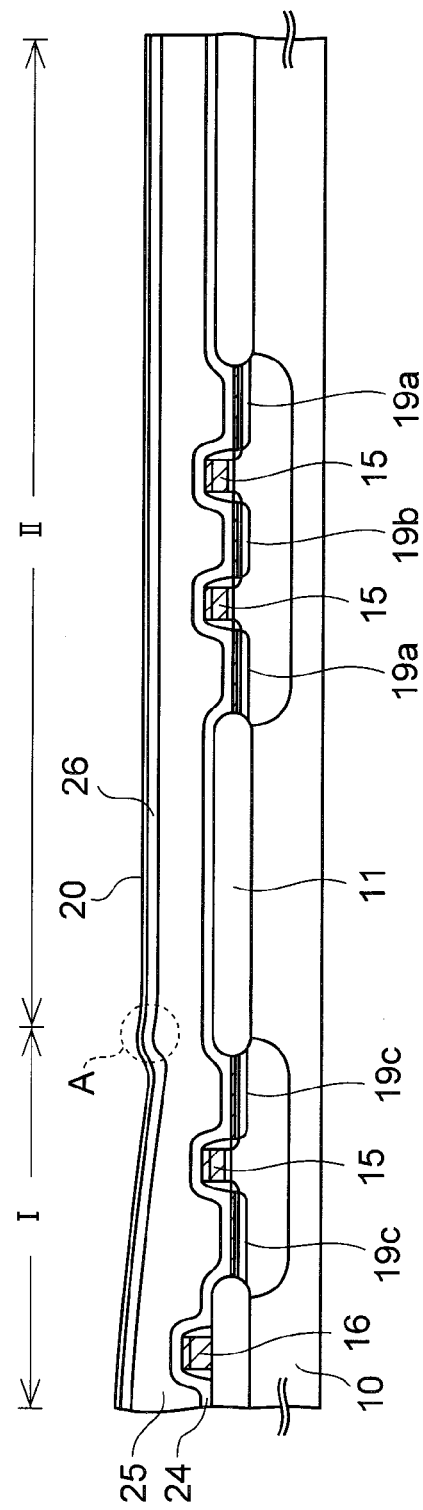

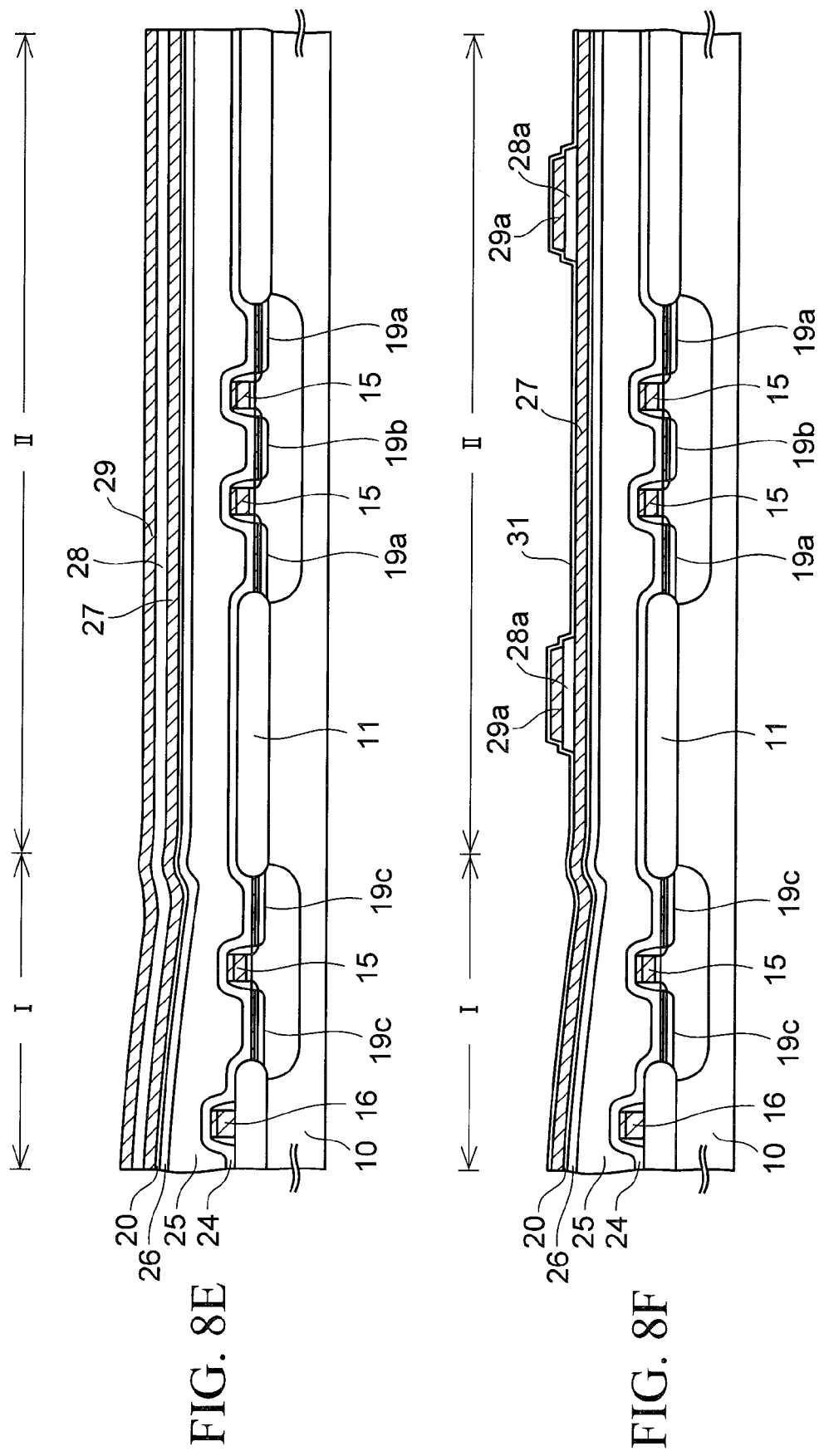

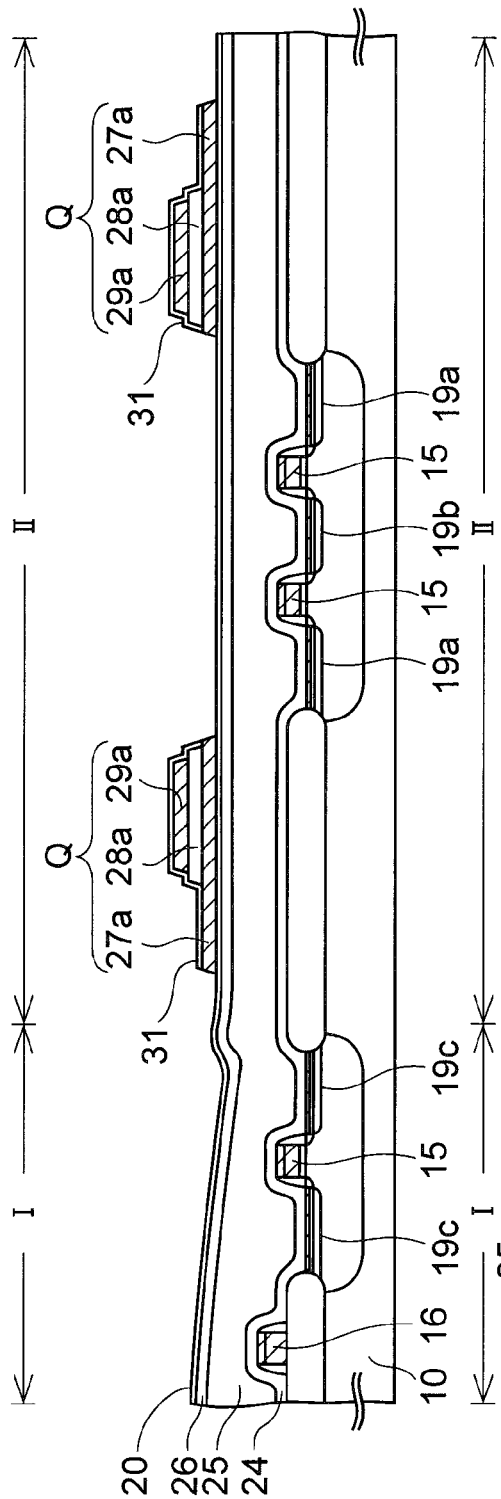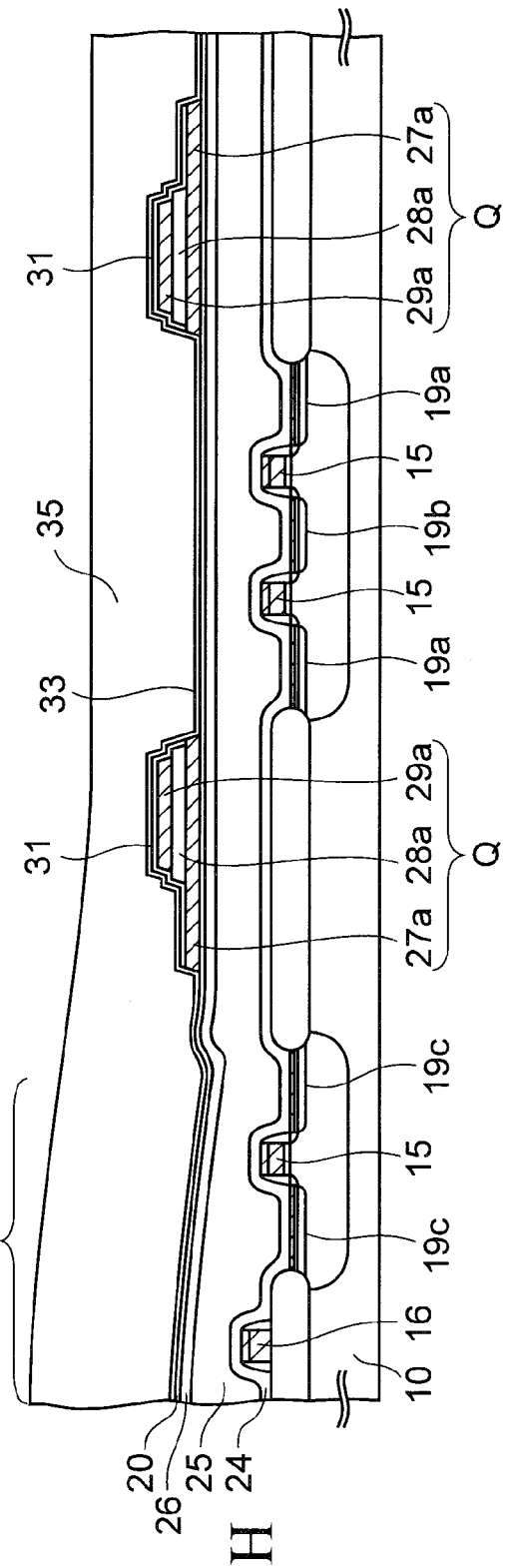

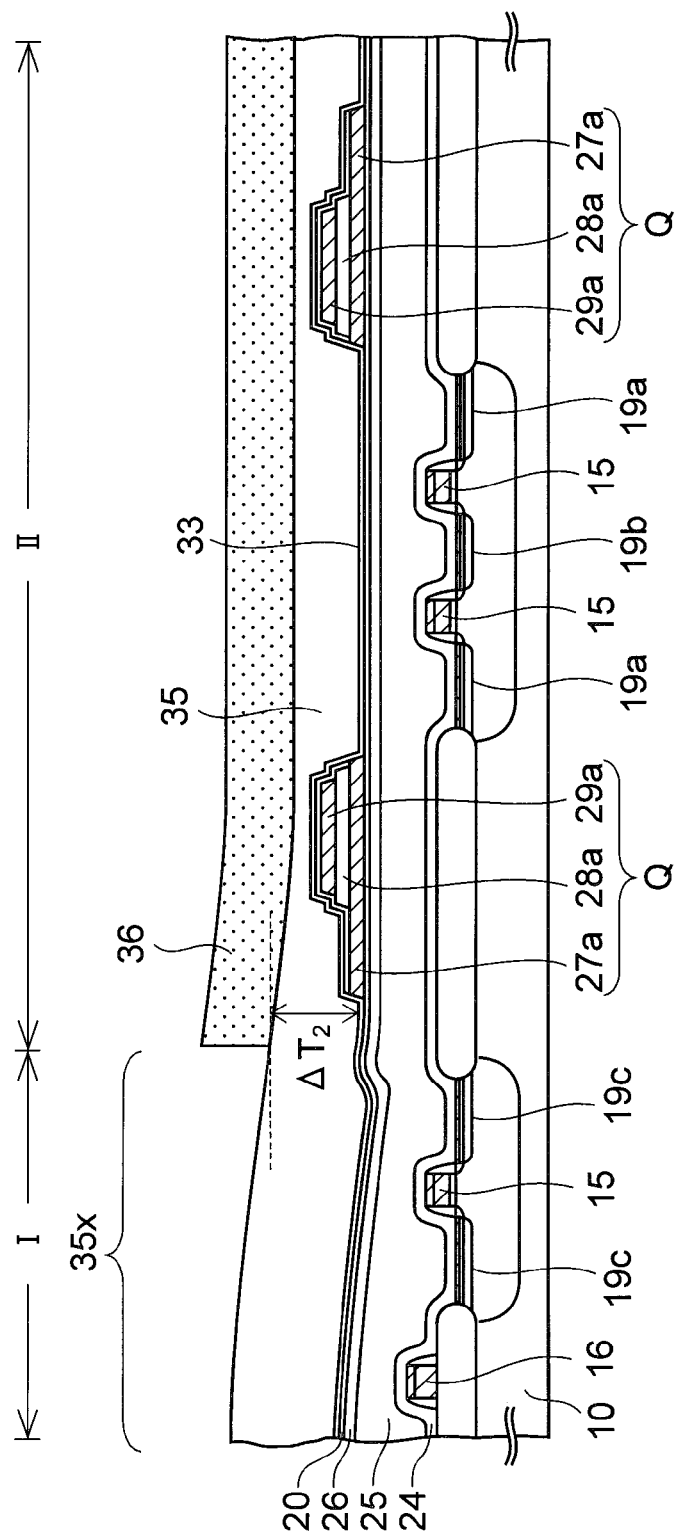

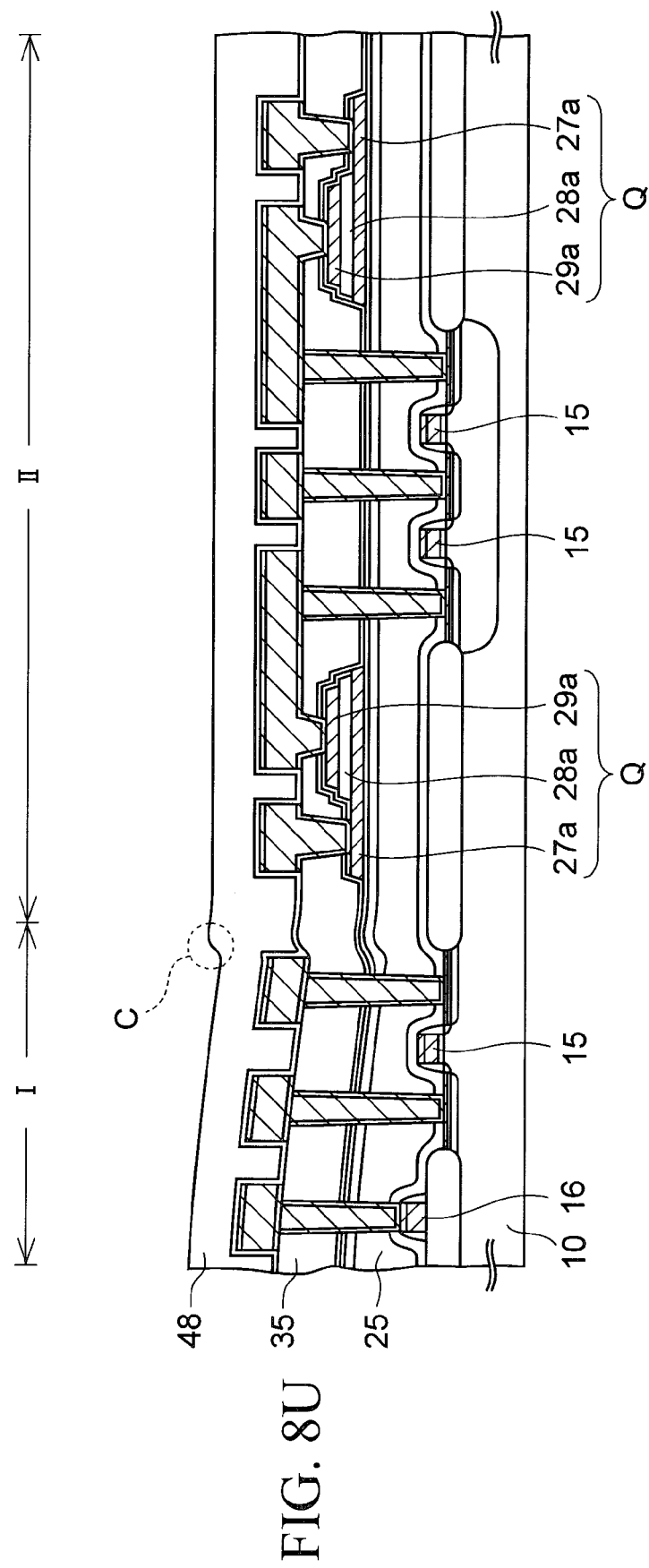

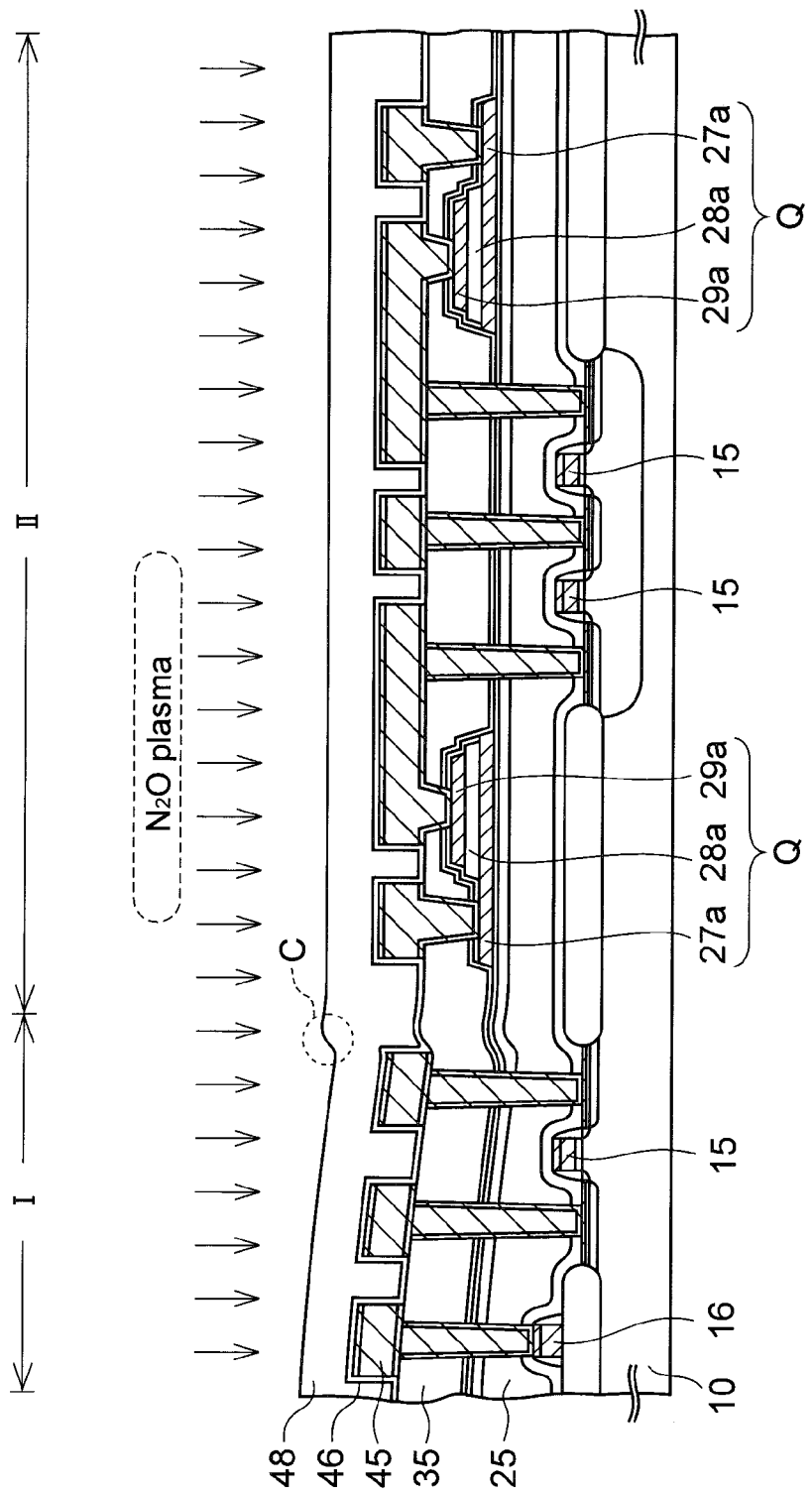

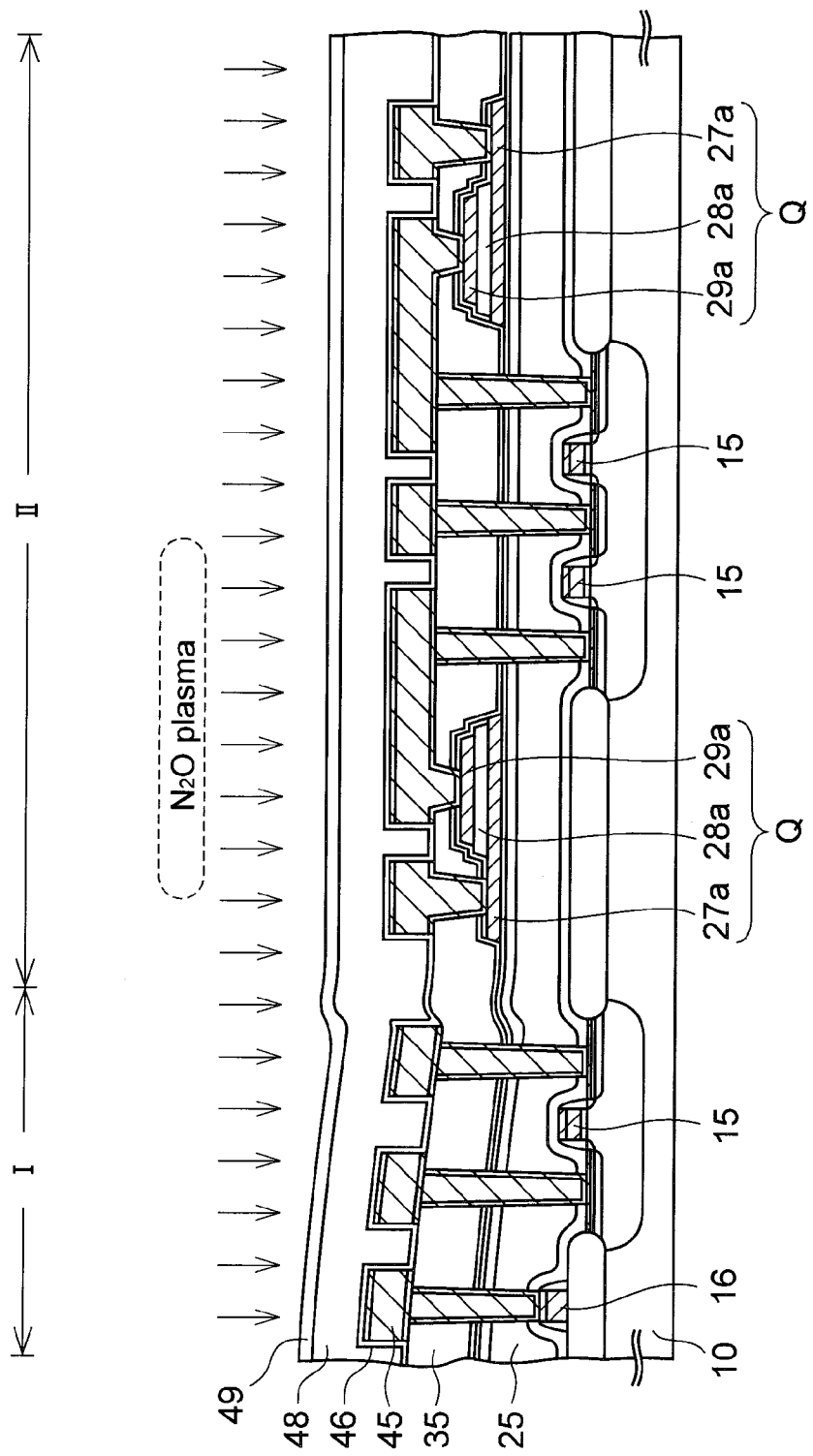

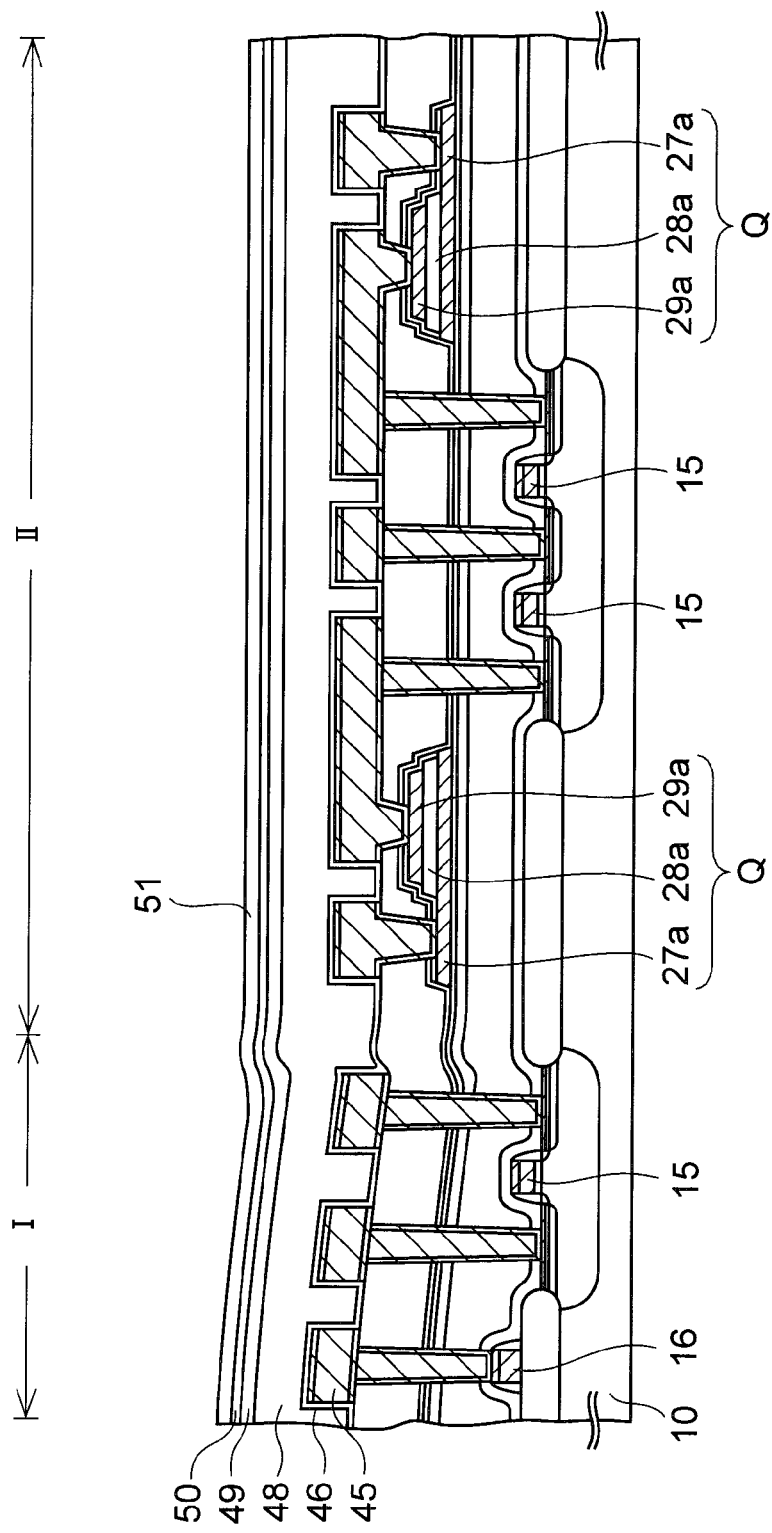

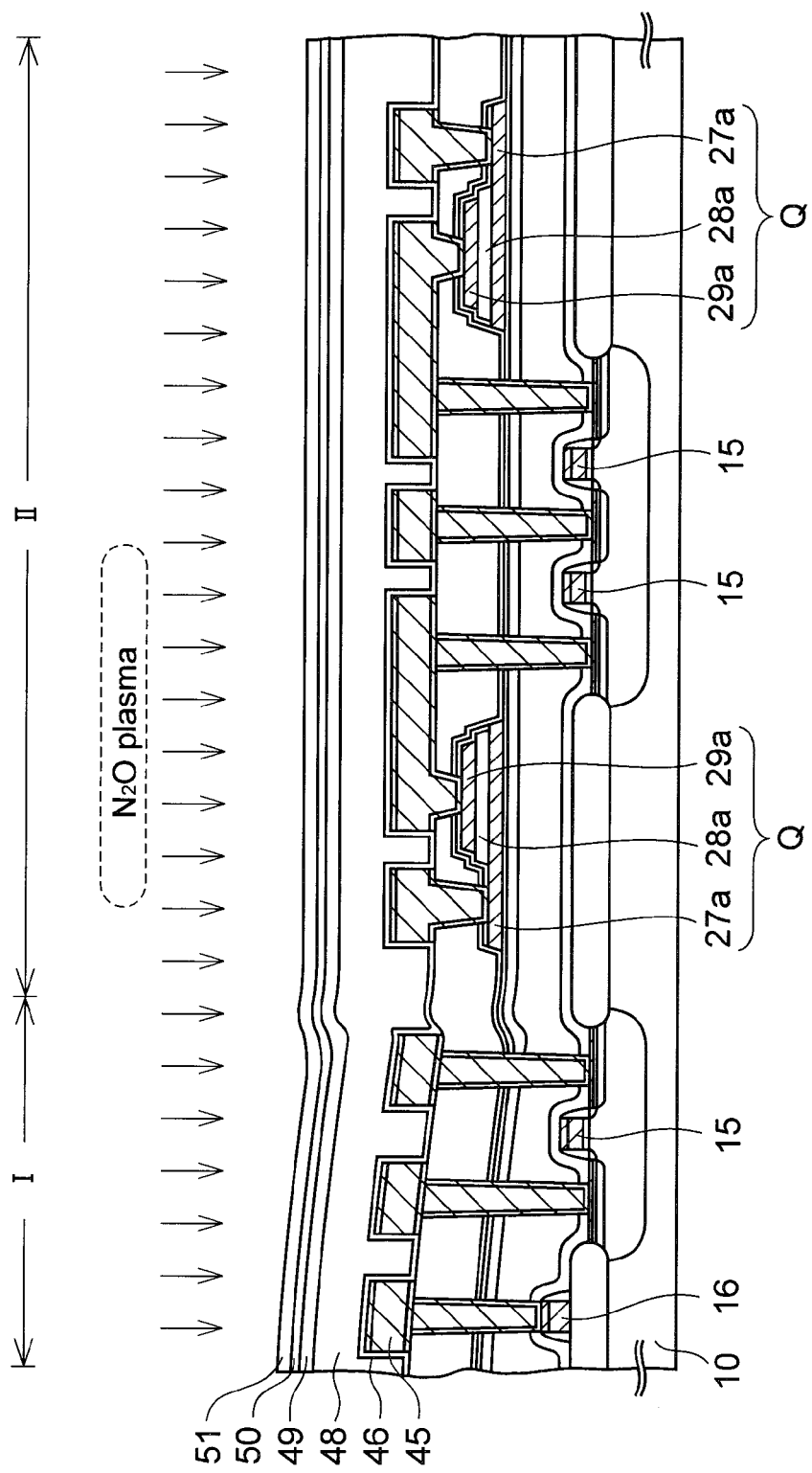

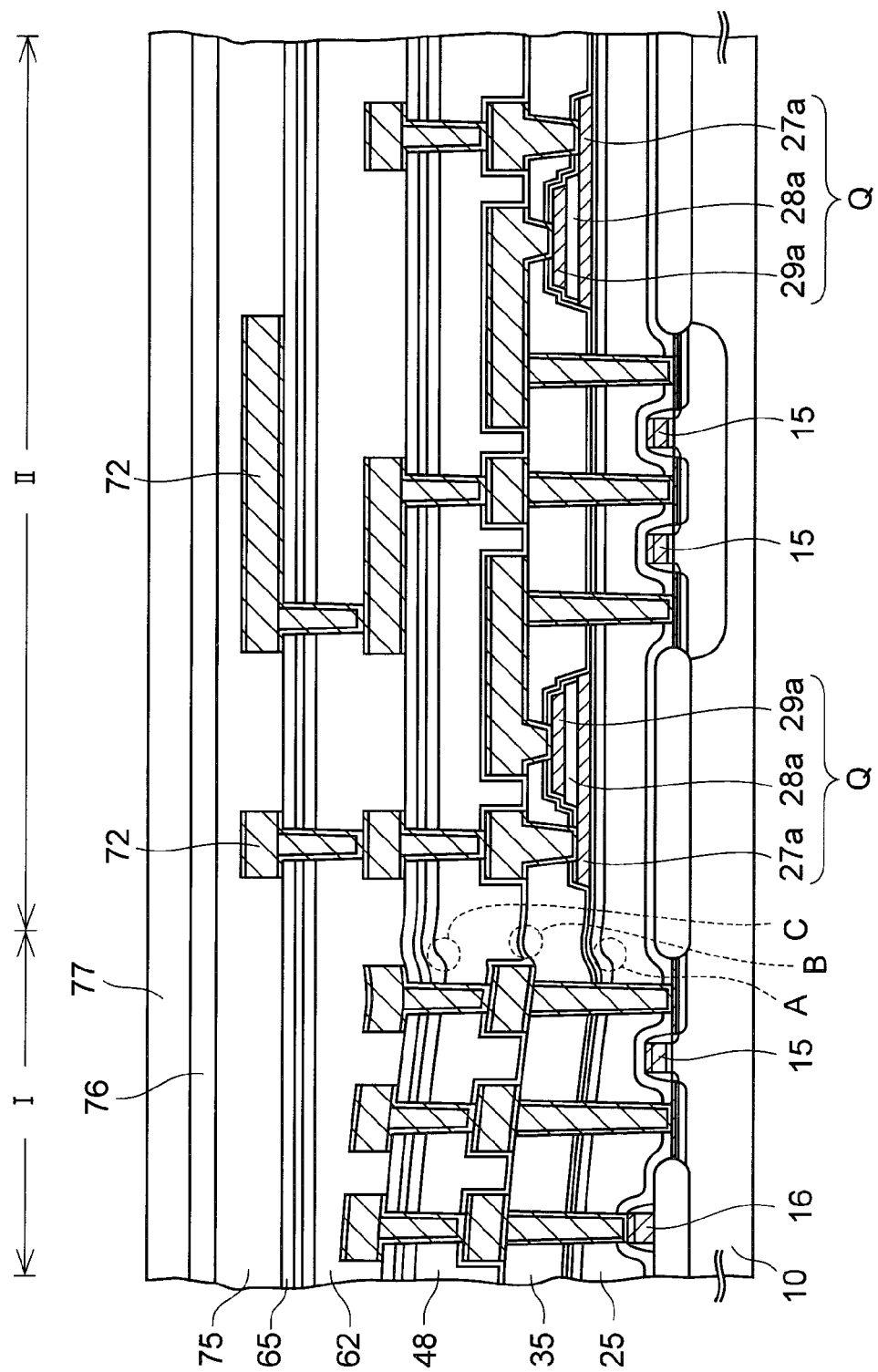

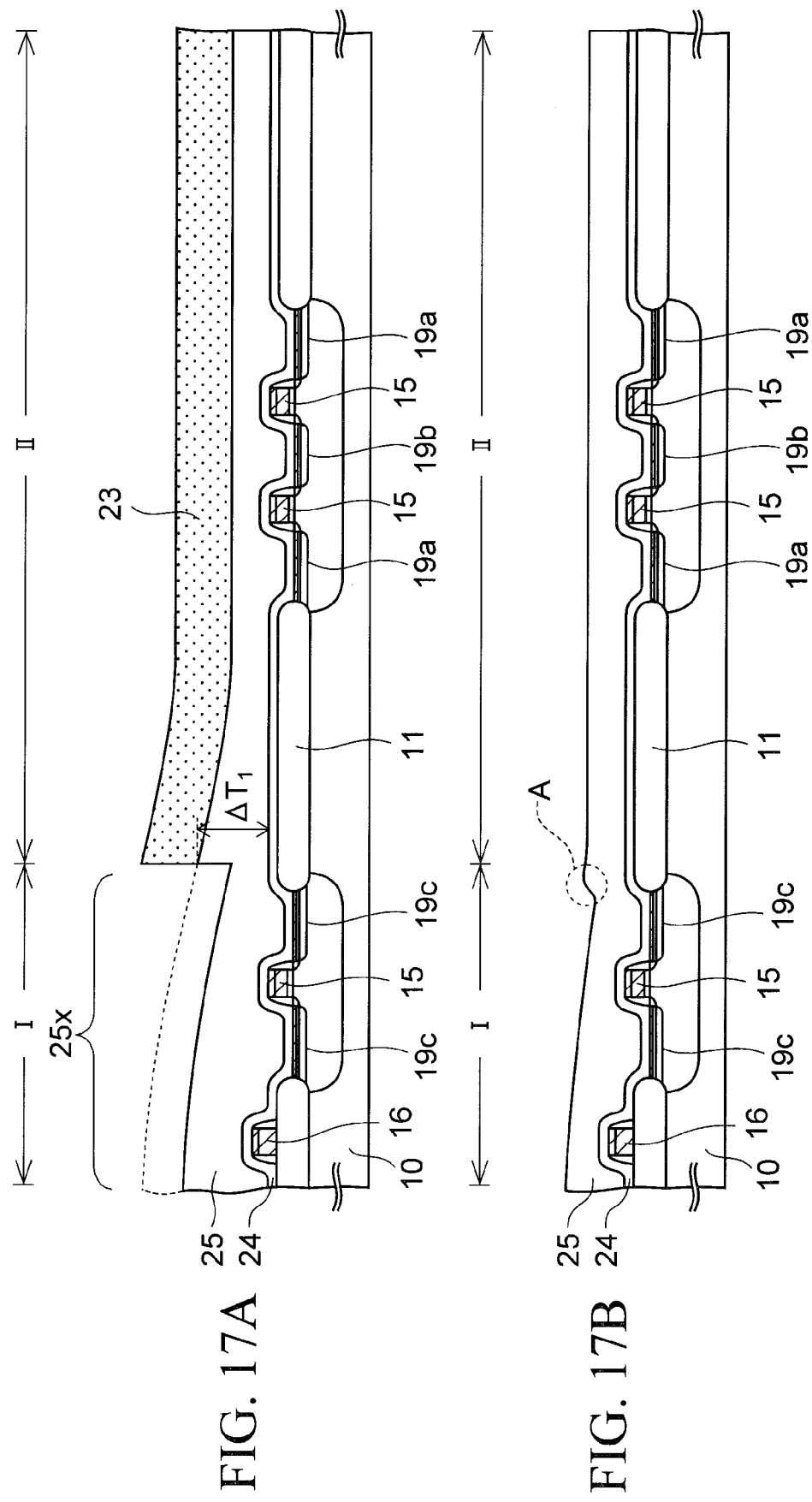

SEMICONDUCTOR DEVICE MANUFACTURING METHOD, SEMICONDUCTOR DEVICE, AND SEMICONDUCTOR WAFER STRUCTURE

CROSS-REFERENCE TO RELATED APPLICATIONS

This application is based on and claims priority of Japanese Patent Application No. 2007-040323 filed on Feb. 21, 2007, the entire contents of which are incorporated herein by reference.

TECHNICAL FIELD

It is related to a semiconductor device manufacturing method, a semiconductor device, and a semiconductor wafer structure.

BACKGROUND

In the semiconductor device such as LSI or the like, a large number of contact holes are formed in the insulating film to get the electrical connection between layers. The conductive plugs are buried in the contact holes, and then the source/drain regions of the MOS transistors formed in the surface layer of the semiconductor substrate are connected to overlying metal wirings via the conductive plugs.

Meanwhile, when the contact hole is not opened, the conductive plug does not get to the source/drain region, and thus the source/drain region and the metal wiring are not connected electrically mutually. Such defect is called the contact failure, and acts as a cause of lowering yield of the semiconductor device.

The related arts of the present embodiments are disclosed in Japanese Laid-open Patent Publication No. 2002-43237 and Japanese Patent No. 3556437.

SUMMARY

It is an aspect of the embodiments discussed herein to provide a semiconductor device manufacturing method including, forming an insulating film over a semiconductor substrate, thinning selectively a thick portion, whose film thickness is thicker than a reference value, of the insulating film, forming a hole in the thinned portion of the insulating film, and forming a conductive plug in the hole.

BRIEF DESCRIPTION OF THE DRAWINGS

FIGS. 17A and 17B are sectional views of a semiconductor device according to a third embodiment in course of manufacture;

DETAILED DESCRIPTION OF THE EMBODIMENTS

FIGS. 1A to 1E are sectional views of a general semiconductor device in course of manufacture, wherein a peripheral area of the semiconductor substrate is enlarged. This semiconductor device is manufactured as follows.

Figure 1A:
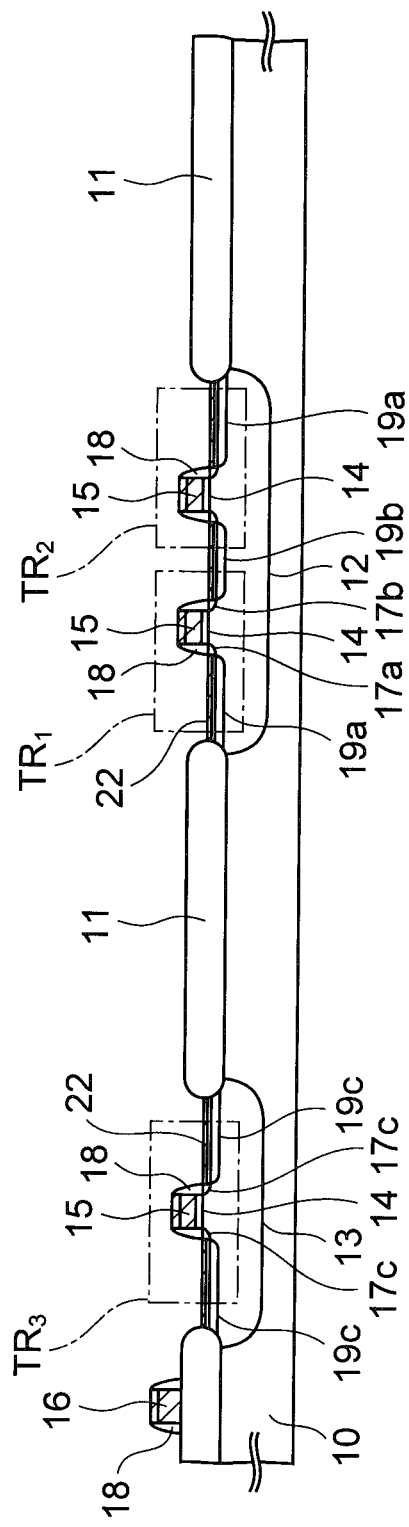
FIGS. 1A to 1E are sectional views of a general semiconductor device in course of manufacture.

At first, steps required until a sectional structure shown in FIG. 1A is obtained will be explained hereunder.

First, an element isolation insulating film 11 is formed by thermally oxidizing a surface of an n-type or p-type silicon (semiconductor) substrate 10, and active regions of transistors are defined by this element isolation insulating film 11. A film thickness of the element isolation insulating film 11 is about 200 nm when measured from an upper surface of the silicon substrate 10, for example. Such element isolation structure is called LOCOS (Local Oxidation of Silicon), but STI (Shallow Trench Isolation) may be employed instead of this structure.

Then, first and second p-wells 12, 13 are formed by introducing a p-type impurity, e.g., boron into the active regions of the silicon substrate 10, and then surfaces of the active regions are thermally oxidized. Thus, a thermal oxide film of about 6 to 7 nm thickness is formed as a gate insulating film 14.

Then, an amorphous silicon film of about 50 nm thickness and a tungsten silicide film of about 150 nm thickness are formed in this order on an overall upper surface of the silicon substrate 10. In this case, a polysilicon film may be formed instead of this amorphous silicon film. Then, these films are patterned by the photolithography. Thus, gate electrodes 15 are formed on the silicon substrate 10 and also wirings 16 are formed on the element isolation insulating film 11.

A gate length of the gate electrode 15 is about 360 μm, for example.

Then, phosphorus is introduced into the silicon substrate 10 beside the gate electrodes 15 as an n-type impurity by the ion implantation using the gate electrodes 15 as a mask. Thus, first to third source/drain extensions 17a to 17c are formed.

Thereafter, an insulating film is formed on the overall upper surface of the silicon substrate 10, and insulating sidewalls 18 are left beside the gate electrodes 15 and the wirings 16 as an insulating spacer by etching back the insulating film. As the insulating film, a silicon oxide film of 45 nm thickness is formed by the CVD method, for example.

Subsequently, the n-type impurity such as arsenic, or the like is ion-implanted again into the silicon substrate 10, while using the insulating spacers 18 and the gate electrodes 15 as a mask. Thus, first to third source/drain regions (impurity diffusion regions) 19a to 19c are formed on the silicon substrate 10 on the sides of the gate electrodes 15.

Moreover, a refractory metal film such as a cobalt film, or the like is formed on the overall upper surface of the silicon substrate 10 by the sputter method. Then, the refractory metal film is caused to react with silicon by a heating. Thus, a refractory metal silicide layer 22 such as a cobalt silicide layer, or the like is formed on the silicon substrate 10 in the first to third source/drain region 19a to 19c to lower a resistance of respective source/drain region 19a to 19c. In this case, such refractory metal silicide layer is also formed on surfaces of the gate electrodes 15 and the wirings 16.

Then, the unreacted refractory metal layer on the element isolation insulating film 11, and the like is removed by the wet etching.

With the steps so far, first to third MOS transistors $TR_1$ to $TR_3$ constructed by the gate insulating film 14, the gate electrode 15, the first to third source/drain region 19a to 19c, and the like are formed on the active regions of the silicon substrate 10.

Figure 1B:
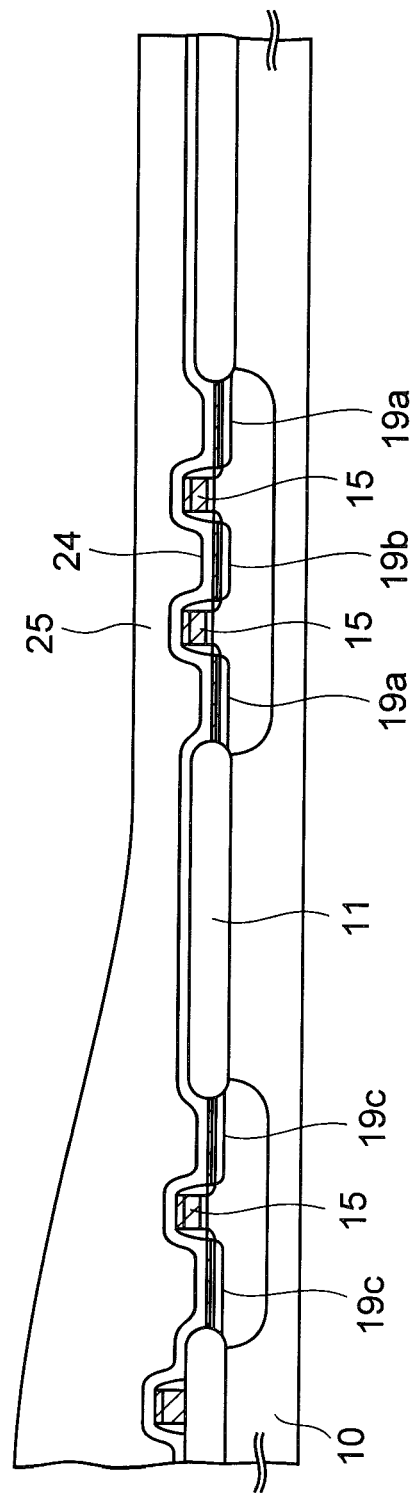

Next, as shown in FIG. 1B, a silicon oxide nitride (SiON) film of about 200 nm thickness is formed on the overall upper surface of the silicon substrate 10 by the plasma CVD method. This film is used as an etching stopper film 24.

Furthermore, while setting 600 nm as a target film thickness, a silicon oxide ($SiO_2$) film is formed by the plasma CVD method using a mixed gas of a TEOS (Tetraethoxysilane) gas and an oxygen gas. Thus, a first insulating film 25 made of the silicon oxide film is formed on the etching stopper film 24.

The film forming conditions for this first insulating film 25 are optimized to meet the type of the final product.

For example, when the product is FeRAM (Ferroelectric Random Access Memory), the first insulating film 25 made of silicon oxide is formed under the film forming conditions that can reduce sufficiently an amount of moisture in the silicon oxide film, in order to prevent such a situation that a capacitor dielectric film constituting an ferroelectric capacitor of the FeRAM is deteriorated by the moisture. Such film forming conditions can be established by increasing a flow rate of oxygen larger than an amount that is required to oxidize the TEOS gas.

Figure 2:
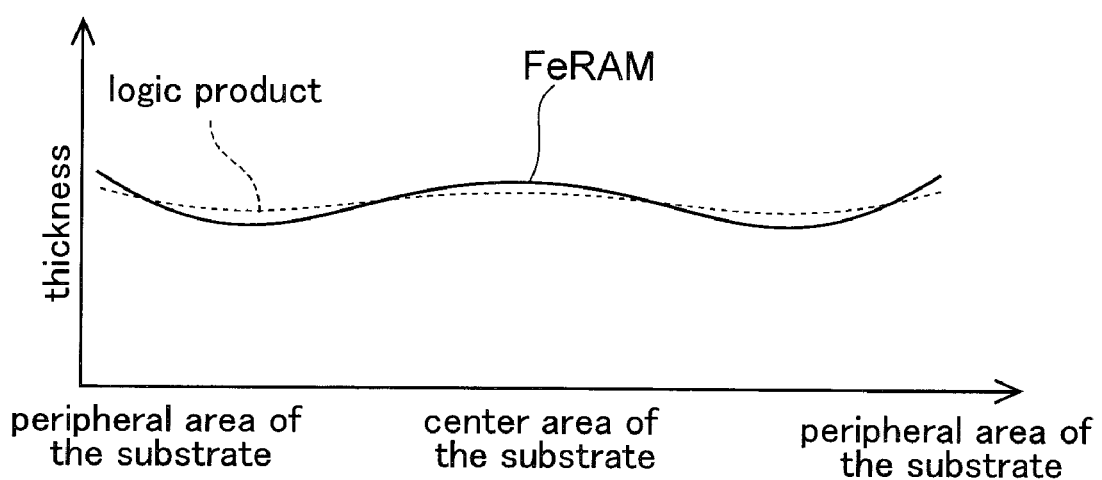
FIG. 2 is a graph showing an in-plane distribution of a thickness of a first insulating film just after the film is formed.

FIG. 2 is a graph showing an in-plane distribution of a thickness of the first insulating film just after forming it under such conditions. In FIG. 2, an abscissa denotes a position in the semiconductor substrate, and an ordinate denotes a thickness of the first insulating film 25 in that position.

As shown in FIG. 2, a film thickness of the first insulating film 25 is largely varied in contrast to a normal logic product indicated with a dotted line. Particularly, the film thickness in the peripheral area of the substrate is increased under the film forming conditions that are optimized to meet the FeRAM.

For example, an in-plane uniformity of the film thickness of the first insulating film 25 has a large value such as 5.0% under the FeRAM conditions that a flow rate of an oxygen gas is set to 2980 sccm, a flow rate of a TEOS gas is set to 450 sccm, and a flow rate of a helium gas (a carrier gas of TEOS) is set to 480 sccm. Here the "in-plane uniformity" is defined by $100 \times (T_{max} - T_{min})/(T_{max} + T_{min})$, where $T_{max}$ ($T_{min}$) is a maximum (minimum) film thickness of the first insulating film 25 in the in-plane. Also, in the FeRAM conditions, a film forming pressure is set to 9 Torr, a substrate temperature is set to 390° C., and a high-frequency power (frequency: 13.56 MHz) for plasmanization is set to 400 W.

When the in-plane uniformity of the film thickness is bad and there is the thick portion in the first insulating film 25 In this manner, it is feared that the contact hole being formed later in this thick portion in the first insulating film 25 is not opened.

Figure 1C:
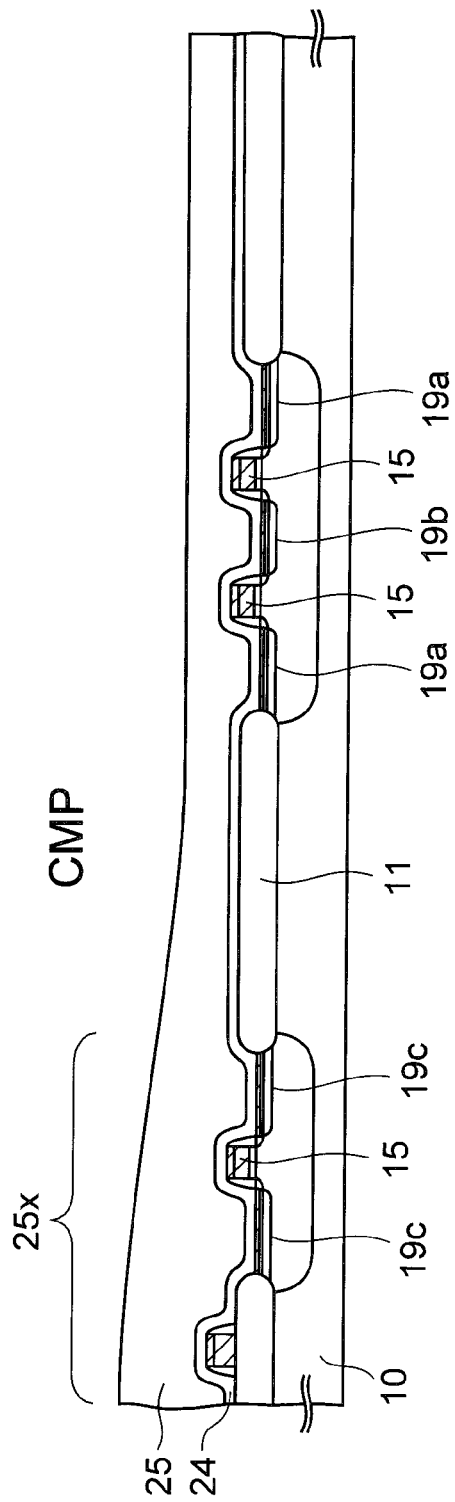

Therefore, as shown FIG. 1C, in the next step, an upper surface of the first insulating film 25 is polished by the CMP (Chemical Mechanical Polishing) to planarize the upper surface.

However, the in-plane uniformity of the film thickness of the first insulating film 25 is essentially bad as described above. Therefore, the upper surface of the first insulating film 25 is not finished completely flat even when the CMP is applied in this way, and the in-plane uniformity of the film thickness has a large value like 3.1 to 3.4.

Figure 3:
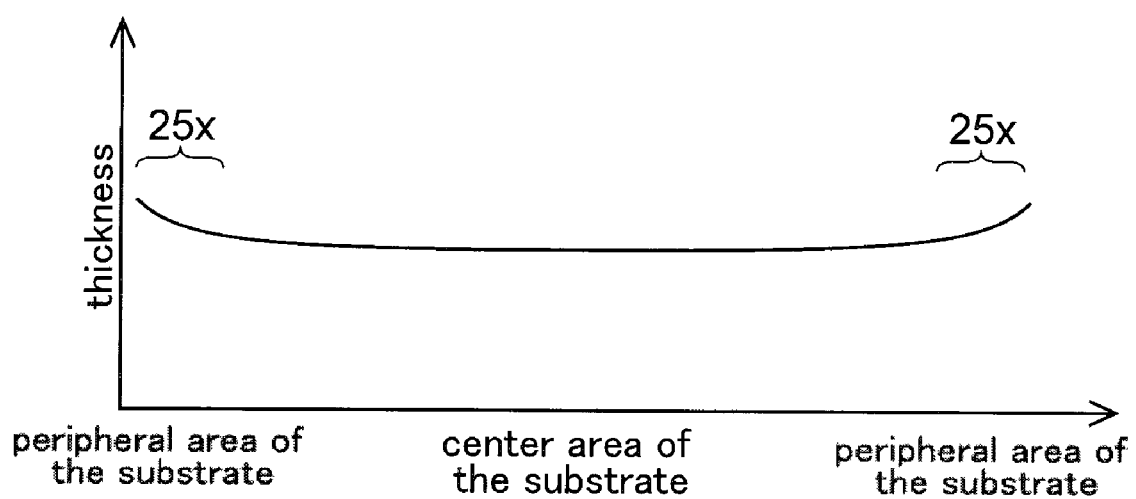
FIG. 3 is a graph showing an in-plane distribution of a thickness of a first insulating film after CMP is applied.

FIG. 3 is a graph showing the in-plane distribution of a thickness of the first insulating film 25 after the CMP is applied, wherein an abscissa and an ordinate denote the same meaning explained in FIG. 2 respectively.

When the CMP is applied as shown in FIG. 3, flatness can be improved around the center of the substrate, but the film thickness is not uniformized by the CMP in the peripheral area of the substrate where the film thickness is originally thick. Consequently, a thick portion 25x whose film thickness is thicker than other portions still remains in the first insulating film 25.

Figure 1D:
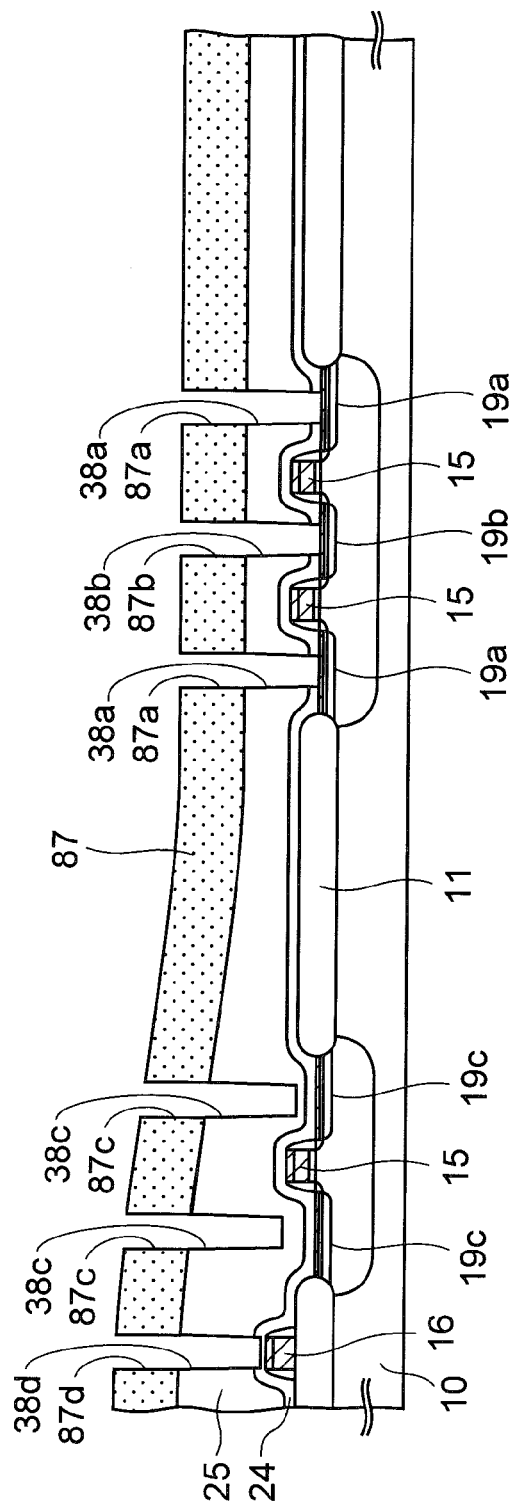

After the CMP is applied in this manner, as shown in FIG. 1D, a first resist pattern 87 is formed on the first insulating film 25.

Then, the first insulating film 25 and the etching stopper film 24 are etched through first to fourth windows 87a to 87d in the first resist pattern 87. Thus, first to fourth contact holes 38a to 38d are formed under these windows.

Here, as described above, the thick portion 25x is formed in the peripheral area of the silicon substrate 10. In thick portion 25x, an etching depth to form the third and forth contact holes 38c, 38d becomes longer than that in other areas. Therefore, when an etching time is set to meet the first and second contact holes 38a, 38b, the third and fourth contact holes 38c, 38d are not opened.

Figure 1E:
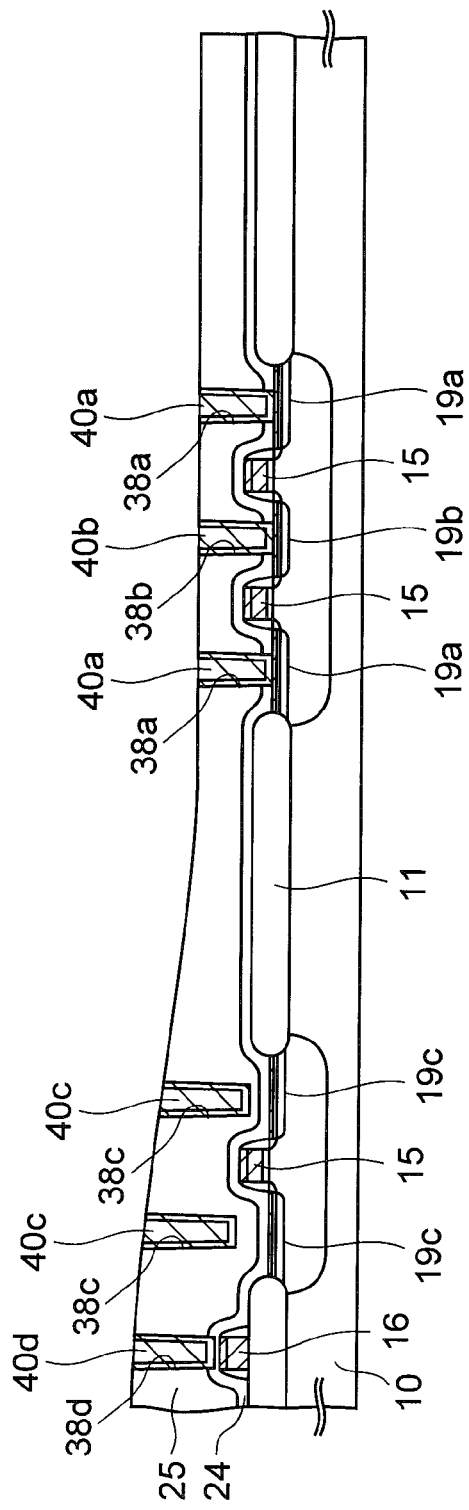

Then, as shown in FIG. 1E, after the first resist pattern 87 is removed, first to fourth conductive plugs 40a to 40d are formed in the first to fourth contact holes 38a to 38d.

As described above, since the third and fourth contact holes 38c, 38d are not opened, the third conductive plug 40c is not connected electrically to the third source/drain region 19c. Similarly, the fourth conductive plug 40d is not connected electrically to the wiring 16.

In this manner, the contact failure is caused in the third and fourth conductive plugs 40c, 40d when the semiconductor device is manufactured according to the above method.

Figures 4A, 4B, 4C:
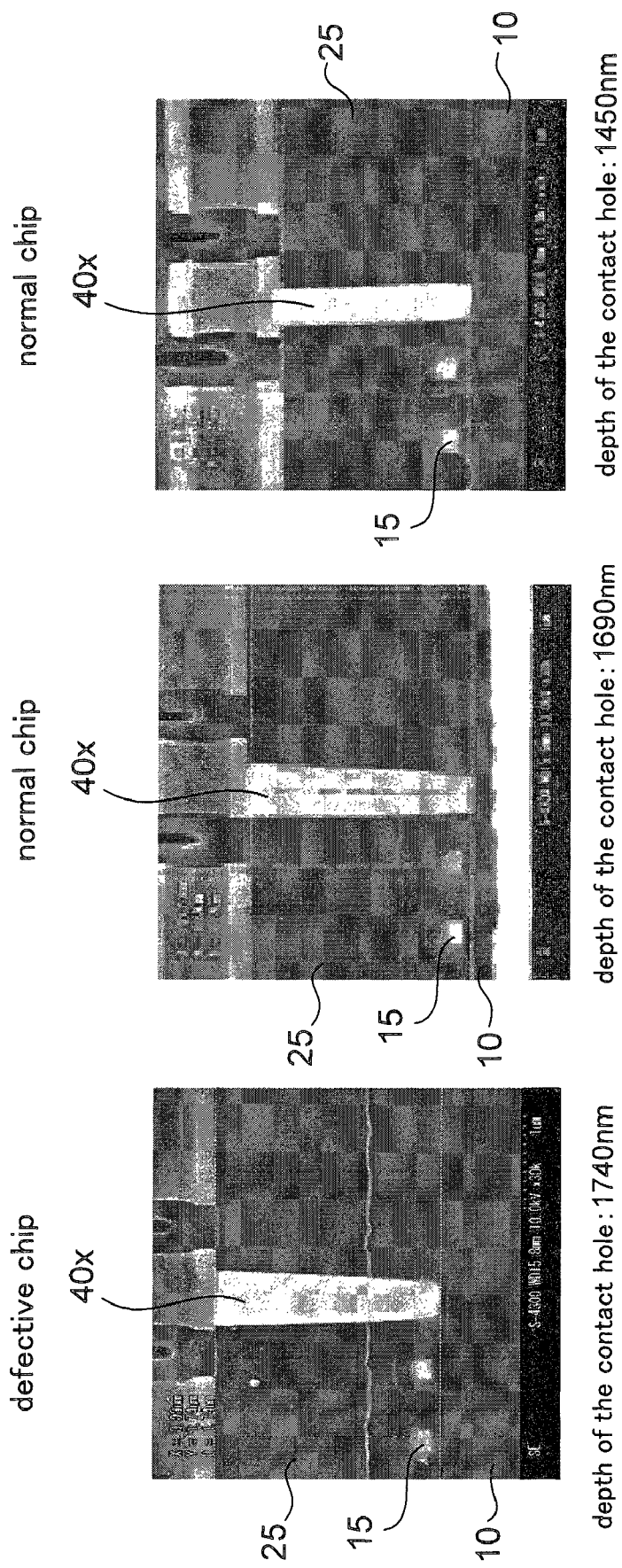
FIGS. 4A to 4C are SEM tomograms of a conductive plug.

FIGS. 4A to 4C are SEM (Scanning Electron Microscope) tomograms of a conductive plug 40x that is formed by the same process as the above first to fourth conductive plugs 40a to 40d. In particular, FIG. 4A is an SEM tomogram in a chip that is decided as a defective chip by the electrical inspection. Also, FIG. 4B is an SEM tomogram in a normal (good) chip adjacent to this defective chip, and FIG. 4C is an SEM tomogram in a normal chip near the center of the silicon substrate 10.

In the normal chip shown in FIGS. 4B and 4C, the conductive plug 40x reaches the silicon substrate 10. Conversely, in the defective chip shown in FIG. 4A, the conductive plug 40x does not reach the silicon substrate 10 and the contact failure is caused.

In this example, a depth of the contact hole is 1450 nm in the normal chip (FIG. 4C) near the center of the silicon substrate 10. In contrast, the contact failure is caused in the defective chip (FIG. 4A) although the contact hole is formed up to a depth of 1740 nm that is deeper by 290 nm than in the normal chip.

Figure 5:
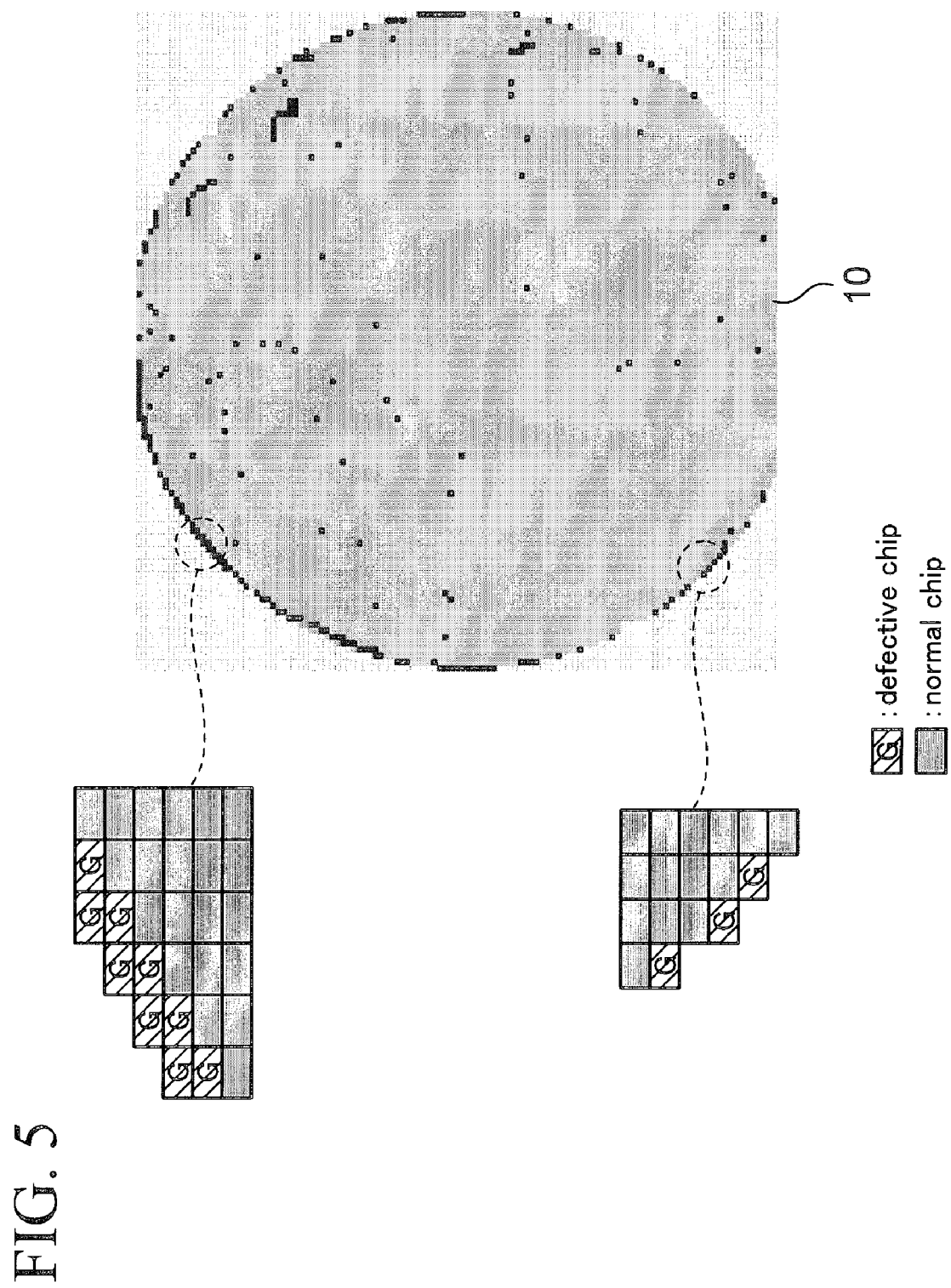
FIG. 5 is a wafer map obtained by rendering electrical inspection results visible.

FIG. 5 is a wafer map obtained by rendering foregoing electrical inspection results visible. In this example, small semiconductor chips for security use in IC tag, small memory, or the like are integrated and formed on the silicon substrate 10.

As shown in FIG. 5, the defective chips are concentrated around the outer periphery of the silicon substrate 10. It is apparent from this result that the contact failure caused by the thick portion 25x has a large influence on yield of the semiconductor device.

Figure 6:
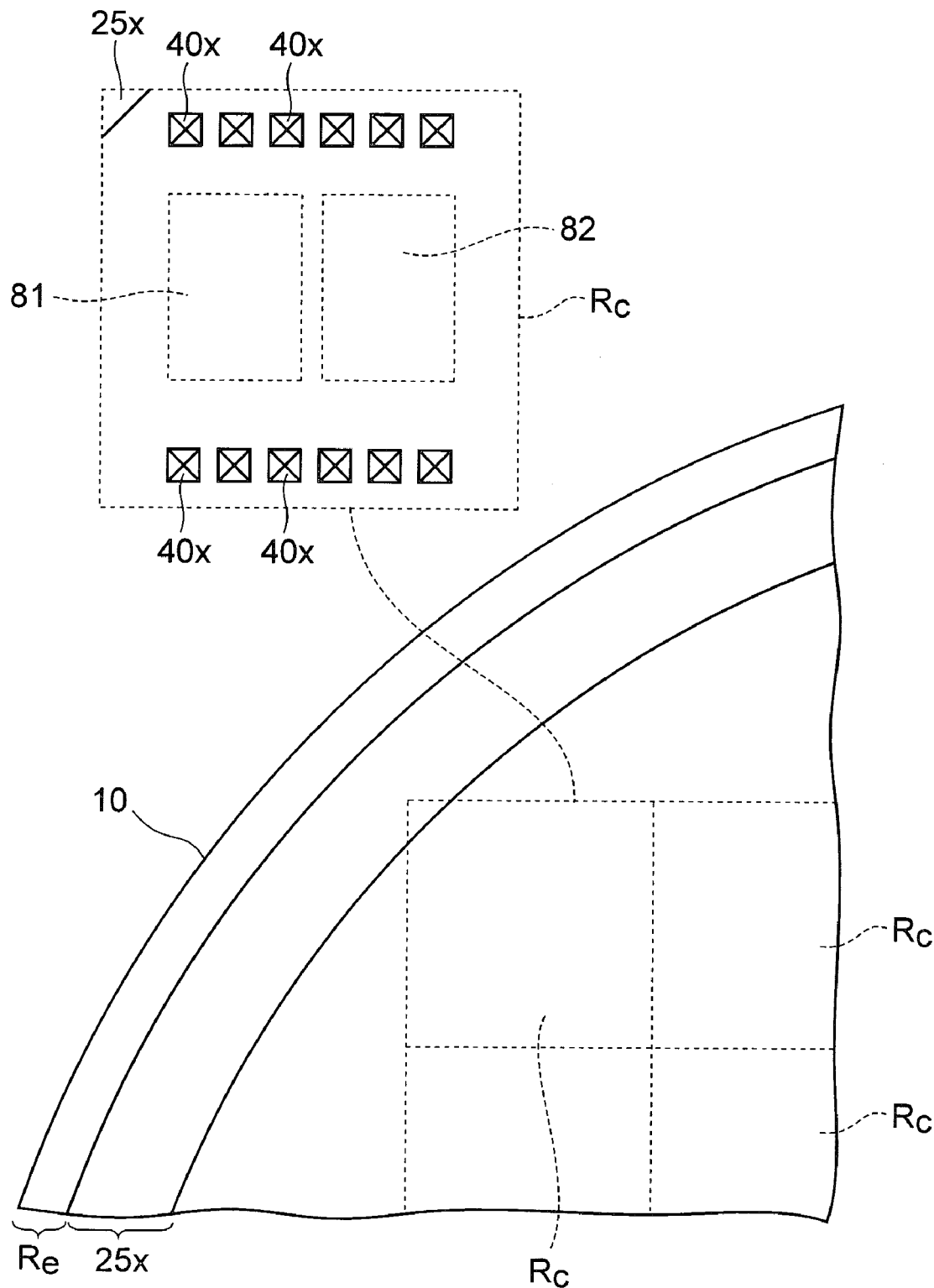
FIG. 6 is an enlarged plan view of a silicon substrate on which relatively larger semiconductor chips a length of one side of which is several centimeters are integrated and formed.

FIG. 6 is an enlarged plan view of the silicon substrate 10, on which relatively larger semiconductor chips whose length of one side is several centimeters are integrated.

In FIG. 6, an area $R_e$ located on the outer side than the thick portion 25x of the first insulating film 25 is called an edge-cut area, where film thicknesses of the first insulating film 25 and other films are largely varied depending on the limitation of capability of the film forming equipment. When this edge-cut area $R_e$ overlaps with a chip area $R_c$ that corresponds to the semiconductor chip, the semiconductor chip becomes defective almost surely. Therefore, the semiconductor chips are normally cut out from the inner area than the edge-cut area $R_e$.

However, the thick portion 25x exists in the inner side of the edge-cut area $R_e$. For this reason, it is feared that the contact failure is caused in the chip area $R_c$ when the thick portion 25x overlaps with the chip area $R_e$.

In this case, when the semiconductor chip is relatively large like this example, the semiconductor chip happened not to become defective in some case, when the conductive plug 40x, chip major portions such as a RAM portion 81, a logic portion 82, and the like do not overlap with the thick portion 25x.

Figure 7:
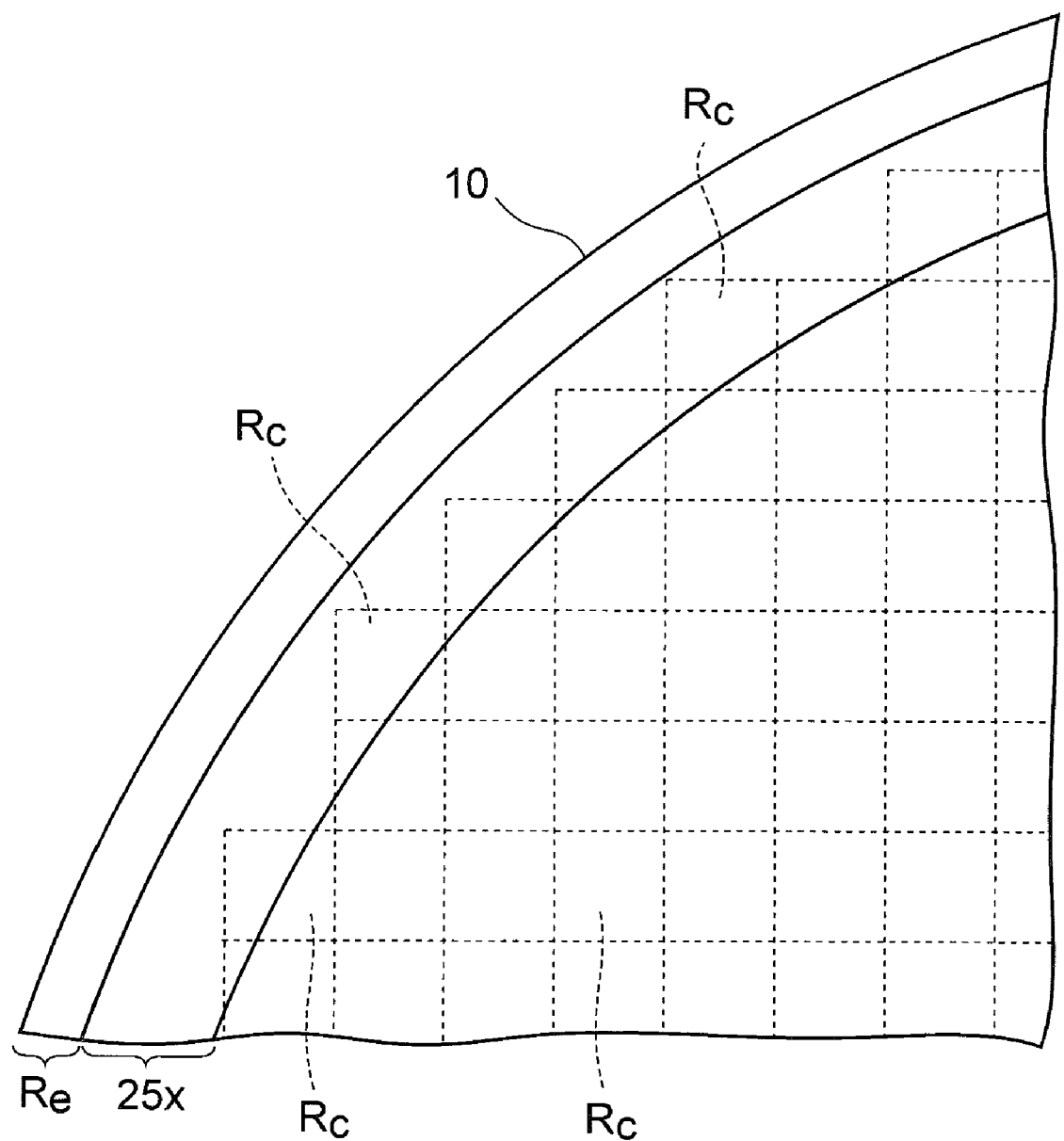
FIG. 7 is an enlarged plan view of a silicon substrate when microchips a length of one side of which is 1 mm or less are integrated and formed.

Conversely, FIG. 7 is an enlarged plan view of the silicon substrate 10 when microchips whose length of one side is 1 mm or less are integrated. Such microchip is often found in the security products such as IC tag, small memory, and the like.

In such microchip, most portions of one chip area $R_c$ overlap with the thick portion 25x in the peripheral area of the silicon substrate 10. Therefore, the semiconductor chip corresponding to the chip area $R_c$ becomes the defective chip almost surely on account of the contact failure.

In this manner, the contact failure caused by the thick portion 25x constitutes a major cause of lowering yield of the semiconductor device. In particular, the contact failure is fatal to the manufacture of the microchip shown in FIG. 7.

In view of these respects, the inventors of the present application come to realize embodiments explained in the following.

FIGS. 8A to 8Z and FIGS. 9A to 9R are sectional views of a semiconductor wafer structure according to a first embodiment in course of manufacture.

This semiconductor wafer structure is used for dicing out a multiple FeRAM having a ferroelectric capacitor as a semiconductor device, and is manufactured as follows.

First, as shown in FIG. 8A, the first insulating film 25 is formed over the silicon substrate 10 having a peripheral area I and a center area II by performing the above steps in FIGS. 1A to 1C.

As already described, the silicon oxide constituting the first insulating film 25 is formed by the plasma CVD method using a mixed gas a TEOS gas and oxygen. Then, the FeRAM conditions under which the moisture acting to deteriorate the ferroelectric capacitor is hardly contained are employed as the film forming conditions for the first insulating film 25.

Such conditions can be obtained by increasing a flow rate of oxygen higher than an amount necessary for oxidizing the TEOS gas. For example, in the present embodiment, a flow rate of oxygen is set to 2980 sccm, a flow rate of a TEOS gas is set to 450 sccm, and a flow rate of a helium gas (a carrier gas of TEOS) is set to 480 sccm. Also, a film forming pressure is set to 9 Torr, a substrate temperature is set to 390° C., and a high-frequency power (frequency: 13.56 MHz) for plasmanization is set to 400 W.

Under such conditions for low moisture, a film thickness distribution of the first insulating film 25 is largely varied in the substrate plane as already described, and the thick portion 25x is formed in the first insulating film 25 in the peripheral area I of the silicon substrate 10.

Also, the CMP explained in FIG. 1C is applied to the first insulating film 25. In this case, since the film thickness of the thick portion 25x is essentially thick, the thick portion 25x is not removed by this CMP and still remains.

The contact failure is caused when the thick portion 25x is too thick. To deal with this problem, in the present embodiment, an upper limit of the film thickness of the film 25, at which the contact failure is not caused, is set as a reference film thickness $\Delta T_1$. Then, the first resist pattern 23, from which a portion of the first insulating film 25 that is thicker than the reference film thickness $\Delta T_1$ is exposed, is formed on the first insulating film 25.

Figure 10:
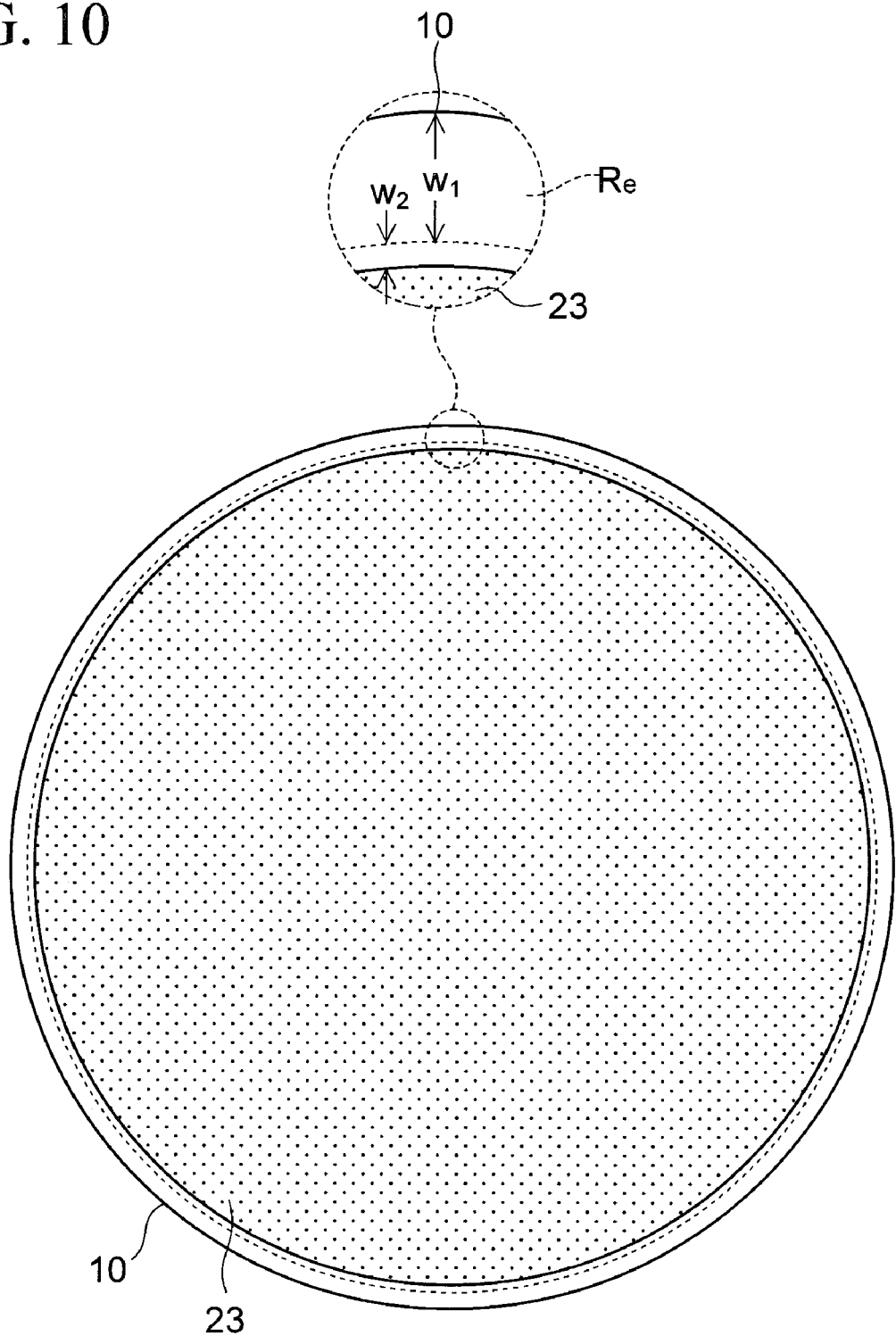
FIG. 10 is an overall plan view of a silicon substrate where a first resist pattern is formed in the first embodiment.

FIG. 10 is an overall plan view of the silicon substrate 10 on which the first resist pattern 23 is formed.

As shown in FIG. 10, a planar shape of the first resist pattern 23 forms a concentric circle with the circular silicon substrate 10, and is a circular shape covering the center area II of the silicon substrate 10. Also, an edge of the first resist pattern 23 is positioned in the area that is recessed inwardly by a width W2 of about 1 mm from the edge-cut area $R_e$ whose width W1 is about 5 mm.

Then, as shown in FIG. 8B, the thick portion 25x not covered with the first resist pattern 23 is etched by a thickness of 20 to 150 nm. Thus, the thick portion 25x is thinned selectively.

As this etching, either of the dry etching, the sputter etching, and the wet etching can be applied.

Out of them, the dry etching is executed by the RIE (Reactive Ion Etching) in the ICP (Inductively Coupled Plasma)-type etching equipment. As the etching gas, a mixed gas containing halogen, for example, a mixed gas of $C_4F_8$, $O_2$, and Ar is used. Also, as the etching conditions, following conditions are employed.

Source power (frequency 13.56 MHz): about 2000 W
Bias power (frequency 13.56 MHz): about 1000
Reaction pressure: about 10 mTorr
Gas flow rate: $C_4F_8$ ... 20 sccm, $O_2$ ... 12 sccm, Ar ... 500 sccm
Etching rate: 500 nm/min Also, the sputter etching is executed by using the ICP-type etching equipment under following conditions.

Source power: about 2000 W
Bias power: about 1000 W

Reaction pressure: about 10 mTorr
Argon flow rate: about 100 sccm
Etching rate: 500 nm/min Also, the wet etching is executed by using a 0.5 wt % hydrofluoric acid solution as an etchant. The first insulating film 25 made of silicon oxide is etched by the hydrofluoric acid solution of this concentration at the etching rate of 100 to 300 nm/min.

Note that even when any of three etching methods is used, an etching time is decided depending on the etching rate of respective conditions. For example, since the etching rate is 500 nm/min in the conditions for the dry etching, the etching time is about 12 second when an etching depth is set to 100 nm.

According to such etching, a stepped portion A shown in FIG. 8B is formed on the first insulating film 25 under the side surface of the first resist pattern 23.

After such etching is ended, the first resist pattern 23 is removed.

Figure 11:
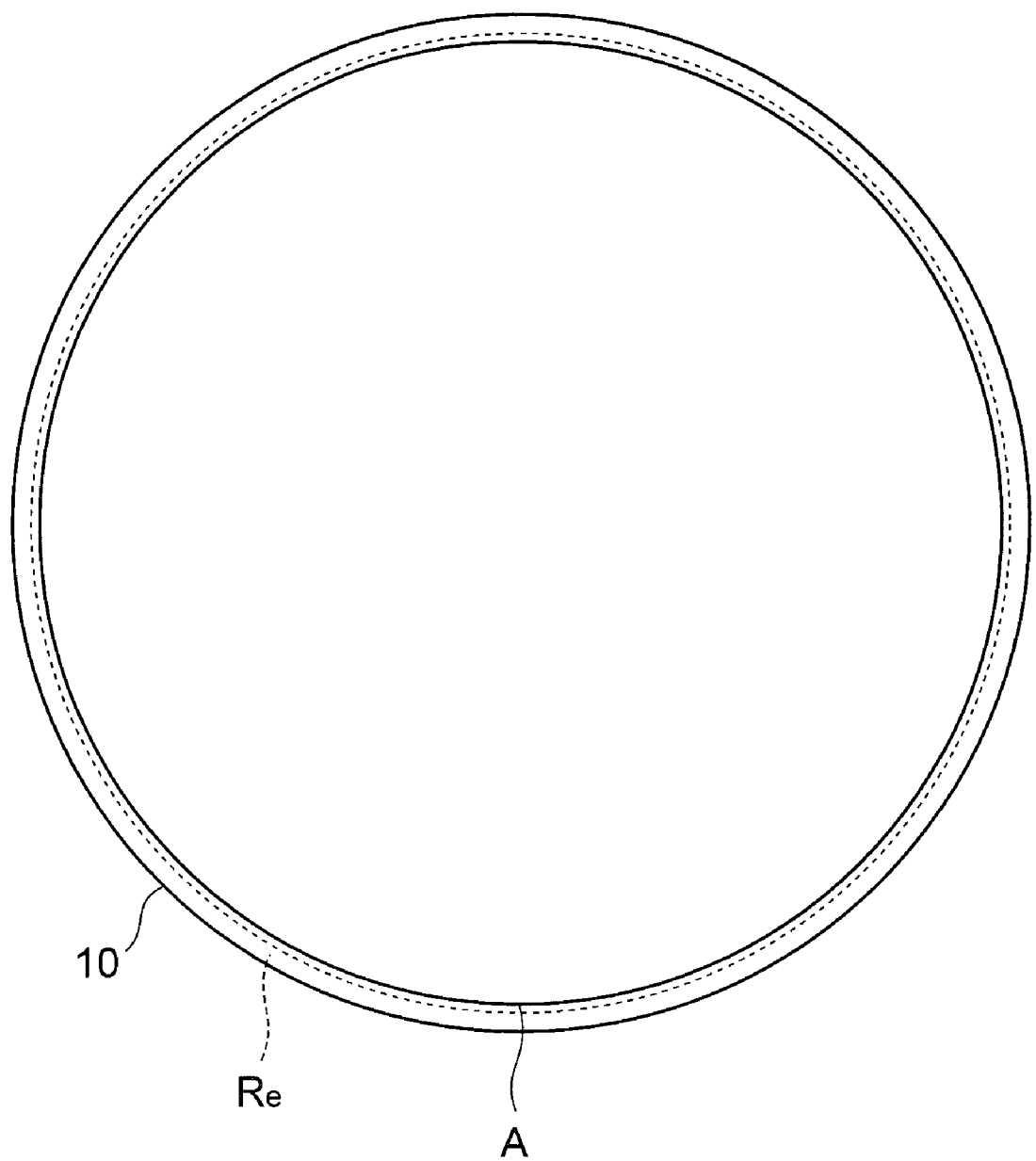
FIG. 11 is an overall plan view of a silicon substrate after the first resist pattern is removed in the first embodiment.

FIG. 11 is an entire plan view of the silicon substrate 10 after the first resist pattern 23 is removed.

As shown in FIG. 11, the stepped portion A reflects the circular first resist pattern 23 (see FIG. 10), and shows a circle that is a concentric circle with the silicon substrate 10.

Then, as shown in FIG. 8C, the stepped portion A is chamfered by etching the upper surface of the first insulating film 25 by a depth of about 100 to 200 nm. This dry etching is executed by the sputter etching using an argon gas or the RIE containing a halogen gas in the etching gas.

Out of them, the sputter etching is executed by using the ICP-type etching equipment under following conditions.

Source power: about 2000 W
Bias power: about 1000 W
Reaction pressure: about 10 mTorr
Argon flow rate: about 100 sccm
Etching rate: 500 nm/min Meanwhile, in the RIE, a mixed gas of $C_4F_8$, $O_2$, and Ar is used as the etching gas for example, and following conditions are employed in the ICP-type etching equipment.

Source power (frequency 13.56 MHz): about 2000 W
Bias power (frequency 13.56 MHz): about 1000
Reaction pressure: about 10 mTorr
Gas flow rate: $C_4F_8$ . . . 20 sccm, $O_2$ . . . 12 sccm, Ar . . . 500 sccm
Etching rate: 500 nm/min Here, the stepped portion A may be chamfered by applying the CMP (Chemical Mechanical Polishing) to the upper surface of the first insulating film 25 instead of the above etching.

Also, the chamfering of the stepped portion A is not the essential step, and may be omitted in some cases.

Moreover, after this chamfering step is completed, the $N_2O$ plasma process may be performed at a substrate temperature of 350° C. and a process time of 5 min, as the dehydrating process for the first insulating film 25. According to such $N_2O$ plasma process, the first insulating film 25 is dehydrated and also the upper surface of the first insulating film 25 is nitrided such that re-adsorption of the moisture is prevented.

An $NH_3$ plasma process may be performed in place of this $N_2O$ plasma process. As the process conditions in this case, for example, a substrate temperature is set to 350° C. and a process time is set to 10 min.

Then, as shown in FIG. 8D, a silicon oxide film of 20 to 150 nm thickness, preferably 70 to 100 nm thickness, is formed again on the first insulating film 25 by the plasma CVD method using the TEOS gas. The silicon oxide film thus formed is used as a cap insulating film 26.

The unevenness on the upper surface near the stepped portion A of the first insulating film 25 is buried by this cap insulating film 26. Thus, the flatness of the laminated film consisting of the insulating films 25, 26 can be improved.

In this case, an upper surface of the cap insulating film 26 may be polished by the CMP to further improve the flatness.

Then, as the dehydrating process of these insulating films 25, 26, the annealing is carried out for about 30 min at a substrate temperature of about 650° C. in a nitrogen atmosphere. After that, a first alumina film 20 of about 20 nm thickness is formed on the cap insulating film 26 by the sputter method.

Thereafter, RTA (Rapid Thermal Annealing) is applied to the first alumina film 20 at a substrate temperature of about 650° C. for a process time of 60 second.

Next, steps required until a sectional structure shown in FIG. 8E is obtained will be explained hereunder.

First, a platinum film is formed on the first alumina film 20 as a first conductive film 27 by the sputter method. This first conductive film 27 constitutes a capacitor lower electrode when patterned later, and has a film thickness of about 155 nm.

Then, a PZT (Lead Zirconate Titanate: $PbZr_{1-x}Ti_xO_3$) film of 150 to 200 nm thickness is formed on the first conductive film 27 by the sputter method. This PZT film constitutes a ferroelectric film 28.

As the method of forming the ferroelectric film 28, there are the MOCVD (Metal Organic CVD) method and the sol-gel method in addition to the sputter method. Also, the material of the ferroelectric film 28 is not limited to above PZT. The ferroelectric film 28 may be formed of the Bi layer structure compound such as $SrBi_2Ta_2O_9$, $SrBi_2(Ta_xNb_{1-x})_2O_9$, $Bi_4Ti_2O_{12}$ or the like. Furthermore, the ferroelectric film 28 may be made of PLZT ($Pb_{1-x}La_xZr_{1-y}Ti_yO_3$) formed by doping lanthanum in PZT, or other metal oxide ferroelectric substance.

Here, the PZT formed by the sputter method is hardly crystallized immediately after the film formation, and is insufficient in ferroelectricity. For this reason, as the crystallizing annealing to crystallize the PZT constituting the ferroelectric film 28, the RTA (Rapid Thermal Annealing) is performed at a substrate temperature of about 585° C. for about 90 second in an oxygen-containing atmosphere whose oxygen flow rate is set to 0.025 liter/min. When the ferroelectric film 28 is formed by the MOCVD method, the crystallizing annealing is not needed.

Next, a first iridium oxide ($IrO_2$) film of about 50 nm thickness is formed on the ferroelectric film 28 by the sputter method, and then the RTA is applied to this first iridium oxide film. The RTA conditions are not particularly limited. In the present embodiment, a substrate temperature is set to 725° C. and a process time is set to 20 second in an oxygen-containing atmosphere whose oxygen flow rate is set to 0.025 liter/min.

Thereafter, a second iridium oxide film of about 200 nm thickness is formed on the first iridium oxide film by the sputter method. A laminated film of the first and second iridium oxide films constitutes a second conductive film 29.

In this case, because the first conductive film 27 is formed on the first alumina film 20, the orientation property of the platinum constituting the first conductive film 27 can be improved than the case where the first conductive film 27 is formed directly on the cap insulating film 26 without the first alumina film 20. The orientation of PZT constituting the ferroelectric film 28 can be aligned by the action of orientation of the first conductive film 27, and the ferroelectricity of the ferroelectric film 28 can be improved.

Then, steps required until a sectional structure shown in FIG. 8F is obtained will be explained hereunder.

First, upper electrodes 29a are formed by patterning the second conductive film 29 by means of the photolithography. Then, in order to recover the damage that the ferroelectric film 28 received from the patterning, the first-time recovery annealing is applied to the ferroelectric film 28 in the vertical type furnace. This recovery annealing is conducted at a substrate temperature of about 650° C. for a process time of 60 min in an oxygen-containing atmosphere whose oxygen flow rate is set to 20 liter/min, for example.

Next, capacitor dielectric films 28a made of the ferroelectric material such as PZT are formed by patterning the ferroelectric film 28 by means of the photolithography. The damage that the capacitor dielectric films 28a received from this patterning is recovered by the second-time recovery annealing. This second-time recovery annealing is carried out in the oxygen-containing atmosphere by using the vertical type furnace like the first-time recovery annealing. As the conditions, an oxygen flow rate of 20 liter/min, a substrate temperature of 350° C., and a process time of 60 min are employed.

Subsequently, a second alumina film 31 of about 50 nm thickness is formed on the overall upper surface of the silicon substrate 10 by the sputter method. This second alumina film 31 protects the capacitor dielectric films 28a from the reductive substance such as hydrogen, moisture, or the like. Then, in order to recover the damage that the capacitor dielectric films 28a received from the sputter, the third-time recovery annealing is conducted at a substrate temperature of 550° C. for about 60 min in an oxygen-containing atmosphere whose oxygen flow rate is set to 20 liter/min. This recovery annealing is conducted by using the vertical type furnace like the first and the second time recovery annealing.

Then, as shown in FIG. 8G, the first conductive film 27 and the second alumina film 31 are patterned by the photolithography. Thus, the first conductive film 27 under the capacitor dielectric film 28a is shaped into a lower electrode 27a, and the second alumina film 31 is left to cover the lower electrode 27a.

After that, in order to recover the damage that the capacitor dielectric films 28a received during the process, the fourth-time recovery annealing is applied to the capacitor dielectric films 28a at a substrate temperature of 650° C. for a process time of 60 min in an oxygen-containing atmosphere whose oxygen flow rate is set to 20 liter/min. This recovery annealing is conducted by using the vertical type furnace, for example.

According to the steps performed so far, capacitors Q each consisting of the lower electrode 27a, the capacitor dielectric film 28a, and the upper electrode 29a are formed over the silicon substrate 10.

Then, as shown in FIG. 8H, a third alumina film 33 of about 20 nm thickness is formed on the overall upper surface of the silicon substrate 10 by the sputter method to protect the capacitor dielectric films 28a. In cooperation with the underlying second alumina film 31, this third alumina film 33 functions to prevent such an event that the reductive substance such as hydrogen, moisture, or the like comes to the capacitor dielectric film 28a and suppress such an event that the ferroelectric characteristic of the capacitor dielectric film 28a is deteriorated by the reduction.

Then, the fifth-time recovery annealing is applied to the capacitor dielectric films 28a at a substrate temperature of 550° C. for a process time of 60 min in an oxygen-containing atmosphere by the vertical type furnace. In this recovery annealing, an oxygen flow rate is set to 20 liter/min, for example.

Next, a silicon oxide film having a target film thickness of 1500 nm is formed on the third alumina film 33 by the plasma CVD method using the TEOS gas. This silicon oxide film constitutes a second insulating film 35.

Here, if the second insulating film 35 contains much moisture, the capacitor dielectric film 28a is reduced by the moisture, and thus the ferroelectric characteristic of the capacitor dielectric film 28a is deteriorated.

For this reason, as the film forming conditions for the second insulating film 35, the conditions for reducing a content of moisture are employed, like the film forming conditions for the first insulating film 25. Explanation of the conditions will be omitted herein because these conditions are the same as those for the first insulating film 25.

In this case, the second insulating film 35 formed under such conditions tends to become thick in the peripheral area I than the center area II. Thus, a thick portion 35x acting as the cause of the contact failure is formed in the peripheral area I.

Next, steps required until a sectional structure shown in FIG. 8I is obtained will be explained hereunder.

First, in order to remove the thick portion 35x, an upper surface of the second insulating film 35 is polished by the CMP method. Since a film thickness distribution of the second insulating film 35 formed under the low-moisture film forming conditions is largely varied in the substrate plane, the thick portion 35x cannot be removed completely even if the CMP method is executed in this manner.

Next, an upper limit of the film thickness of the second insulating film 35, at which the contact failure is not caused, is set as a reference film thickness $\Delta T_2$. Then, a second resist pattern 36 is formed on the second insulating film 36 in a manner that the portions of the second insulating film 36, whose thickness is thicker than the reference film thickness $\Delta T_2$, is exposed from the second resist pattern 36.

Figure 8J:
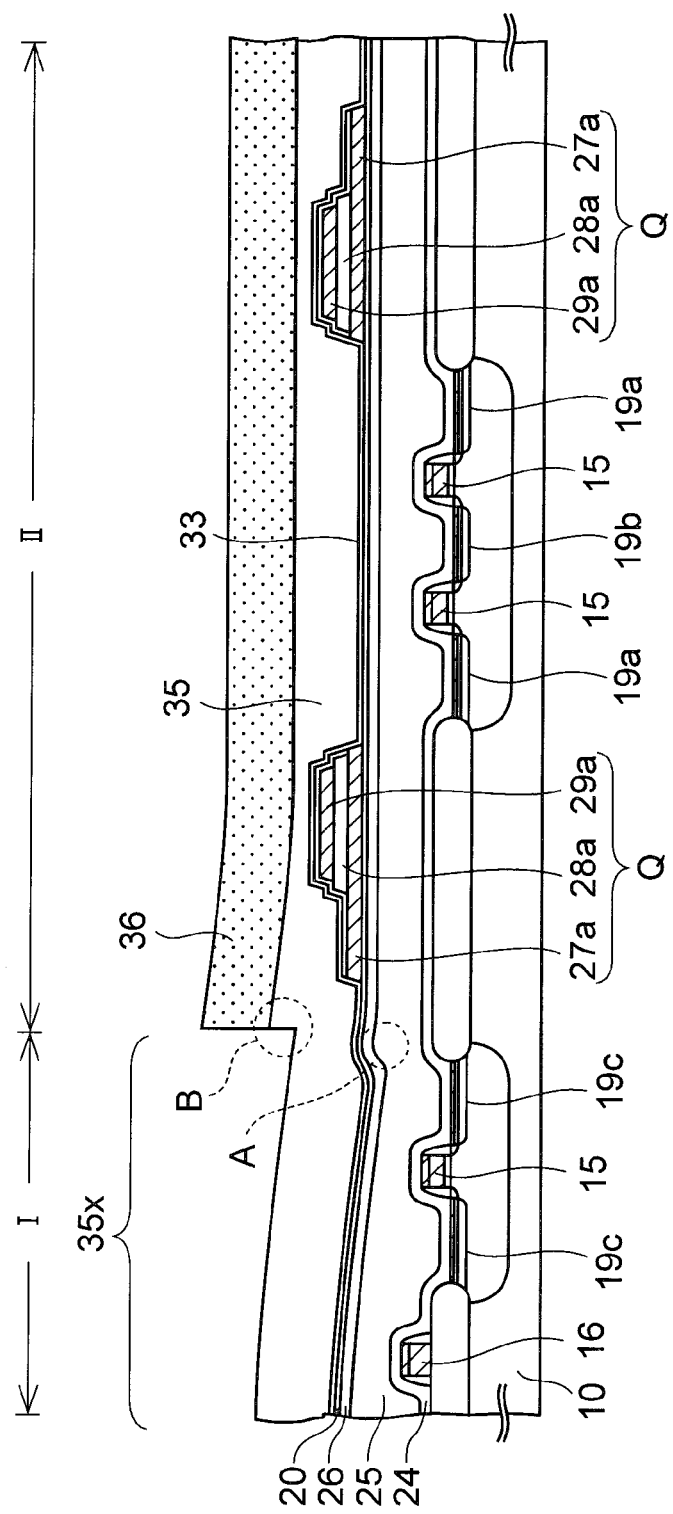
FIGS. 8A to 8Z and FIGS. 9A to 9R are sectional views of a semiconductor device according to a first embodiment in course of manufacture.

Next, as shown in FIG. 8J, the second insulating film 35 in the area that is not covered with the second resist pattern 36 is etched by a thickness of 20 to 150 nm. Thus, the thick portion 35x is thinned selectively.

This etching is performed by either of the dry etching, the sputter etching, and the wet etching, like the etching (FIG. 8B) applied to the first insulating film 25. Because these etching conditions are the same as those explained by reference to FIG. 8B, their explanation will be omitted herein.

Also, a stepped portion B as shown in FIG. 8B is formed on the second insulating film 35 under the side surface of the second resist pattern 36 by this etching.

After that, the second resist pattern 36 is removed.

Figure 8K:
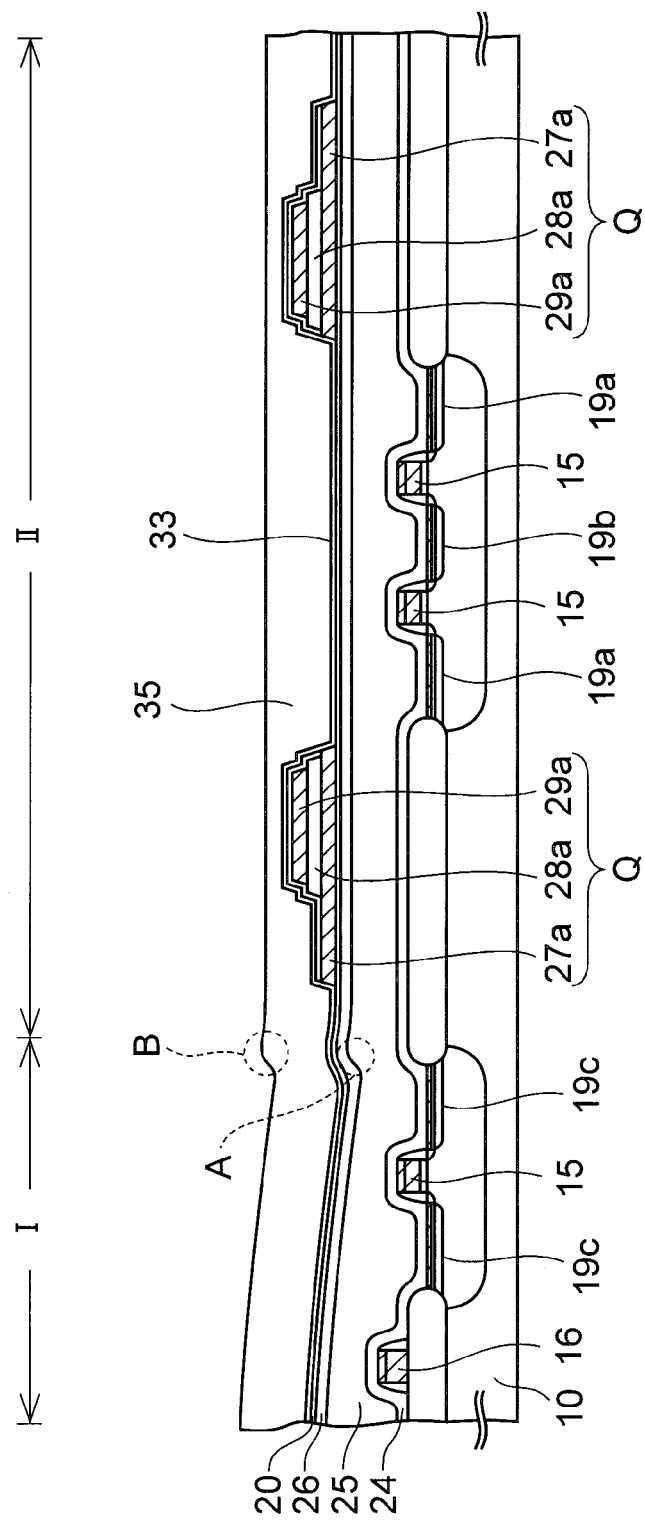

Next, as shown in FIG. 8K, an upper surface of the second insulating film 35 is etched up to a depth of about 100 to 200 nm by the sputter etching using an argon gas. Thus, the stepped portion B is chamfered.

In this case, instead of the sputter etching, this chamfering may be executed by the RIE that uses the etching gas containing a halogen gas. In both the sputter etching and the RIE, the conditions explained by reference to FIG. 8C can be employed as the etching conditions. Also, the stepped portion B may be chamfered by applying the CMP to the second insulating film 35, instead of these etchings.

Moreover, the chamfering of the stepped portion B is not the essential step, and this step may be omitted in some cases.

Furthermore, the dehydrating process may be applied to the second insulating film 35 after the chamfering. As the dehydrating process, there is the $N_2O$ plasma process using the CVD equipment. In this case, a substrate temperature is set to 350° C. and a process time is set to 2 min.

The second insulating film 35 is dehydrated by such $N_2O$ plasma process, and also the upper surface of the first insulating film 25 is nitrided to prevent re-adsorption of the moisture.

Note that the $NH_3$ plasma process may be executed instead of the $N_2O$ plasma process. As the process conditions in this case, a substrate temperature is set to 350° C. and a process time is set to 10 min, for example.

Figure 8L:
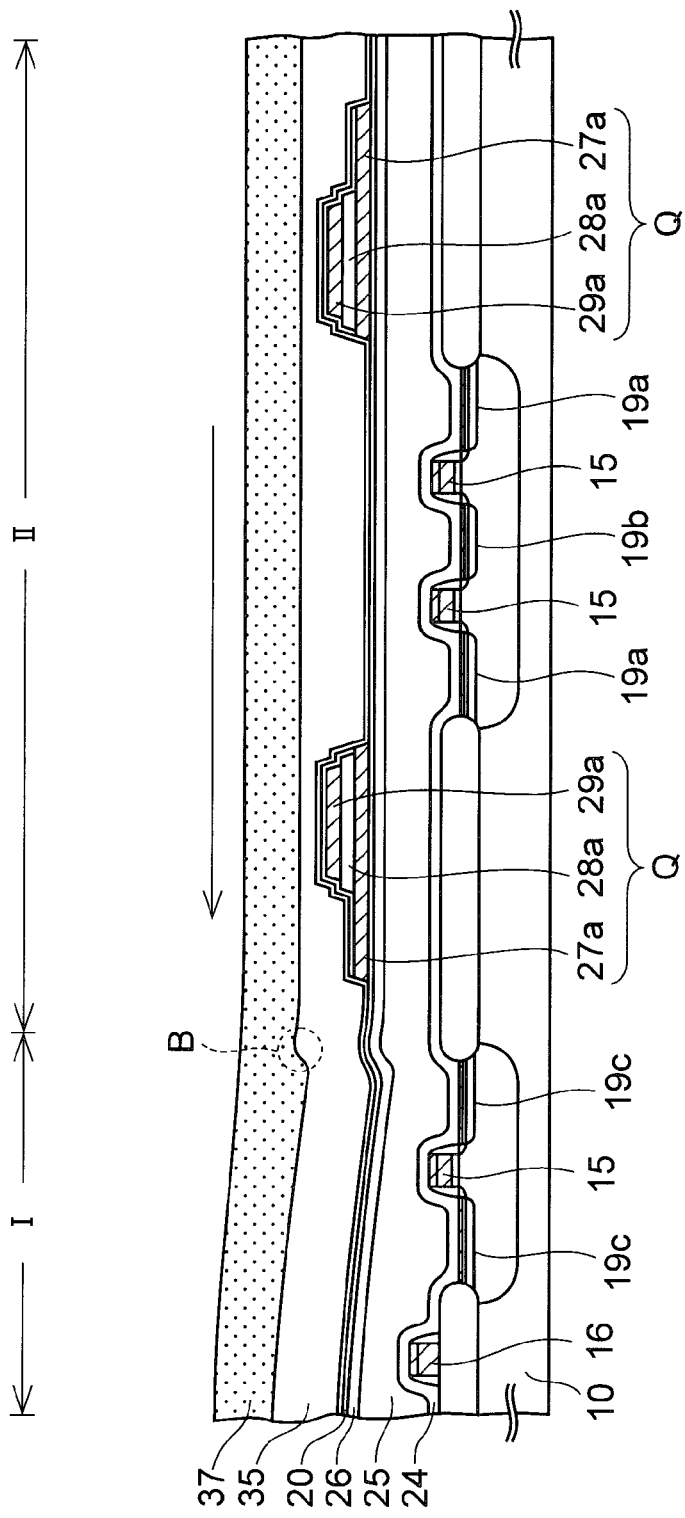

Then, as shown in FIG. 8L, a first photoresist 37 is coated on the second insulating film 35 by the spin coating, while turning the silicon substrate 10.

In this spin coating, the photoresist flows from the center area II to the peripheral area I as indicated with an arrow in FIG. 8L by centrifugal force. In this event, since the stepped portion B is chamfered previously as described above, a drift or bubble of the photoresist is not formed near the stepped portion B. Therefore, the first photoresist 37 whose thickness is uniform in the substrate plane can be formed.

Figure 8M:
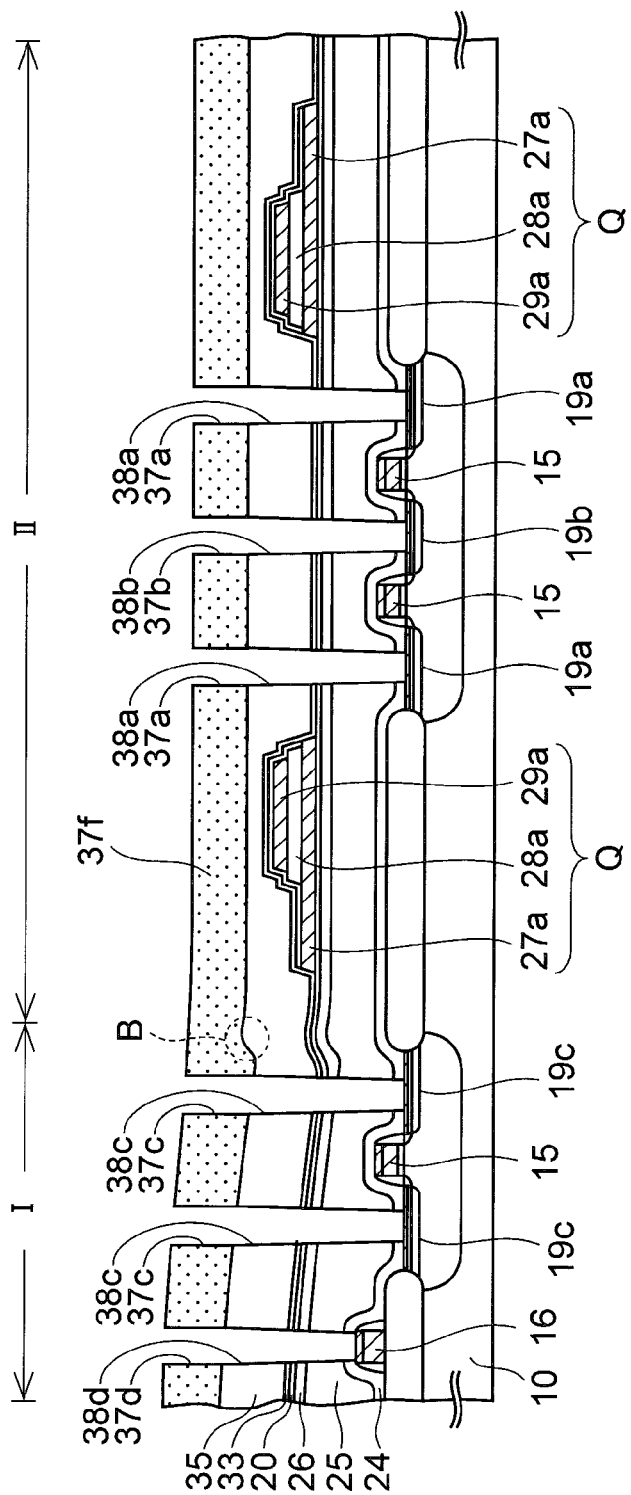

Then, as shown in FIG. 8M, a third resist pattern 37f is formed by exposing/developing the first photoresist 37.

Here, a thickness of the first photoresist 37 is made uniform because the stepped portion B is chamfered as described above. Therefore, a pattern deformation caused due to a defocusing in the exposure does not occur in the third resist pattern 37f, and the third resist pattern 37f having first to fourth windows 37a to 37d shaped as designed can be formed.

Then, respective films of the second insulating film 35 to the etching stopper film 24 are etched by the dry etching, while using the third resist pattern 37f as a mask. Thus, the first to fourth contact holes 38a to 38d are formed in these insulating films under the first to fourth windows 37a to 37d.

This dry etching is executed in the parallel-plate type plasma etching equipment (not shown) by three-step etching. In the first-step etching, a mixed gas of $C_4F_8$, $O_2$, and Ar is used as an etching gas, and respective films of the second insulating film 35 to the first insulating film 25 are etched. This etching is stopped at the etching stopper film 24, and hence the etching stopper film 24 is not etched.

In the second-step etching, a mixed gas of $O_2$ and Ar is used as an etching gas, and the etching product generated in the holes by the first step is removed by a sputter action of this gas.

Then, in the third-step etching, the etching stopper film 24 is etched by using a mixed gas of $C_4F_8$, $CF_4$, $O_2$, and Ar is used as an etching gas.

After the above etching is ended, the third resist pattern 37f is removed.

Here, the thick portions 25x, 35x (see FIG. 8B and FIG. 8J) of the first insulating film 25 and the second insulating film 35 are thinned in advance respectively. Therefore, an etching depth in the peripheral area I can be set substantially equal to that in the center area II. As a result, the third and fourth contact holes 37c, 37d in the peripheral area I can reach the third source/drain regions 19c and the wiring 16, and such a situation can be prevented that these contact holes are not opened.

Figure 8N:
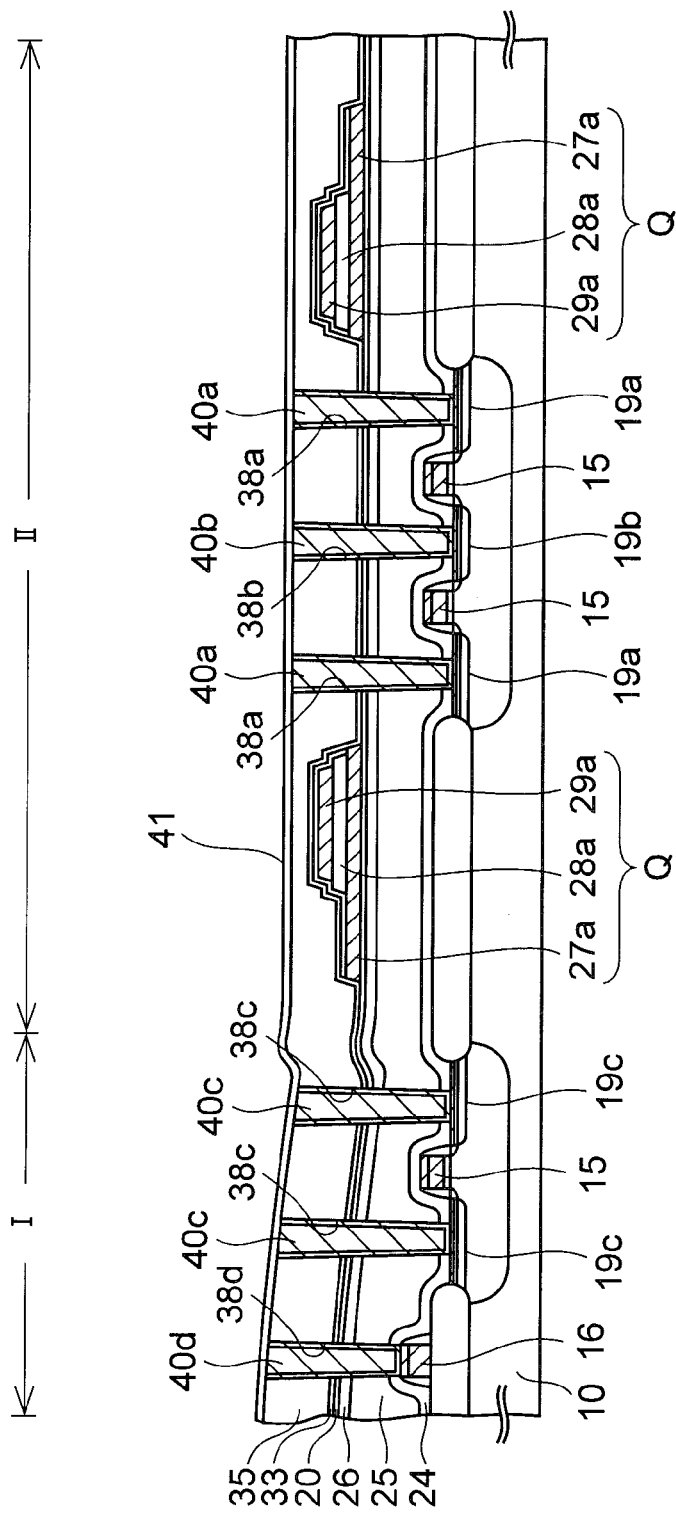
Figure 80:
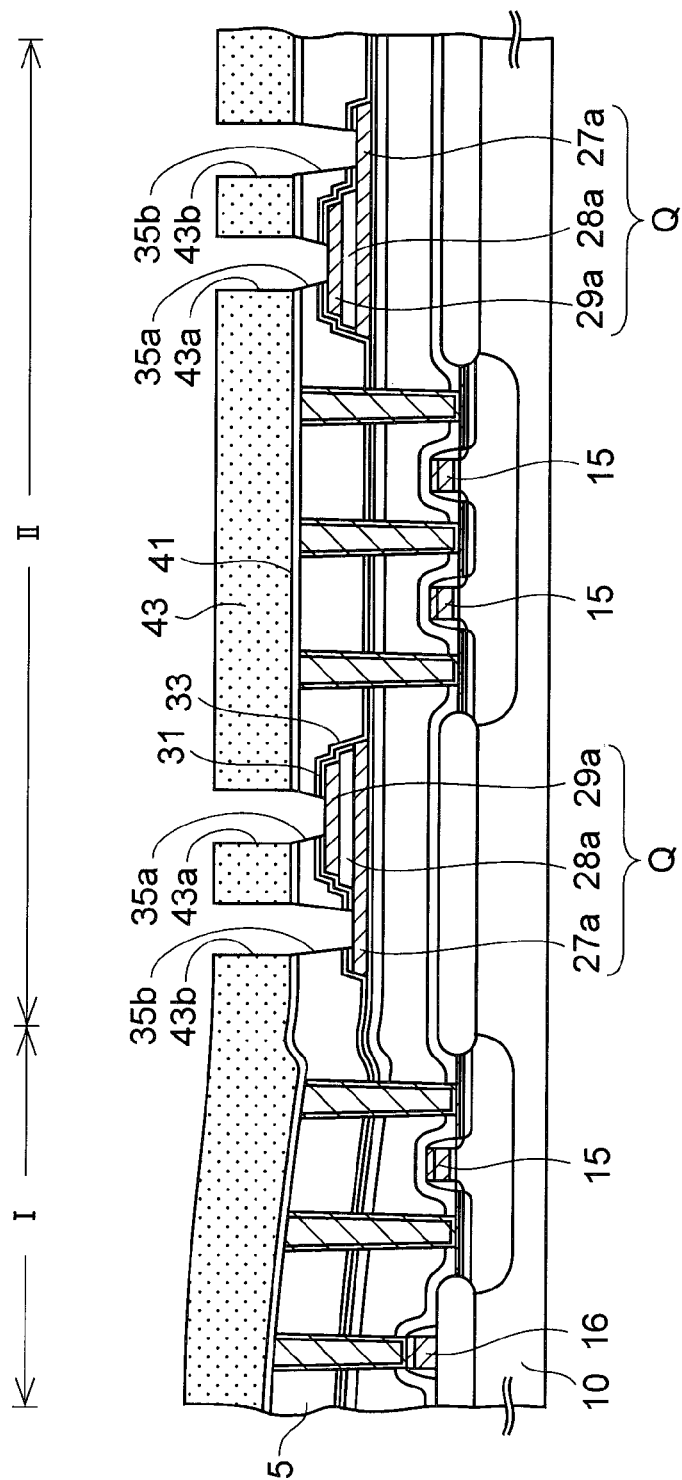

Next, steps required until a sectional structure shown in FIG. 8N is obtained will be explained hereunder.

First, a titanium (Ti) film of 20 nm thickness and a titanium nitride (TiN) film of 50 nm thickness are formed on inner surfaces of the first to fourth contact holes 38a to 38d and an upper surface of the second insulating film 35 by the sputter method. These films are used as a glue film. Then, a tungsten film of 500 nm thickness is formed on the glue film by the CVD method using a tungsten hexafluoride gas. Thus, the first to fourth contact holes 38a to 38d are buried completely by the tungsten film.

Thereafter, the extra glue film and the extra tungsten film on the second insulating film 35 are polished and removed by the CMP method. Thus, these films are left in the first to fourth contact holes 38a to 38d as the first to fourth conductive plugs 40a to 40d respectively.

Out of these conductive plugs, the first and second conductive plugs 40a, 40b are connected electrically to the first and second source/drain regions 19a, 19b respectively.

Also, the third and fourth conductive plugs 40c, 40d formed in the peripheral area I are satisfactorily connected electrically to the third source/drain region 19c and the wiring 16 respectively, since the third and fourth contact holes 38c, 38d are opened perfectly as described above. Therefore, it can be prevented that these conductive plugs 40c, 40d cause the contact failure.

In this case, after the first to third conductive plugs 40a to 40c are formed, the $N_2O$ plasma process using the CVD equipment may be applied to the second insulating film 35 to perform the dehydration of the second insulating film 35 and prevent the re-adsorption of moisture. The dehydrating process is executed at a substrate temperature of 350° C. for a process time of 2 min, for example.

By the way, the first to third conductive plugs 40a to 40c are mainly formed of the tungsten that is very easily oxidized. Therefore, it is feared that these conductive plugs are oxidized easily in the oxygen-containing atmosphere to cause the contact failure.

Therefore, in order to prevent that the first to fourth conductive plugs 40a to 40d are oxidized, a silicon oxide nitride film of about 100 nm thickness is formed as an oxidation preventing insulating film 41 on upper surfaces of these plugs and the second insulating film 35 by the CVD method.

Next, steps required until a sectional structure shown in FIG. 8O is obtained will be explained hereunder.

First, a fourth resist pattern 43 is formed by coating the photoresist on the oxidation preventing insulating film 41 and then exposing/developing it. As shown in FIG. 8O, fifth windows 43a and sixth windows 43b are formed like a hole shape in the fourth resist pattern 43 on the upper electrodes 29a and the lower electrodes 27a respectively.

Then, the oxidation preventing insulating film 41, the second insulating film 35, and the second and third alumina films 31, 33 are etched while using the fourth resist pattern 43 as a mask. Thus, a first hole 35a is formed on the upper electrodes 29a, and a second hole 35b is formed on the contact area of the lower electrodes 27a.

Then, the fourth resist pattern 43 is removed. After that, in order to recover the damage that the capacitor dielectric film 28a received in the steps executed up to now, the silicon substrate 10 is put into the oxygen-containing atmosphere in the vertical type furnace, and the sixth-time recover annealing is applied to the capacitor dielectric films 28a at a substrate temperature of 500° C. for a process time of 60 min. At this time, a flow rate of oxygen is set to 20 liter/min, for example.

Thereafter, the oxidation preventing insulating film 41 is removed by the etching-back.

Figure 8P:
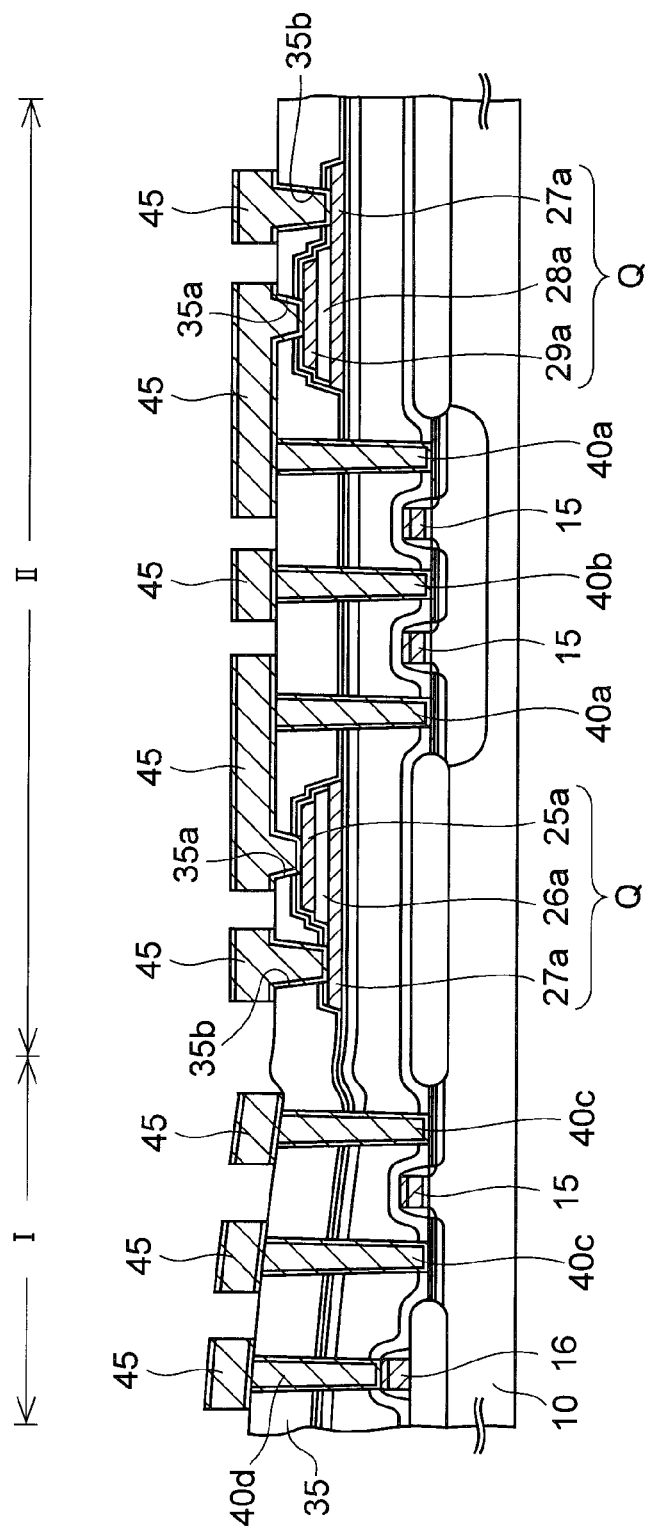

Next, steps required until a sectional structure shown in FIG. 8P is obtained will be explained hereunder.

First, a metal laminated film is formed on upper surfaces of the second insulating film 35 and the first to fourth conductive plugs 40a to 40d and inner surfaces of the first and second holes 35a, 35b by the sputter method respectively. In the present embodiment, a titanium nitride film of about 150 nm thickness, a copper-containing aluminum film of about 550 nm thickness, a titanium film of about 5 nm thickness, and a titanium nitride film of about 150 nm thickness are formed in this order as the metal laminated film.

Then, the metal laminated film is patterned by the photolithography. Thus, a first-layer metal wiring 45 is formed on the second insulating film 35. The portions of the first-layer metal wiring 45, which are formed over the capacitors Q, are connected electrically to the upper electrodes 29a and the lower electrodes 27a via the first and second hole 35a, 35b respectively.

Thereafter, the second insulating film 35 is annealed and dehydrated in the nitrogen atmosphere at a substrate temperature of 350° C. at a $N_2$ flow rate of 20 liter/min for a process time of 30 min by using the vertical type furnace.

Figure 8Q:
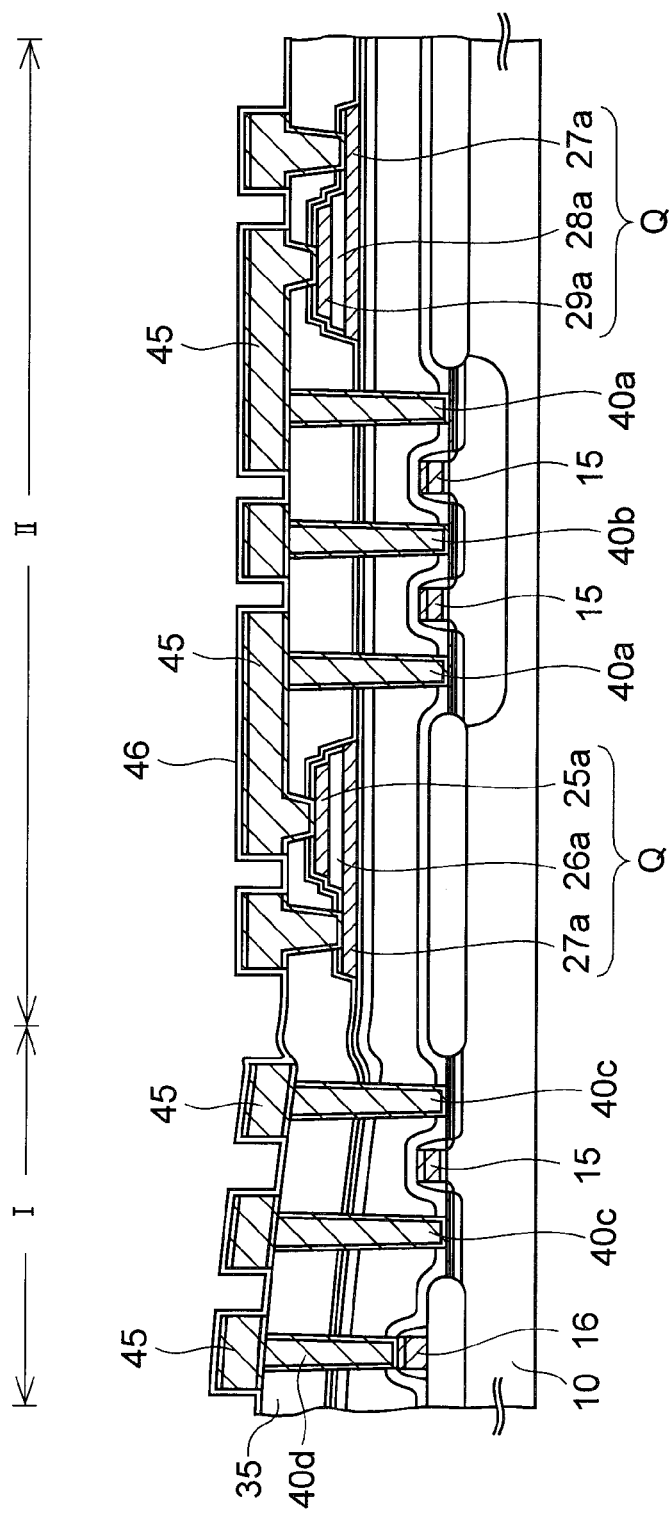

Subsequently, as shown in FIG. 8Q, an alumina film of 20 nm thickness is formed as a first capacitor protection insulating film 46, which covers the first-layer metal wiring 45 and the second insulating film 35, by the sputter method.

This first capacitor protection insulating film 46 has a function of protecting the capacitor dielectric films 28a by blocking the reductive substance such as hydrogen, moisture, or the like. As the film having such function, there are a titanium oxide film, a silicon nitride film, and a silicon oxide nitride film, in addition to the alumina film, and the first capacitor protection insulating film 46 may be formed by a single layer film or a laminated film of these films.

Figure 8R:
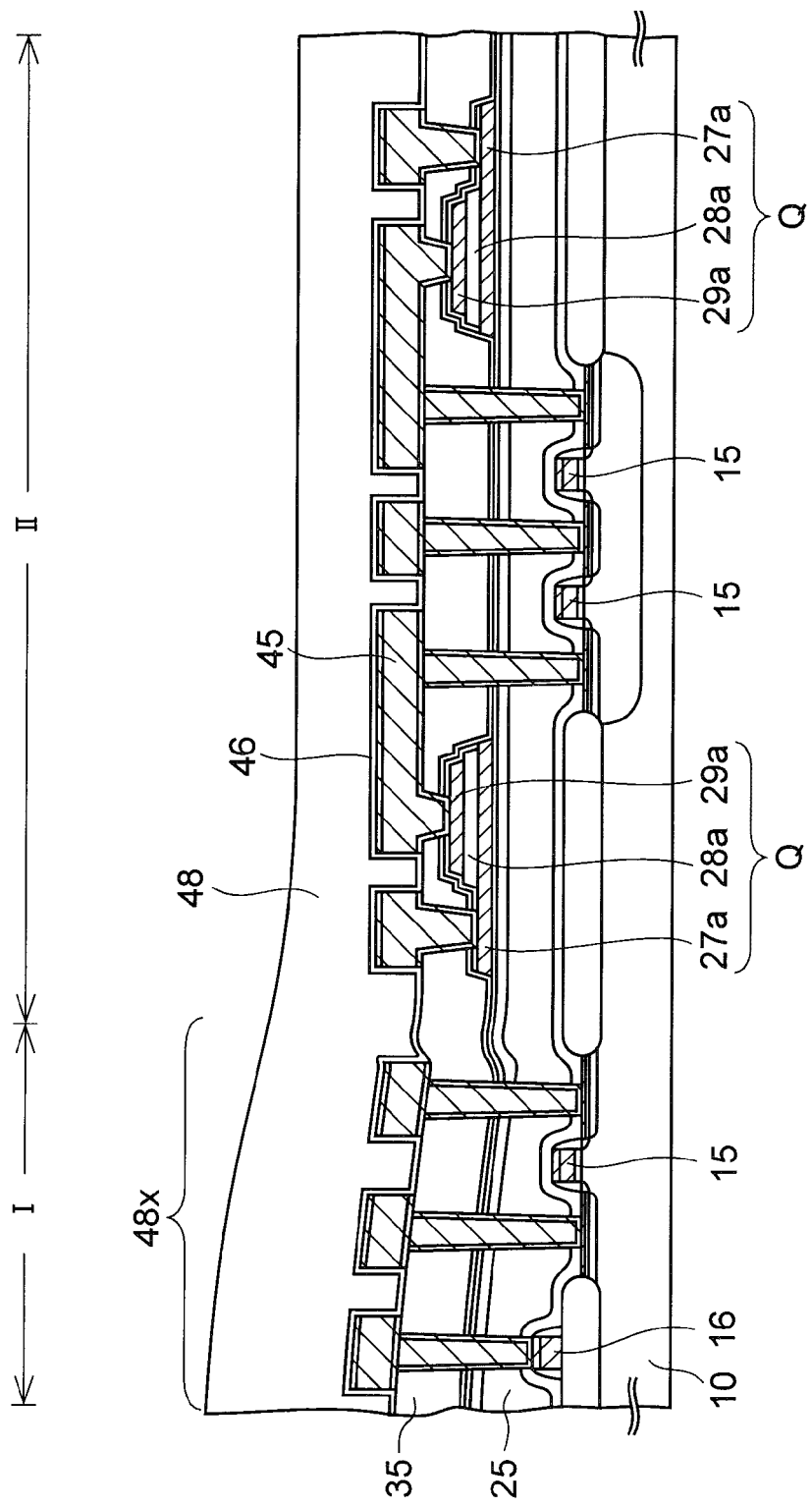

Then, as shown in FIG. 8R, a silicon oxide film is formed on the first capacitor protection insulating film 46 by the plasma CVD method using a TEOS gas and oxygen as a reaction gas. This silicon oxide film constitutes a third insulating film 48. A target film thickness of the third insulating film 48 is set to about 2600 nm on the first-layer metal wiring 45, for example.

In order to prevent such an event that the capacitor dielectric films 28a are deteriorated by the moisture, like the first insulating films 25, 35, this third insulating film 48 is also formed under the film forming conditions that a content of moisture in the film is lowered, i.e., a flow rate of oxygen is increased higher than the flow rate necessary for oxidizing the TEOS gas.

Under such film forming conditions, a film thickness of the third insulating film 48 in the peripheral area I becomes thicker than that in the center area II. Thus, a thick portion 48x of the third insulating film 48 as shown in FIG. 8R is formed.

Figure 8S:
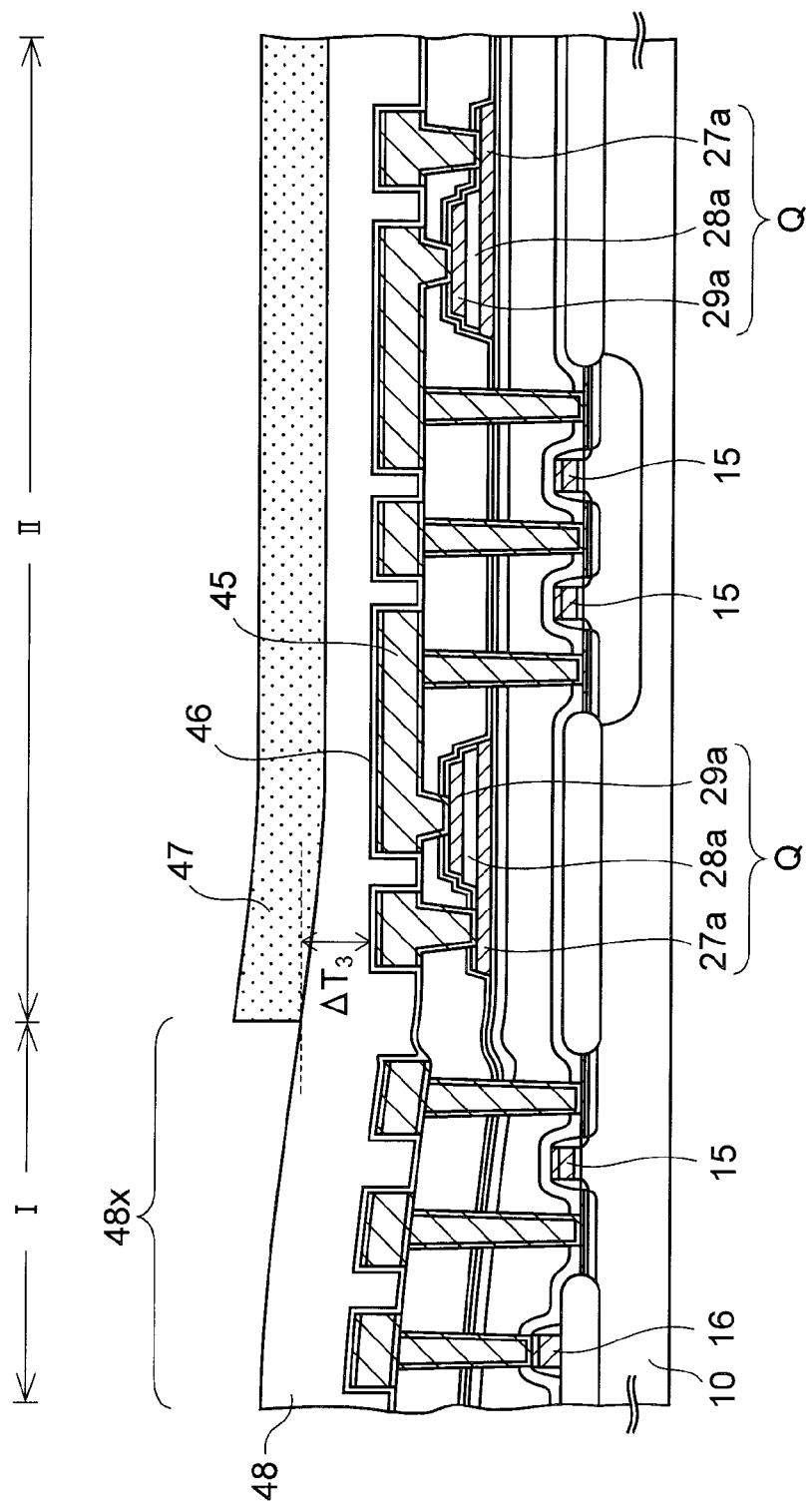

Next, steps required until a sectional structure shown in FIG. 8S is obtained will be explained hereunder.

First, an upper surface of the third insulating film 48 is polished by the CMP to planarize it.

In this case, the film thickness of the third insulating film 48 formed under the low-moisture conditions is largely varied in the substrate plane, as described above. Therefore, the upper surface of the third insulating film 48 cannot be completely planarized by the CMP, and the thick portion 48x of the third insulating film 48 is left formed in the peripheral area I.

When the thick portion 48x is too thick, this thick portion becomes a cause of the contact failure between the layers, as already described.

Next, an upper limit of the film thickness of the third insulating film 48, at which the contact failure is not caused, s set as a reference film thickness $\Delta T_3$. Then, a fifth resist pattern 47 is formed on the third insulating film 48 in a manner that the portions of the third insulating film 48, whose thickness is thicker than the reference film thickness $\Delta T_3$, is exposed from the fifth resist pattern 47. Note that the reference film thickness $\Delta T_3$ is measured on the first-layer metal wiring 45.

Figure 8T:
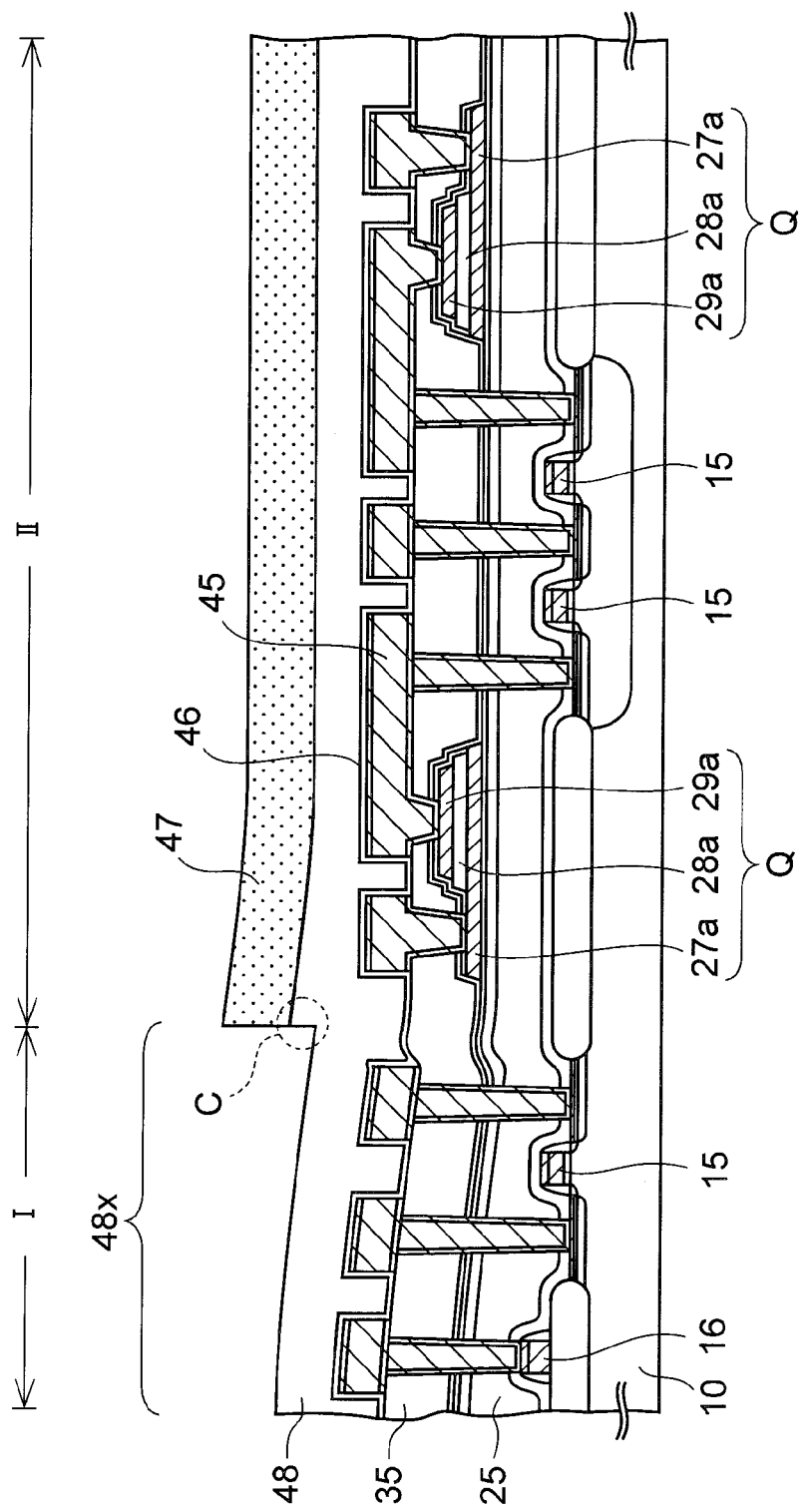

Then, as shown in FIG. 8T, the thick portion 48x that is not covered with the fifth resist pattern 47 is etched by a thickness of 20 to 150 nm. Thus, the thick portion 48x is thinned selectively.

This etching can be executed by either of the dry etching, the sputter etching, and the wet etching under the etching conditions explained in FIG. 8B.

Thereafter, the fifth resist pattern 47 is removed.

Note that a stepped portion C formed in the above etching remains on the third insulating film 48 after the fifth resist pattern 47 is removed.

Next, as shown in FIG. 8U, the upper surface of the third insulating film 48 is etched up to a depth of about 100 to 200 nm by the sputter etching using an argon gas or the RIE using a halogen gas in the etching gas. Thus, the chamfering of the stepped portion C is executed. In this case, these etching conditions are the same as the conditions for the chamfering of the stepped portion A (see FIG. 8C), and hence the explanation of these conditions will be omitted herein. Also, the chamfering of the stepped portion C may be executed by applying the CMP to the upper surface of the third insulating film 48 instead of such an etching.

Moreover, the chamfering of the stepped portion C is not the essential step, and this chamfering may be omitted in some cases.

Then, as shown in FIG. 8V, the $N_2O$ plasma process is applied to the surface of the third insulating film 48 at a substrate temperature of 350° C. for a process time of about 4 min in the CVD equipment. Such $N_2O$ plasma process dehydrates the third insulating film 48 and nitrides the surface of the third insulating film 48, and thus such an event can be prevented that the silicon oxide having a strong affinity for the moisture absorbs the moisture.

In this case, the $NH_3$ plasma process may be executed at a substrate temperature of 350° C. for a process time of 10 min in place of the $N_2O$ plasma process.

Figure 8W:
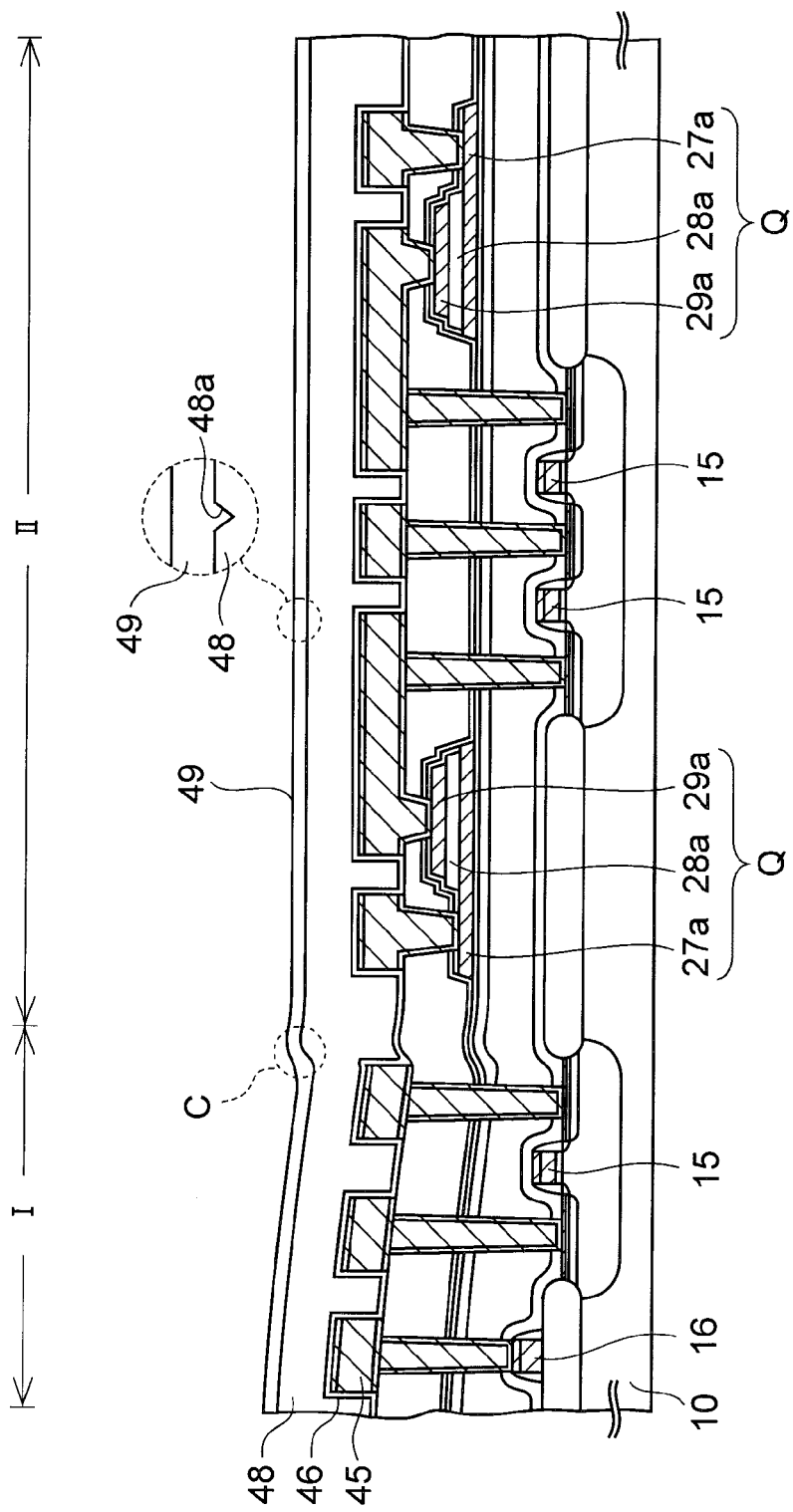

Then, as shown in FIG. 8W, a silicon oxide film of about 100 nm thickness is formed on the third insulating film 48 as a cap insulating film 49 by the plasma CVD method using a TEOS gas.

The unevenness on the upper surface near the stepped portion C of the third insulating film 48 is buried by the cap insulating film 49. Thus, the flatness of the insulating films 48, 49 as the laminated film can be improved.

Also, the upper surface of the cap insulating film 49 may be polished by the CMP. Thus, the flatness can be further improved.

By the way, when the chamfering step (FIG. 8U) for the stepped portion C is omitted, a minute scratch (micro scratch) 48a generated by a contact to the pad of the CMP equipment in the CMP (see FIG. 8S) applied to the third insulating film 48 is formed on the upper surface of the third insulating film 48 in the area that is not covered with the fifth resist pattern 47. This cap insulating film 49 fulfills a role of burying this scratch 48a.

Then, as shown in FIG. 8X, the $N_2O$ plasma process is executed again in the CVD equipment. Thus, the cap insulating film 49 is dehydrated, and the surface of the cap insulating film 49 is nitrided to prevent the re-adsorption of the moisture. This $N_2O$ plasma process is executed at a substrate temperature of 350° C. for a process time of 2 min, for example.

Figure 8Y:
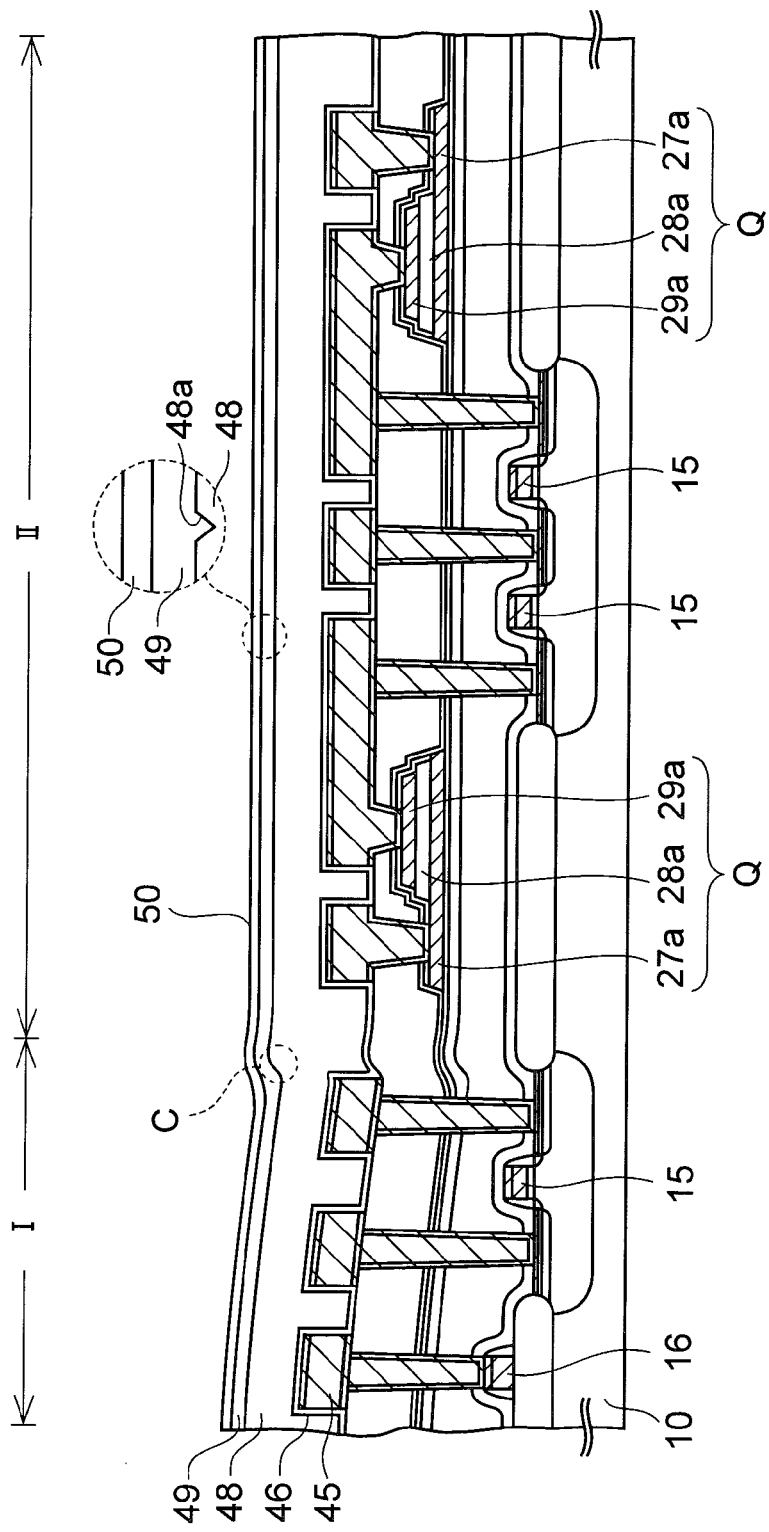

Then, as shown in FIG. 8Y, in order to prevent such an event that the reductive substance such as hydrogen, moisture, or the like contained in the external atmosphere comes to the capacitor dielectric film 28a, an alumina film that is excellent in the blocking property to these substances is formed on the cap insulating film 49 by the sputter method. This alumina film constitutes a second capacitor protection insulating film 50.

A thickness of the second capacitor protection insulating film 50 is not particularly limited. Preferably, in order to facilitate the etching for forming the holes later, such thickness is set to thinner than the cap insulating film 49, e.g., 50 nm.

The second capacitor protection insulating film 50 is not limited to the alumina film. Like the first capacitor protection insulating film 46, the second capacitor protection insulating film 50 may be formed of a single layer film or a laminated film of an alumina film, a titanium oxide film, a silicon nitride film, and a silicon oxide nitride film.

As described above, the scratch 48a generated in the third insulating film 48 in the CMP or the unevenness near the stepped portion C is buried by the cap insulating film 49 prior to the formation of the second capacitor protection insulating film 50. Therefore, the second capacitor protection insulating film 50 whose film thickness is thin like about 50 nm can be formed on the cap insulating film 49 to have a uniform thickness.

In contrast, when the second capacitor protection insulating film 50 is formed on the third insulating film 48 without forming the cap insulating film 49, thickness of the second capacitor protection insulating film 50 becomes insufficient around the scratch 48a or the stepped portion C, and hence it is feared that the hydrogen or the like comes to the capacitor dielectric film 28a.

Then, as shown in FIG. 8Z, a silicon oxide film is formed on the second capacitor protection insulating film 50 by the plasma CVD method using the TEOS gas. This silicon oxide film constitutes a first cover insulating film 51. A thickness of this first cover insulating film 51 is set to about 100 nm, for example.

Then, as shown in FIG. 9A, the $N_2O$ plasma process is applied to the first cover insulating film 51 at a substrate temperature of 350° C. for a process time of 2 min. Thus, the first cover insulating film 51 is dehydrated and the surface of the first cover insulating film 51 is nitrided to prevent the re-adsorption of the moisture. The $N_2O$ plasma process is executed by using the CVD equipment, for example.

Figure 9B:
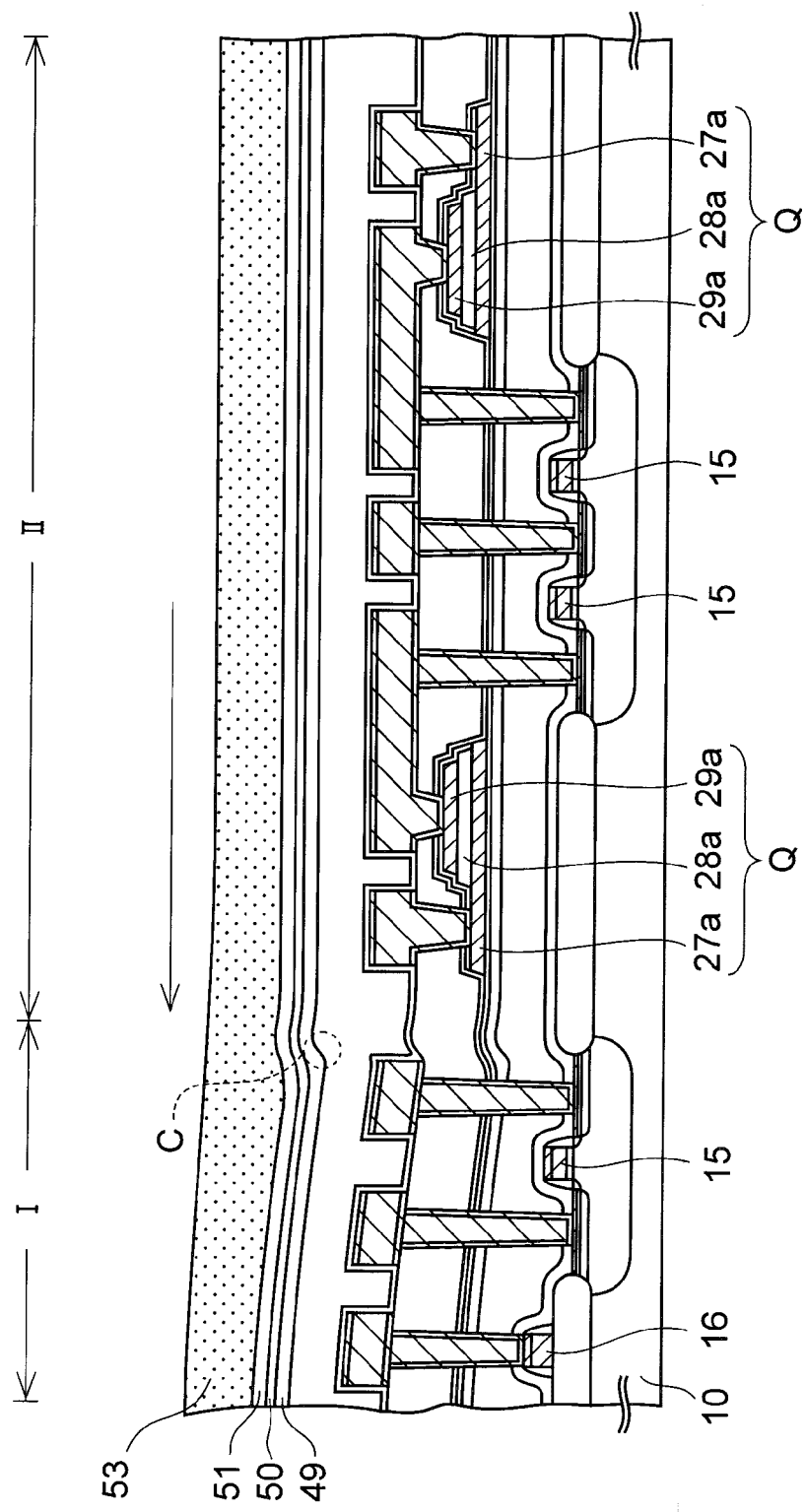

Then, as shown in FIG. 9B, a second photoresist 53 is coated on the first cover insulating film 51 by the spin coating, while turning the silicon substrate 10.

In this spin coating, the photoresist flows from the center area II to the peripheral area I as indicated with an arrow in FIG. 9B by centrifugal force. In this event, since the stepped portion C is chamfered previously in the step in FIG. 8V, a drift or bubble of the photoresist is hardly formed near the stepped portion C. Therefore, the second photoresist 53 whose thickness is uniform in the substrate plane can be formed.

Also, the unevenness near the stepped portion C is buried with the cap insulating film 49. Therefore, the photoresist can flow smoothly on the first cover insulating film 51, and generation of the bubble or drift of the photoresist can be prevented more effectively.

Figure 9C:
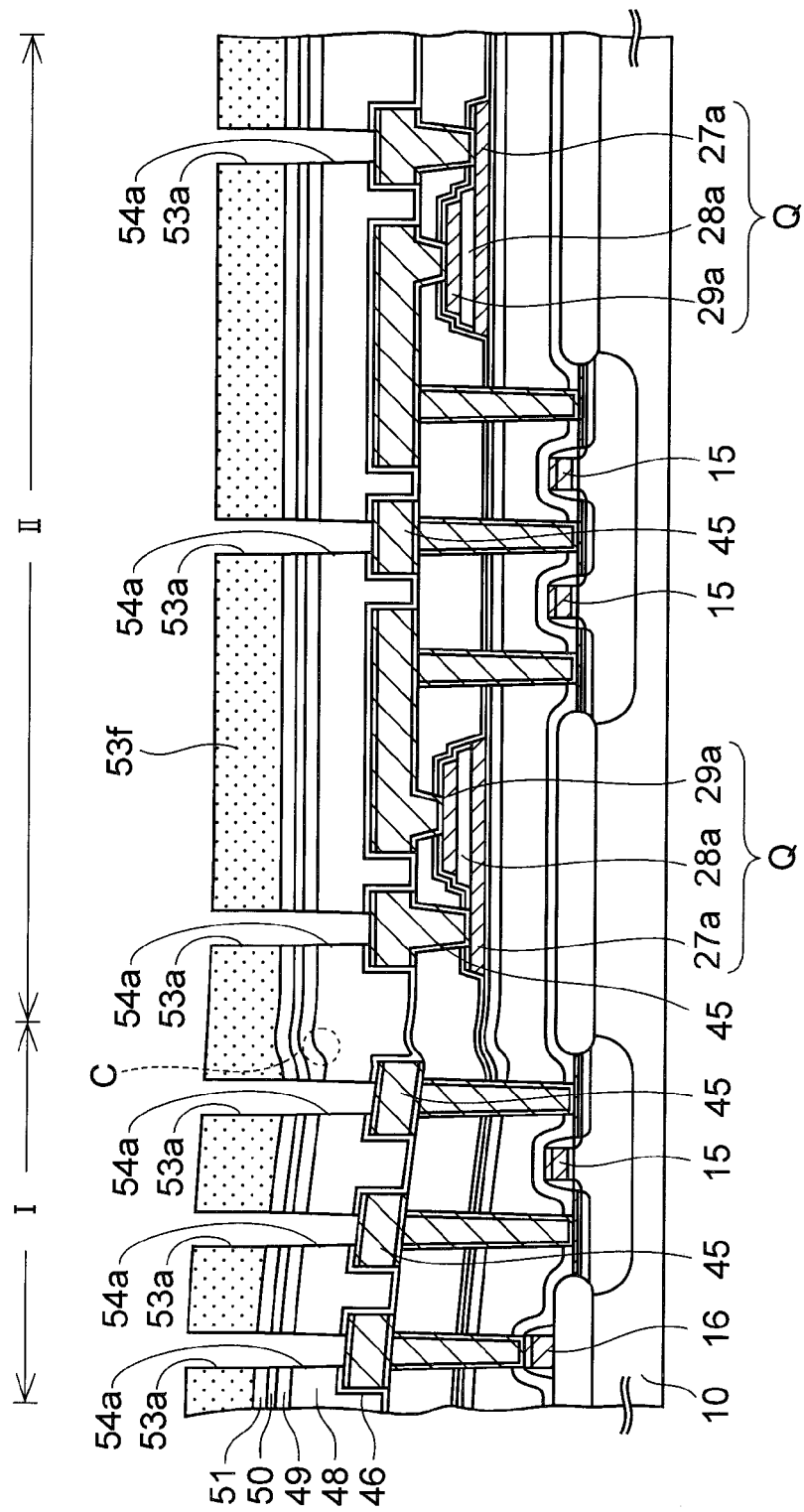

Next, steps required until a sectional structure shown in FIG. 9C is obtained will be explained hereunder.

First, a sixth resist pattern 53f having hole-like seventh windows 53a on the first-layer metal wiring 45 is formed by exposing/developing the second photoresist 53.

Here, a thickness of the second photoresist 53 is made uniform because the stepped portion C is chamfered as described above. Therefore, a pattern deformation caused due to a defocusing in the exposure does not occur in the sixth resist pattern 53f, and the sixth resist pattern 53f having the seventh windows 53a shaped as designed can be formed.

Then, respective insulating films 46, 48 to 51 under the seventh windows 53a are etched by using the parallel-plate type plasma etching equipment (not shown) using a mixed gas of $C_4F_8$, Ar, and $O_2$ as an etching gas. Thus, third holes 54a are formed on the first-layer metal wiring 45.

Here, the thick portion 48x of the third insulating film 48 in the peripheral area I is thinned in the step in FIG. 8T. Therefore, such a situation can be prevented that the third holes 54a are not opened.

After the above etching is ended, the third resist pattern 37f is removed.

Figure 9D:
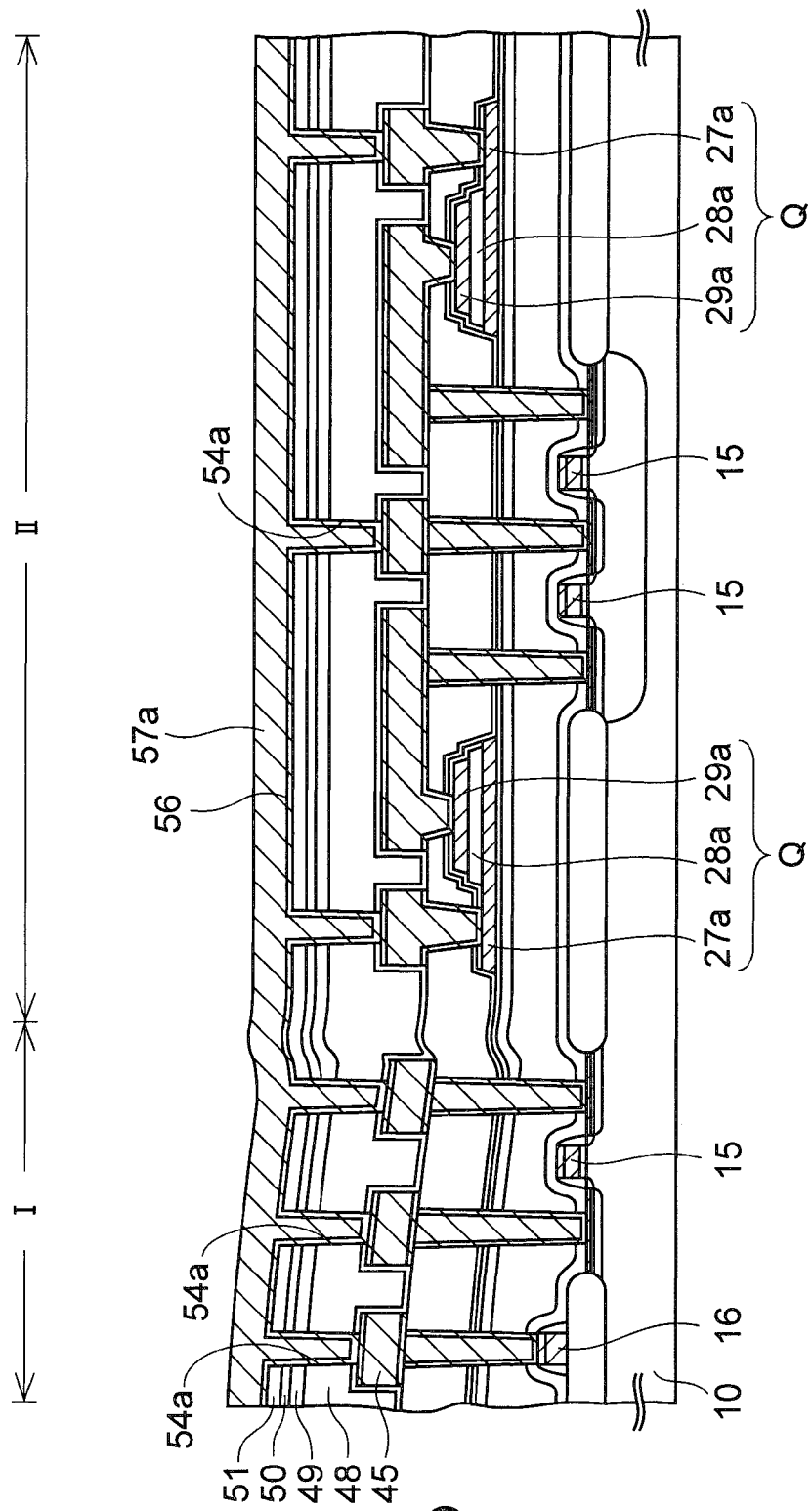

Then, as shown in FIG. 9D, a titanium nitride film of about 150 nm thickness is formed on inner surfaces of the third holes 54a and an upper surface of the first cover insulating film 51 by the sputter method, while keeping a substrate temperature at about 200° C. This titanium nitride film constitutes a first glue film 56.

Subsequently, a tungsten film 57a is formed on the first glue film 56 by the CVD method using a tungsten hexafluoride gas to have a thickness that buries completely the third holes 54a, e.g., about 650 nm.

Figure 9E:
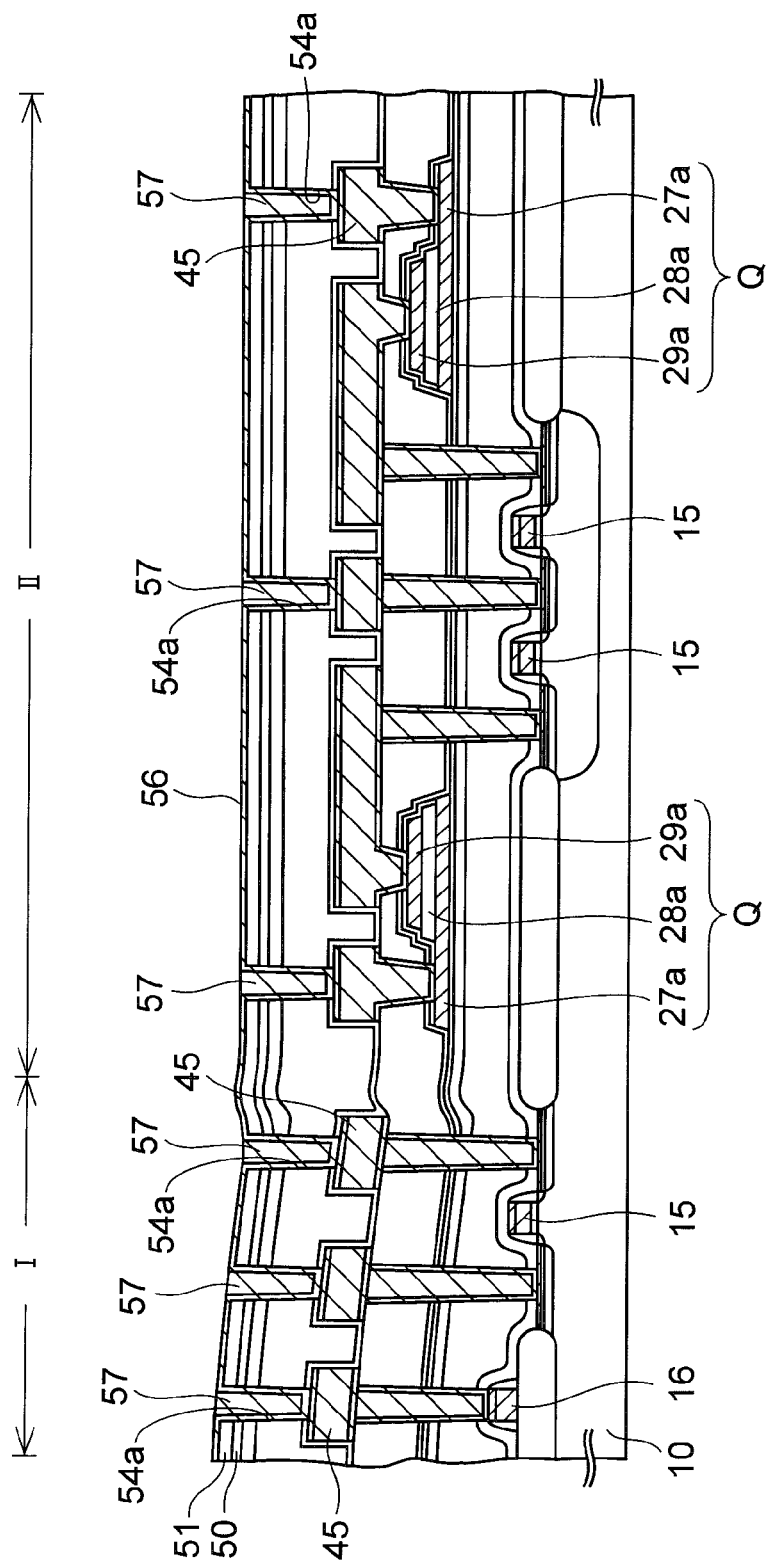

Next, as shown in FIG. 9E, the tungsten film 57a is etched back and removed from the upper surface of the first cover insulating film 51, and is left only in the third holes 54a. Accordingly, fifth conductive plugs 57 connected electrically to the first-layer metal wiring 45 and formed mainly of tungsten are formed in the third holes 54a.

In this example, the tungsten film is etched back. But the CMP may be employed instead of the etching-back.

As described above, the third holes 54a are opened completely because the thick portion 48x of the third insulating film 48 is thinned. Therefore, the fifth conductive plugs 57 are connected satisfactorily to the first-layer metal wiring 45, and the contact failure of the fifth conductive plugs 57 seldom occurs.

Figure 9F:
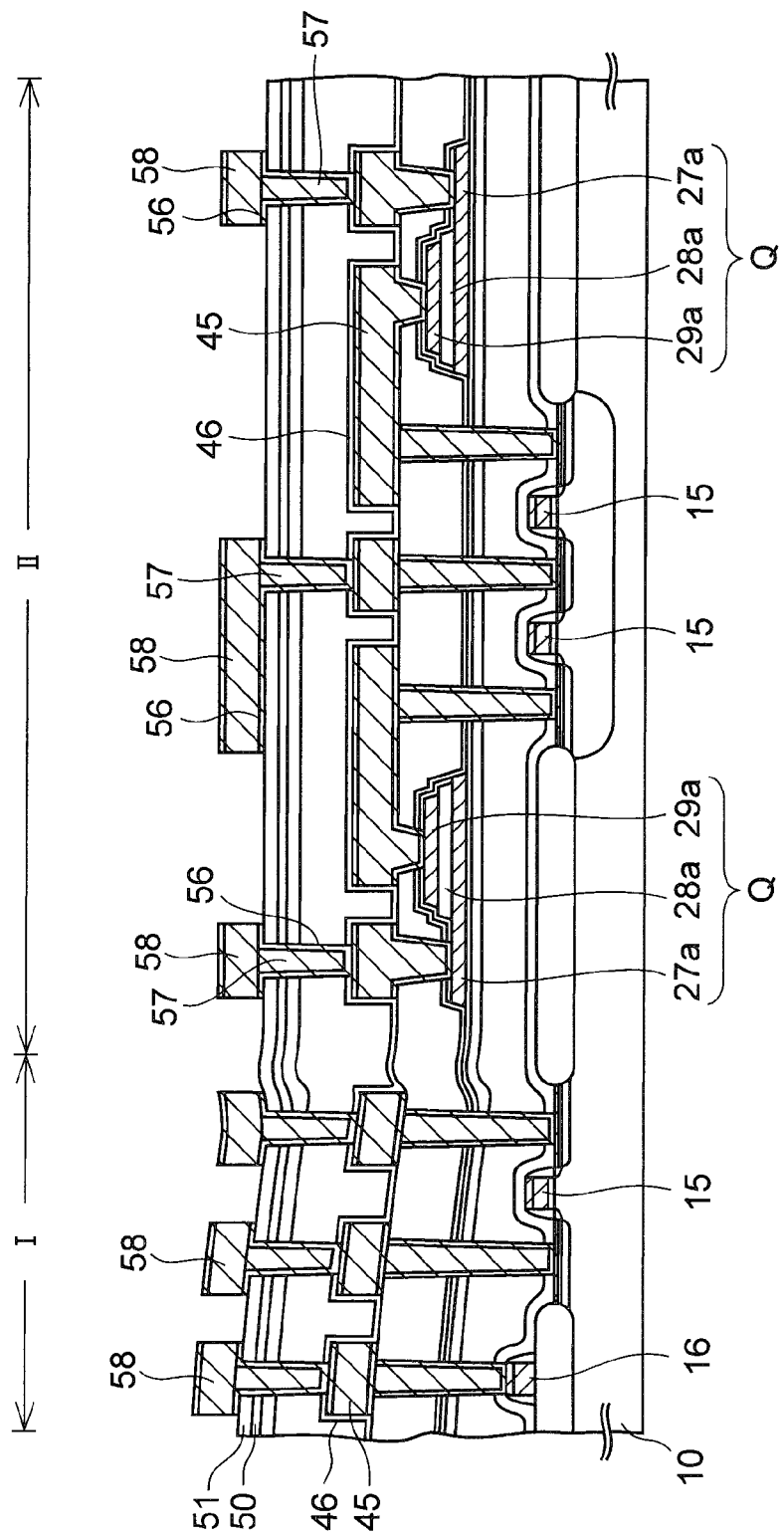

Next, steps required until a sectional structure shown in FIG. 9F is obtained will be explained hereunder.

First, a metal laminated film is formed on upper surfaces of the fifth conductive plugs 57 and the first glue film 56 by the sputter method respectively. For example, the metal laminated film is formed by sequentially stacking a copper-containing aluminum film of about 550 nm thickness, a titanium film of about 5 nm thickness, and a titanium nitride film of about 150 nm thickness.

Then, the metal laminated film and the first glue film 56 are patterned by the photolithography. Thus, a second-layer metal wiring 58 formed of these films is formed on the first cover insulating film 51.

In this patterning, in order not to leave the etching residue on the first cover insulating film 51, the metal laminated film and the first glue film 56 are etched by the overetching. Since the second capacitor protection insulating film 50 is covered with the first cover insulating film 51 in such overetching, such a situation can be prevented that the second capacitor protection insulating film 50 is etched in the patterning to reduce the film thickness. As a result, a thickness of the second capacitor protection insulating film 50 can be maintained sufficiently after the patterning is ended, and the second capacitor protection insulating film 50 can block effectively the reductive substance such as hydrogen, or the like.

Figure 9G:
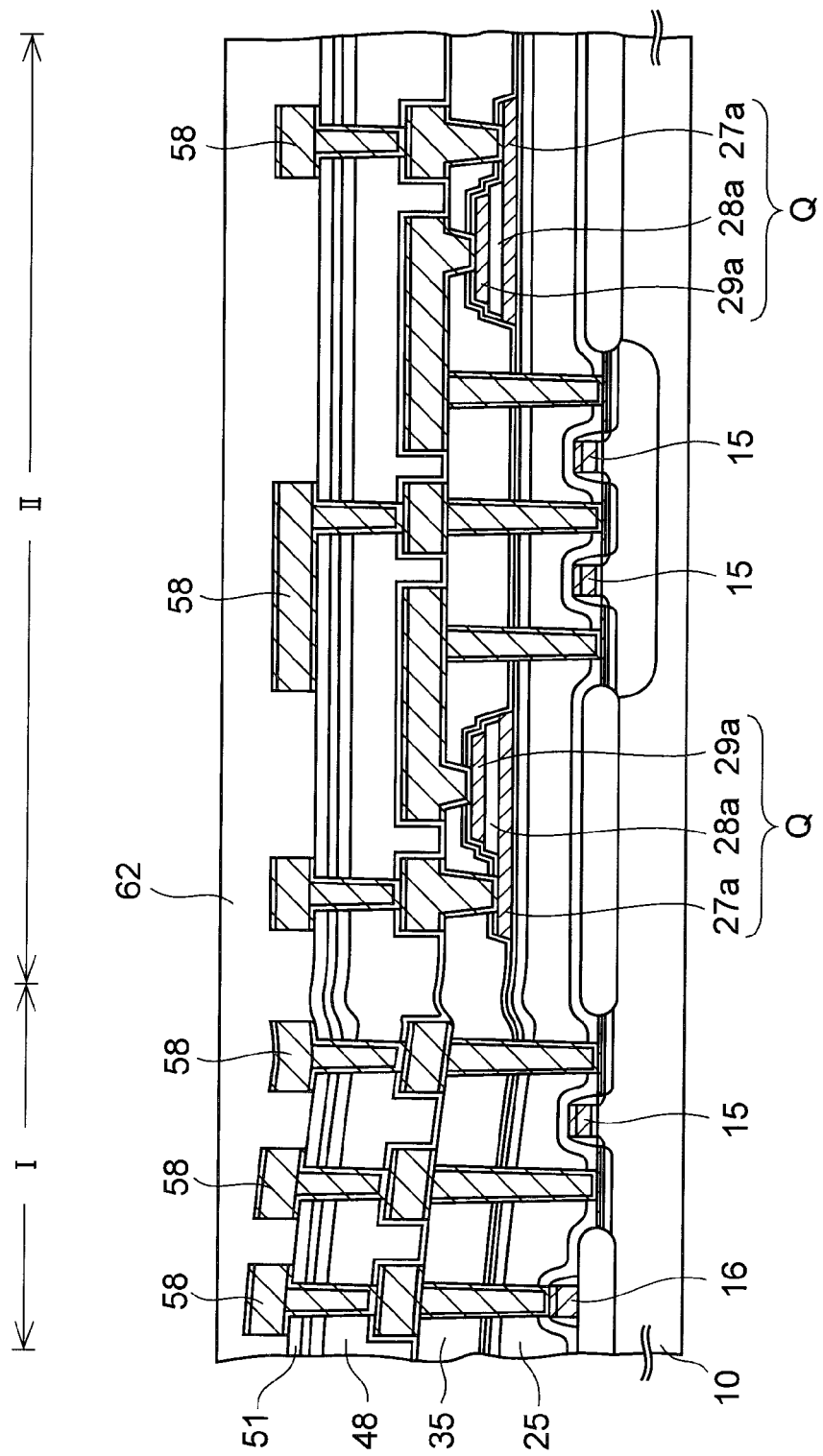

Then, as shown in FIG. 9G, a silicon oxide film of about 2200 nm thickness is formed on the first cover insulating film 51 and the second-layer metal wiring 58 by the plasma CVD method using a mixed gas of the TEOS gas and the oxygen respectively. This silicon oxide film is used as a fourth insulating film 62.

By the way, in order to prevent such an event that the capacitor dielectric film 28a is deteriorated by the moisture, the first to third insulating films 25, 35, 48 are formed under the film forming conditions that a content of moisture in the film is lowered, i.e., a flow rate of oxygen is increased higher than the flow rate necessary for the oxidation of the TEOS gas.

In contrast, because the fourth insulating film 62 is away from the capacitor dielectric film 28a and also the first and second capacitor protection insulating films 46, 50 are formed under the fourth insulating film 62, the capacitor dielectric film 28a is seldom deteriorated by the moisture in the fourth insulating film 62.

Therefore, improvement of a film thickness distribution has higher priority than a reduction in a content of moisture in the fourth insulating film 62, and an oxygen flow rate is reduced rather than the case where the first to third insulating films 25, 35, 48 are formed. For example, in the present embodiment, a flow rate of the oxygen is set to 700 sccm and a flow rate of the TEOS gas is set to 460 sccm. Also, in the film forming conditions, a film forming pressure is set to 9 Torr, a flow rate of the helium gas (a carrier gas for the TEOS) is set to 480 sccm, a substrate temperature is set to 390° C., and a high-frequency power (frequency: 13.56 MHz) for plasmanization is set to 400 W.

According to such conditions, uniformity of the film thickness of the fourth insulating film 62 in the substrate plane becomes about 2.1%. Such uniformity is improved largely rather than uniformity (5.0%) of the film thickness of the first to third insulating films 25, 35, 48, and the fourth insulating film 62 is hardly formed thick in the peripheral area I.

Then, unevenness of the film thickness of the fourth insulating film 62 is further improved by polishing the upper surface of the fourth insulating film 62 by means of the CMP method.

Figure 9H:
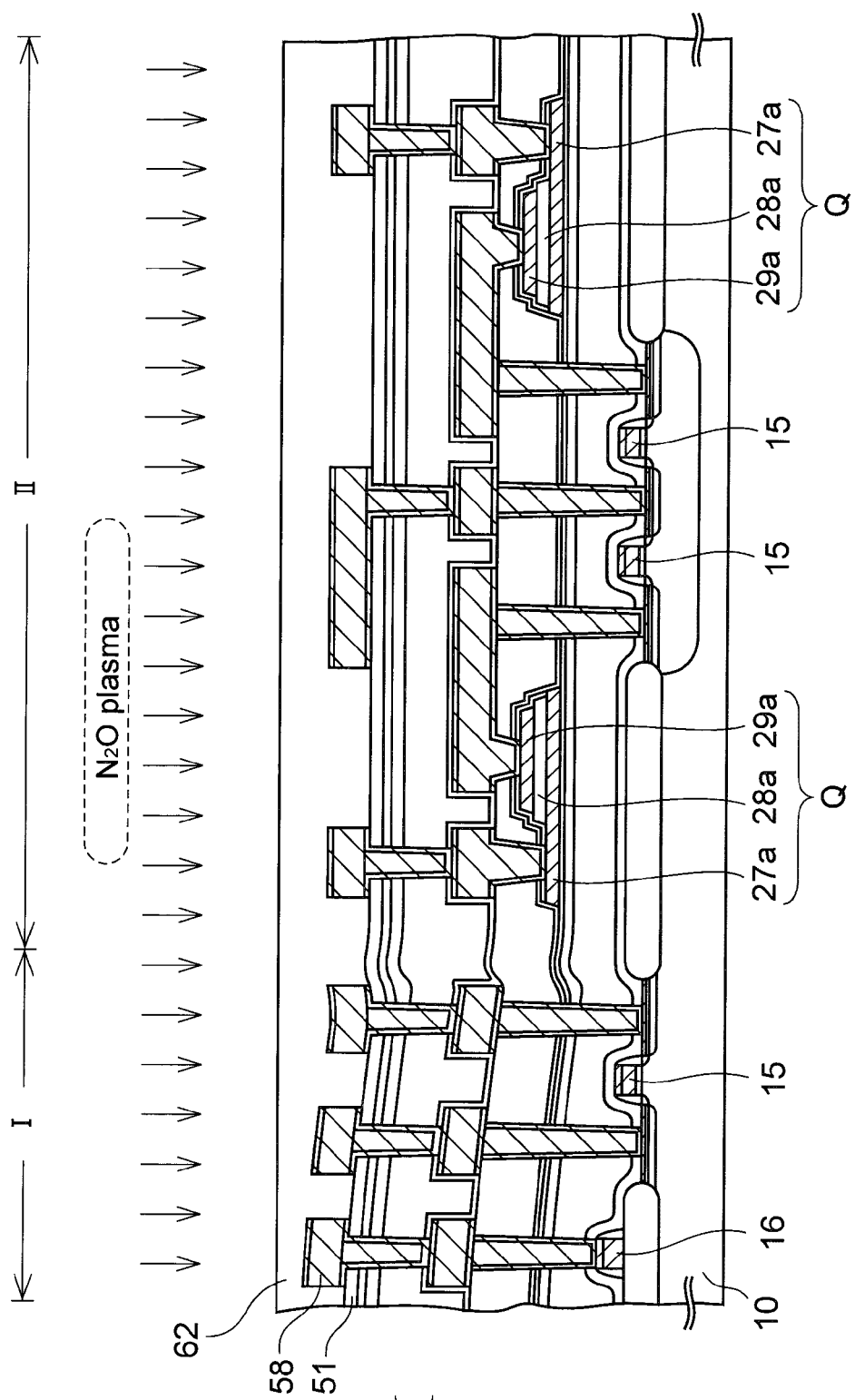

Then, as shown in FIG. 9H, the $N_2O$ plasma process is applied to the fourth insulating film 62 at a substrate temperature of 350° C. for a process time of 4 min. Thus, the fourth insulating film 62 is dehydrated and the surface of the fourth insulating film 62 is nitrided to prevent the re-adsorption of the moisture. The $N_2O$ plasma process is executed by using the CVD equipment, for example.

Figure 9I:
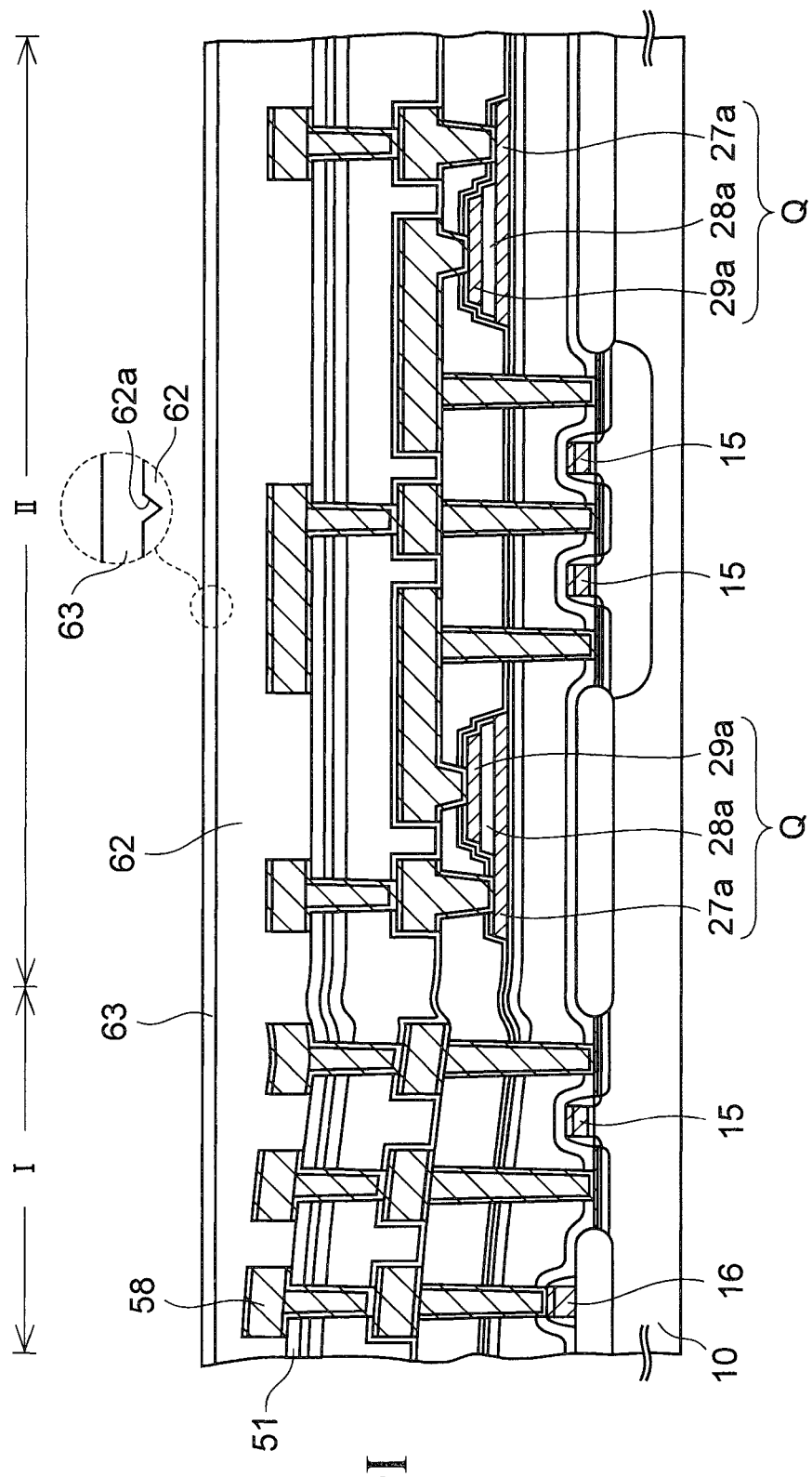

Then, as shown in FIG. 9I, a silicon oxide film of about 100 nm thickness is formed on the fourth insulating film 62 as a cap insulating film 63 by the plasma CVD method using the TEOS gas.

Here, a scratch (microscratch) 62a generated by a contact to the pad of the CMP equipment in the CMP (see FIG. 9G) applied to the fourth insulating film 62 is formed on the upper surface of the fourth insulating film 62. However, the scratch 62a can be buried completely by this cap insulating film 63. As a result, flatness of the upper surface of the cap insulating film 63 can be improved, and a thin film can be formed easily on the cap insulating film 63 with good coverage.

Figure 9J:
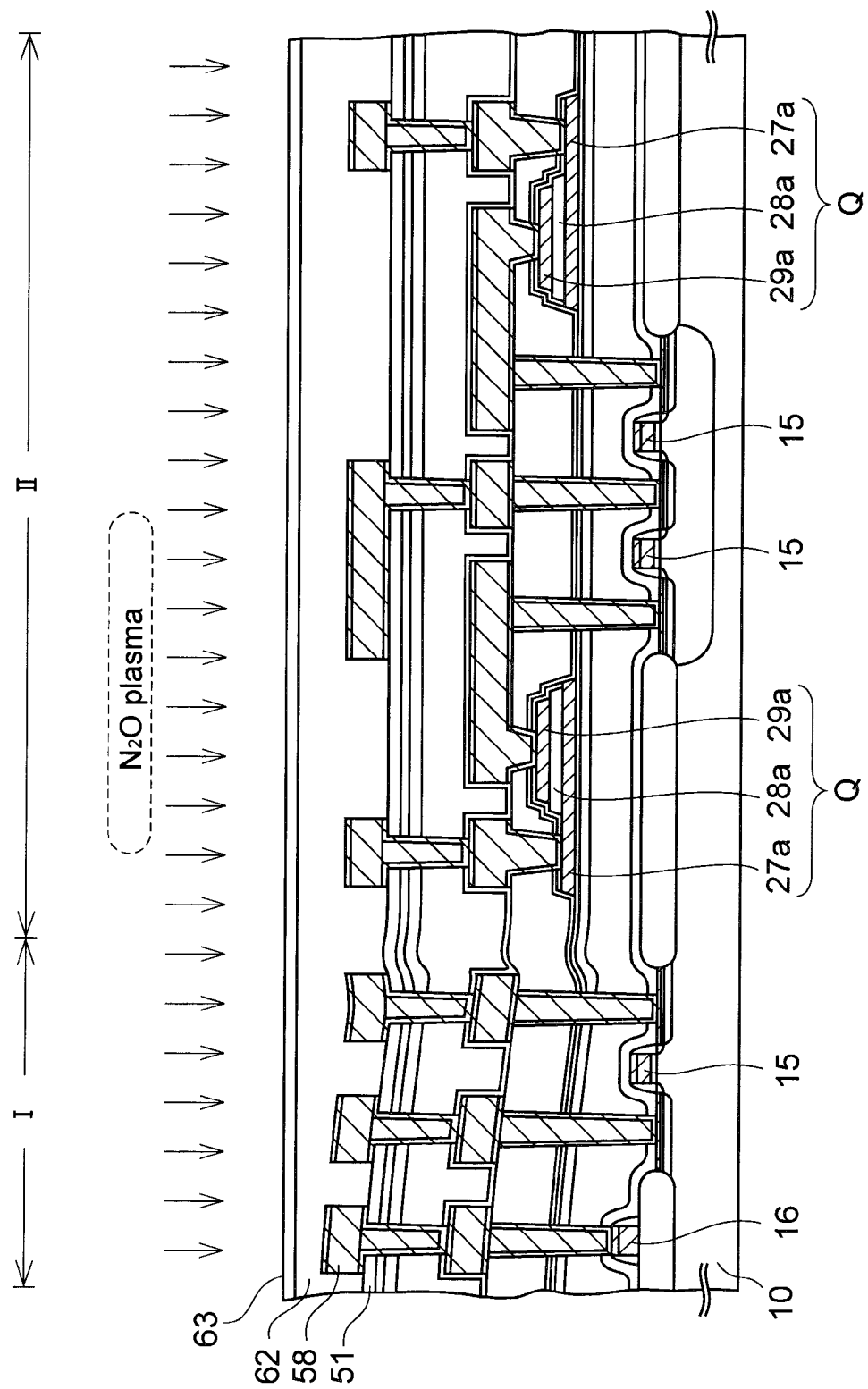

Then, as shown in FIG. 9J, for the purpose of the dehydration process and the moisture absorption preventing process, the $N_2O$ plasma process is applied to the cap insulating film 63. The $N_2O$ plasma process is executed in the CVD equipment, for example, and a substrate temperature of 350° C. and a process time of 2 min are employed as the process conditions.

Figure 9K:
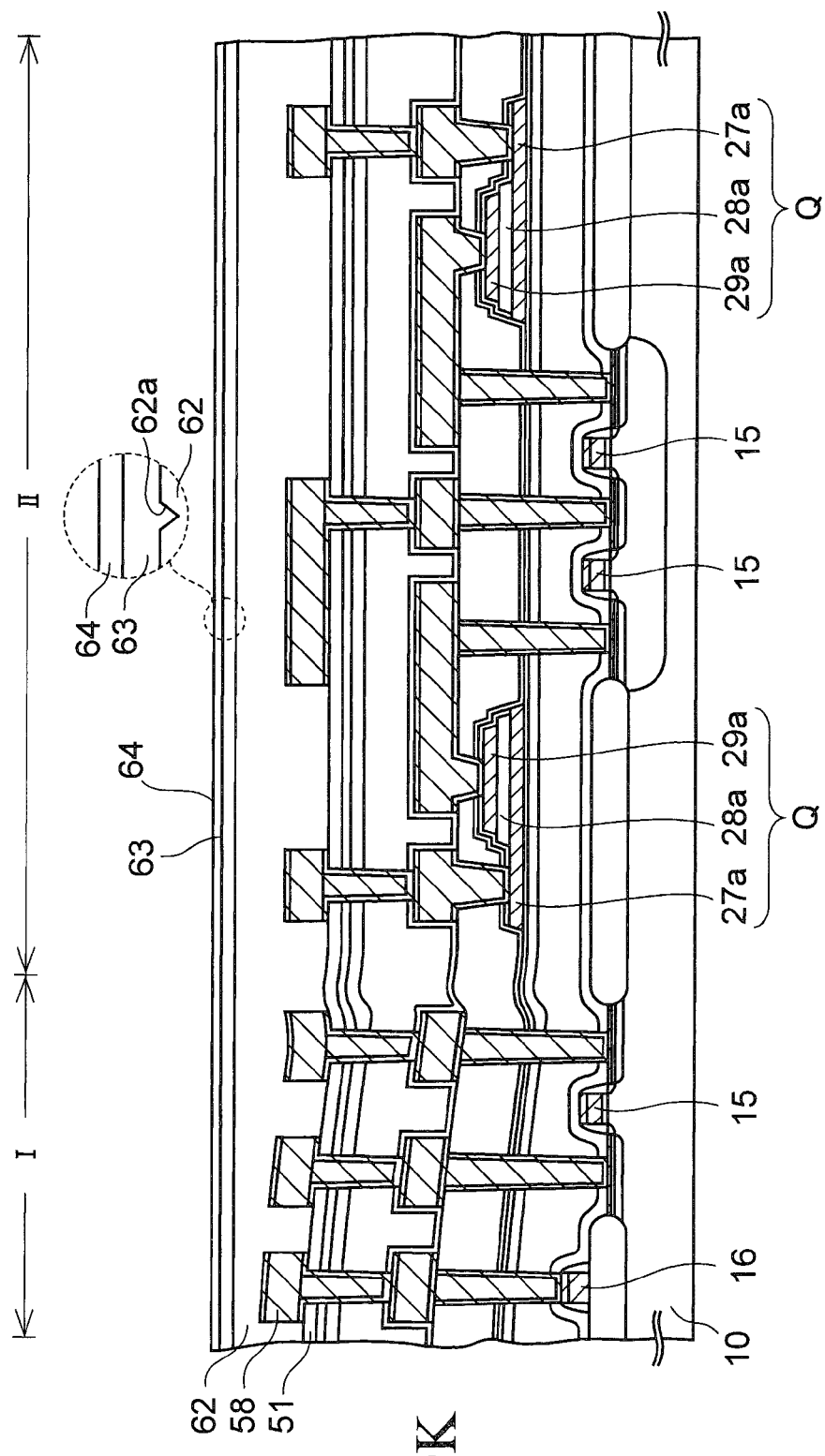

Then, as shown in FIG. 9K, as a third protection insulating film 64 that protects the capacitor dielectric film 28a from the reductive substance, an alumina film of about 50 nm thickness is formed on the cap insulating film 63 by the sputter method.

As already described, the scratch 62a is buried by the cap insulating film 63, and thus the film thickness of the third protection insulating film 64 is made uniform over the whole surface of the silicon substrate 10. Therefore, all portions of the third protection insulating film 64 can block the reductive substance.

In this case, the third protection insulating film 64 is not limited to the alumina film. Like the first and second protection insulating films 46, 50, the third protection insulating film 64 can be formed of a single layer film or a laminated film of an alumina film, a titanium oxide film, a silicon nitride film, and a silicon oxide nitride film.

Figure 9L:
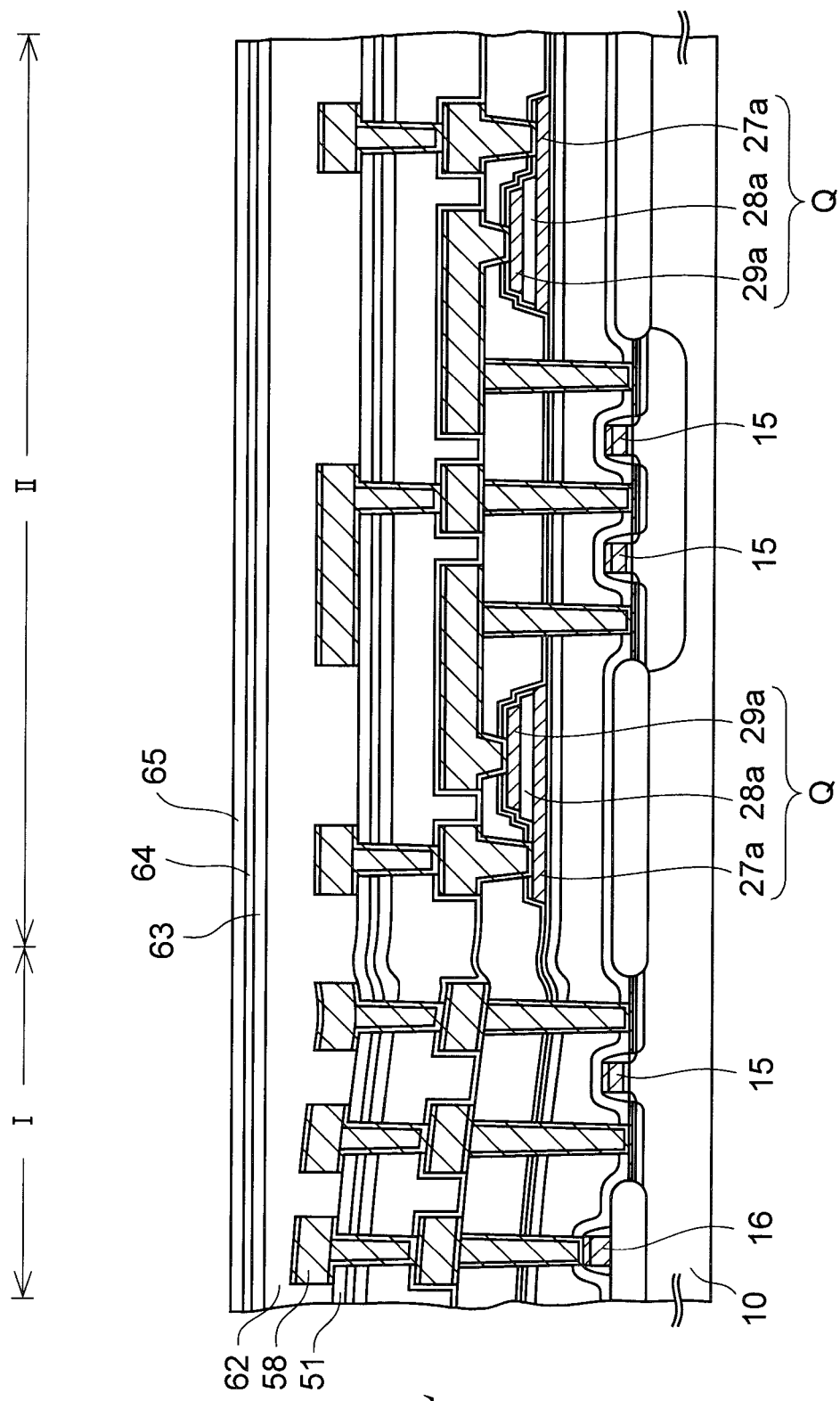

Then, as shown in FIG. 9L, a silicon oxide film of about 100 nm thickness is formed on the third protection insulating film 64 by the plasma CVD method using the TEOS gas. This silicon oxide film constitutes a second cover insulating film 65.

Figure 9M:
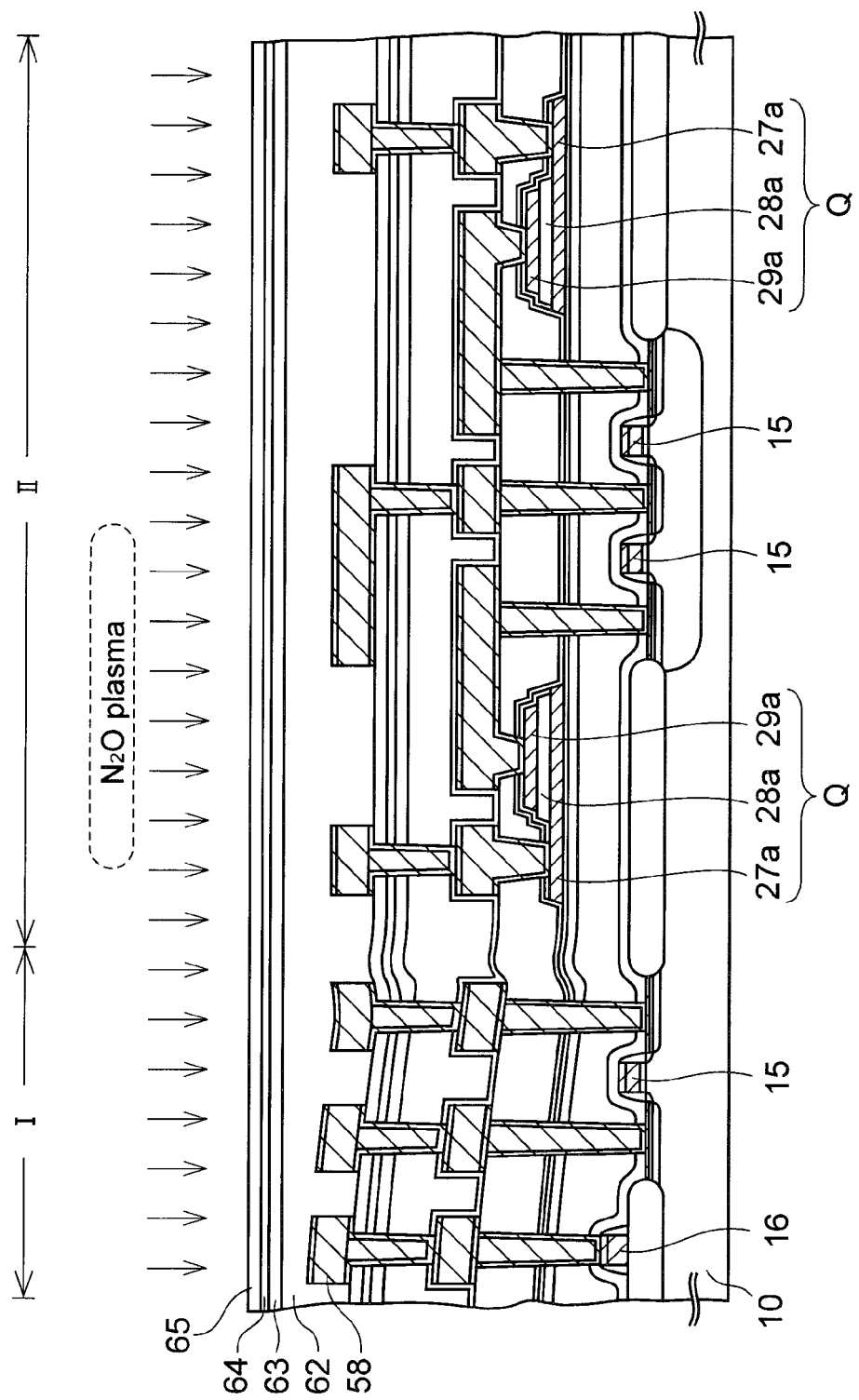

Then, as shown in FIG. 9M, the $N_2O$ plasma process is applied to the second cover insulating film 65 at a substrate temperature of 350° C. for a process time of 2 min. Thus, the second cover insulating film 65 is dehydrated and the surface of the second cover insulating film 65 is nitrided to prevent the re-adsorption of the moisture. The $N_2O$ plasma process is executed by using the CVD equipment, for example.

Figure 9N:
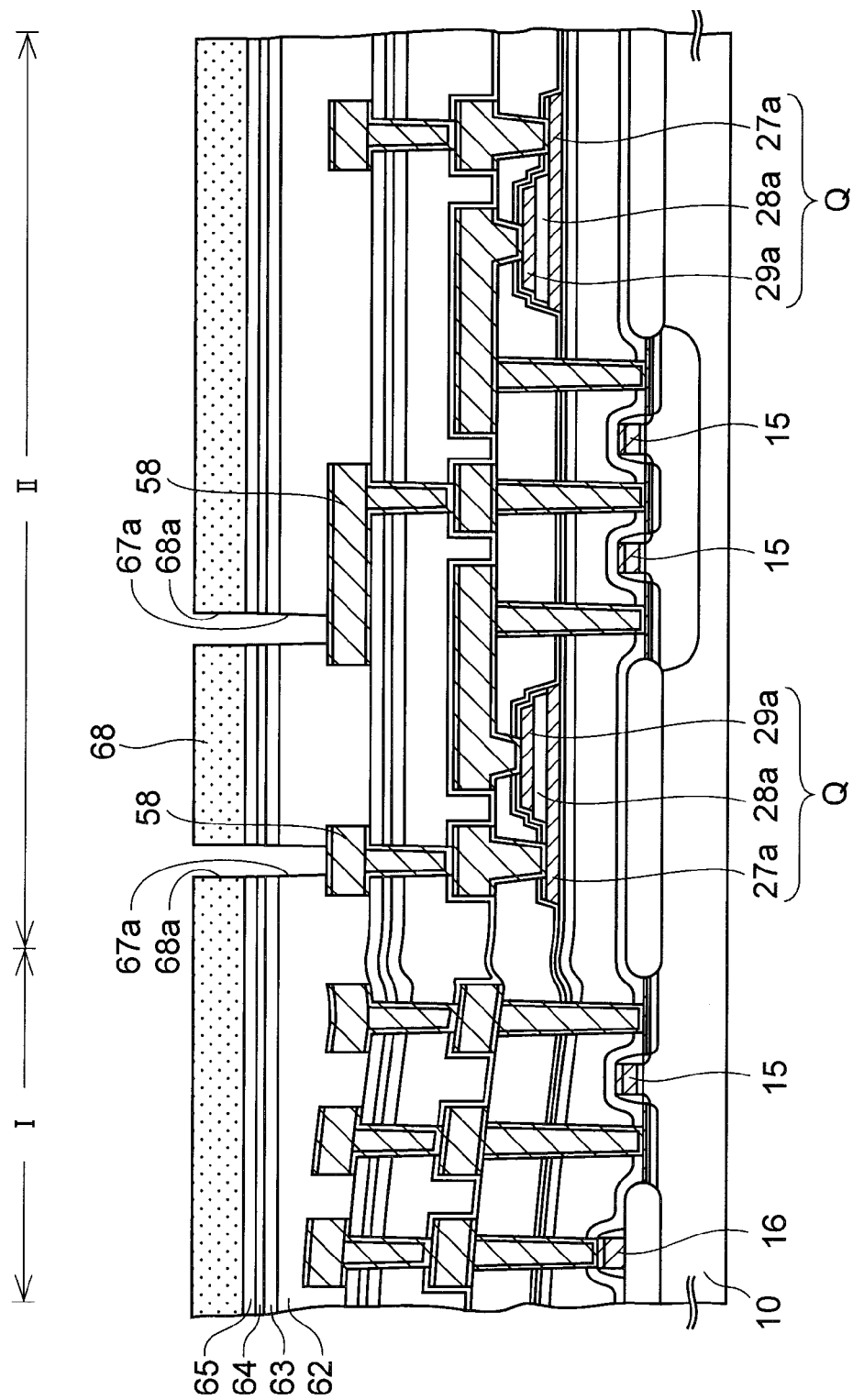
Figure 90:
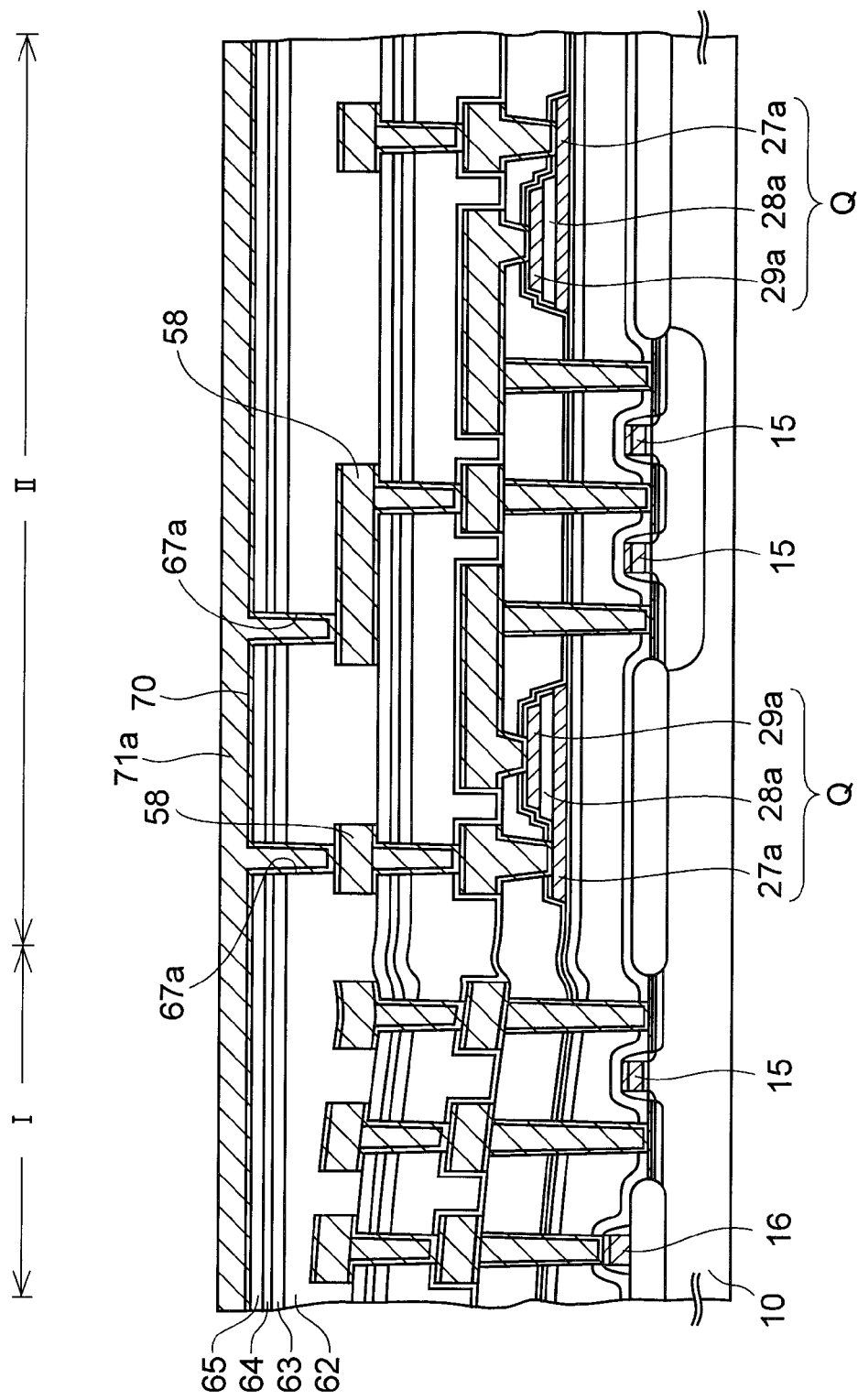

Then, steps required until a sectional structure shown in FIG. 9N is obtained will be explained hereunder.

First, the photoresist is coated on the second cover insulating film 65 and then exposed/developed. Thus, a seventh resist pattern 68 having hole-like eighth windows 68a on the second-layer metal wirings 58 is formed.

Then, respective insulating films 62 to 65 are etched in the parallel-plate type plasma etching chamber, while using the seventh resist pattern 68 as a mask. Thus, fourth holes 67a are formed in these insulating films on the second-layer metal wirings 58. In this etching, for example, a mixed gas of $C_4F_8$, Ar, and $O_2$ is used as an etching gas.

After this etching is ended, the seventh resist pattern 68 is removed.

Then, as shown in FIG. 9O, a titanium nitride film of about 50 nm thickness is formed as a second glue film 70 on inner surfaces of the fourth holes 67a and an upper surface of the second cover insulating film 65 by the sputter method at a substrate temperature of about 200° C. A tungsten film 71a is formed on the second glue film 70 by the CVD method to bury completely the fourth holes 67a. The tungsten film 71a is formed to have a thickness of about 650 nm at a substrate temperature of about 430° C., for example.

Figure 9P:
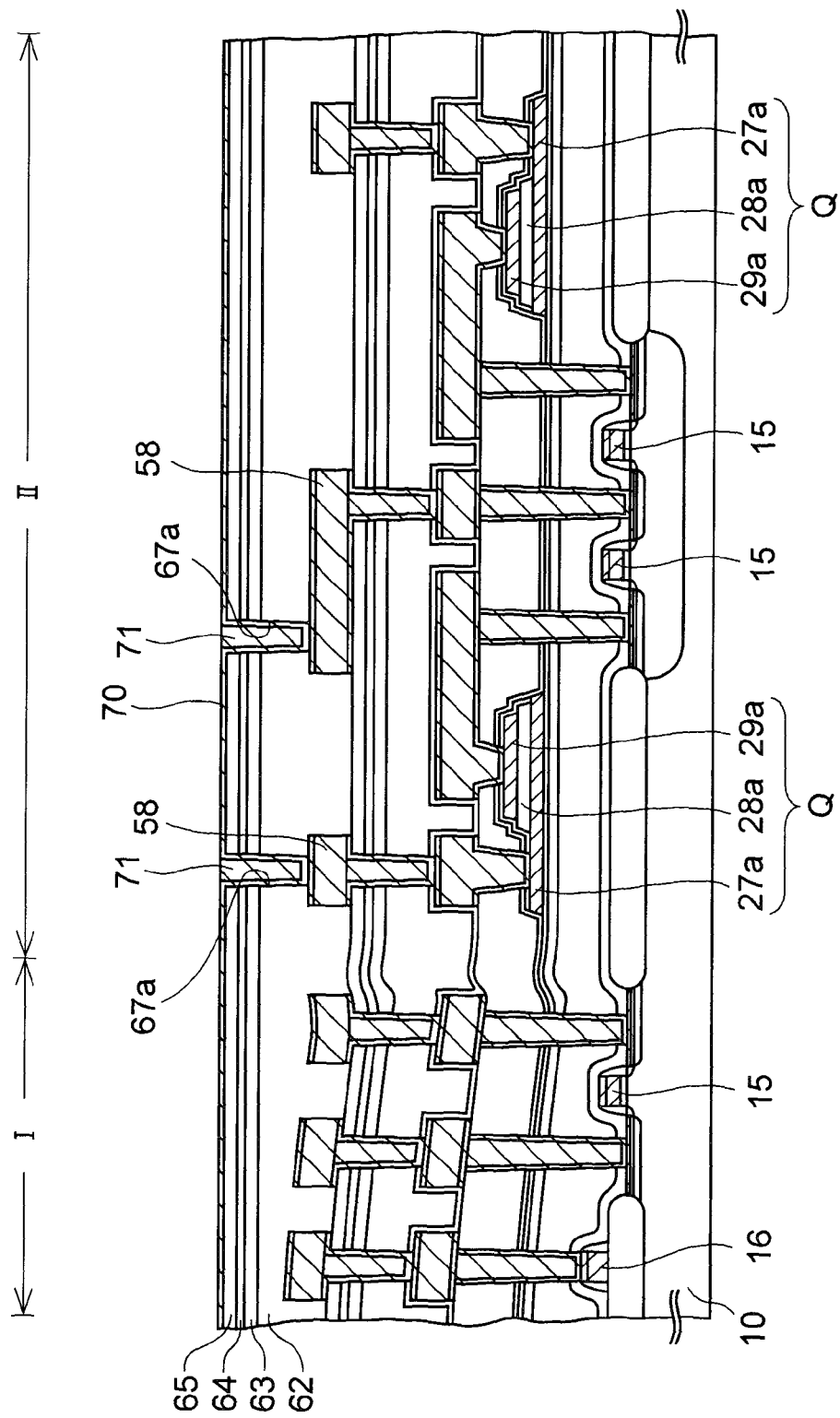

Then, as shown in FIG. 9P, the extra tungsten film 71a on the second cover insulating film 65 is removed by the etching-back, and the tungsten film 71a is left in the fourth holes 67a as sixth conductive plugs 71. In this case, The tungsten film 71a may be removed by the CMP method instead of the etching-back.

Figure 9Q:
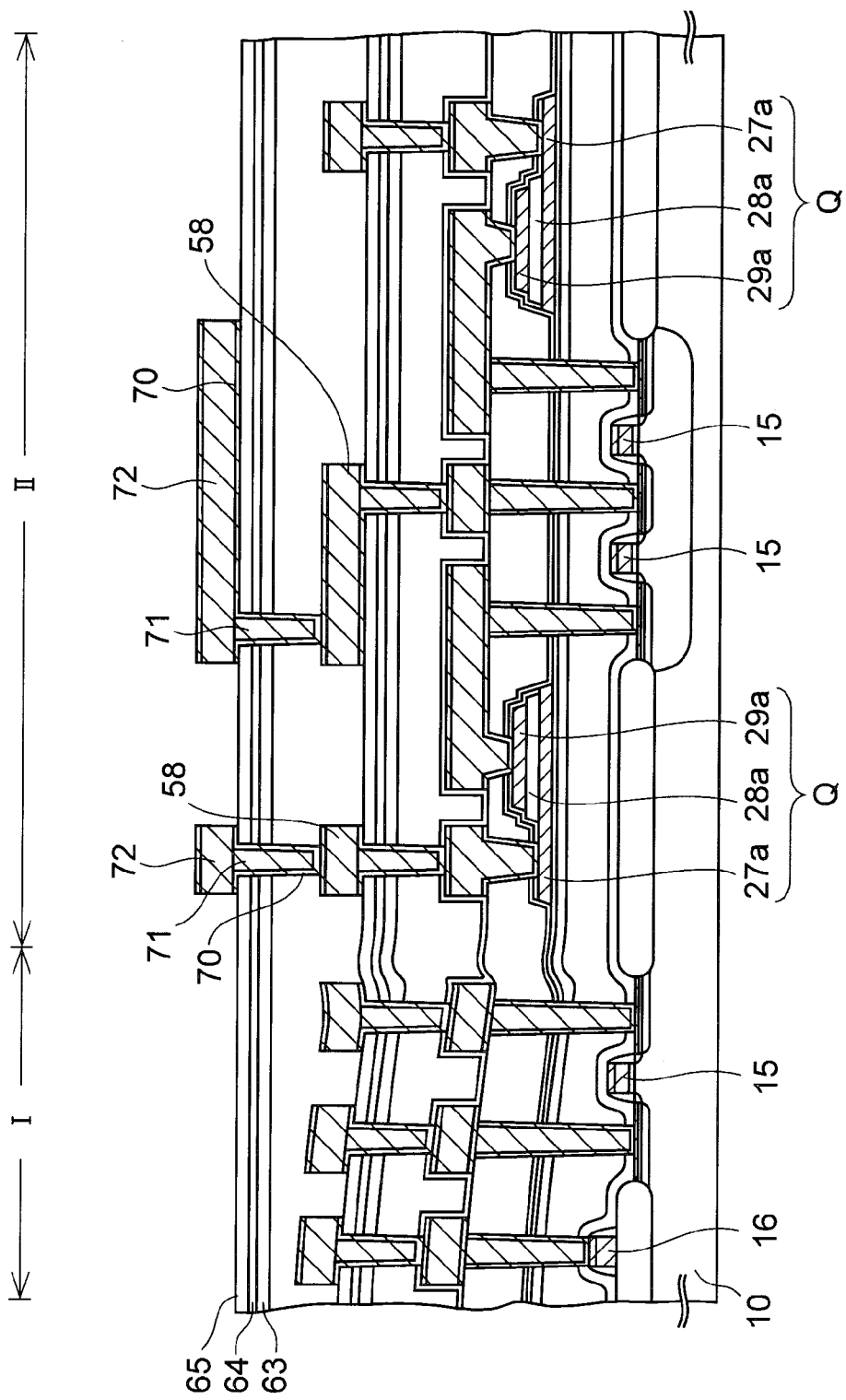

Then, steps required until a sectional structure shown in FIG. 9Q is obtained will be explained hereunder.

First, a copper-containing aluminum film of about 500 nm thickness and a titanium nitride film of about 150 nm thickness are formed on upper surfaces of the second glue film 70 and the sixth conductive plugs 71 in this order from the bottom by the sputter method respectively. Then, third-layer metal wirings 72 are formed on the second cover insulating film 65 by patterning this metal laminated film and the underlying second glue film 70 by means of photolithography.

Here, for the same reason explained by reference to FIG. 9F, a thickness reduction of the third protection insulating film 64 caused by the patterning of the third-layer metal wirings 72 can be prevented by the second cover insulating film 65, and a capability of the third protection insulating film 64 for blocking the reductive substance can be maintained satisfactorily.

Then, as shown in FIG. 9R, a silicon oxide film of about 100 nm thickness is formed as a first passivation film 75 on the second cover insulating film 65 and the third-layer metal wirings 72 by the CVD method.

In this case, for the purpose of the dehydration process and the moisture absorption preventing process, the $N_2O$ plasma process may be applied to the first passivation film 75. The $N_2O$ plasma process is executed in the CVD equipment, for example, and a substrate temperature of 350° C. and a process time of 2 min are employed as the process conditions.

Then, a silicon nitride film of about 350 nm thickness is formed as a second passivation film 76 on the first passivation film 75 by the CVD method.

Then, openings for exposing bonding pads (not shown) formed on the same layer as the third-layer metal wirings 72 are formed by patterning the first and second passivation films 75, 76.

Then, photosensitive polyimide of about 3 μm thickness is formed on the overall upper surface of the silicon substrate 10, so that a protection layer 77 made of a polyimide coating film is formed. Then, windows (not shown), from which the bonding pads exposes, are formed in the protection layer 77 by exposing/developing the protection layer 77. Then, the protection layer 77 is thermally cured at a substrate temperature of 310° C. and at an $N_2$ flow rate of 100 liter/min for a process time of 40 min, whereby a basic structure of the semiconductor wafer structure is completed.

Figure 12:
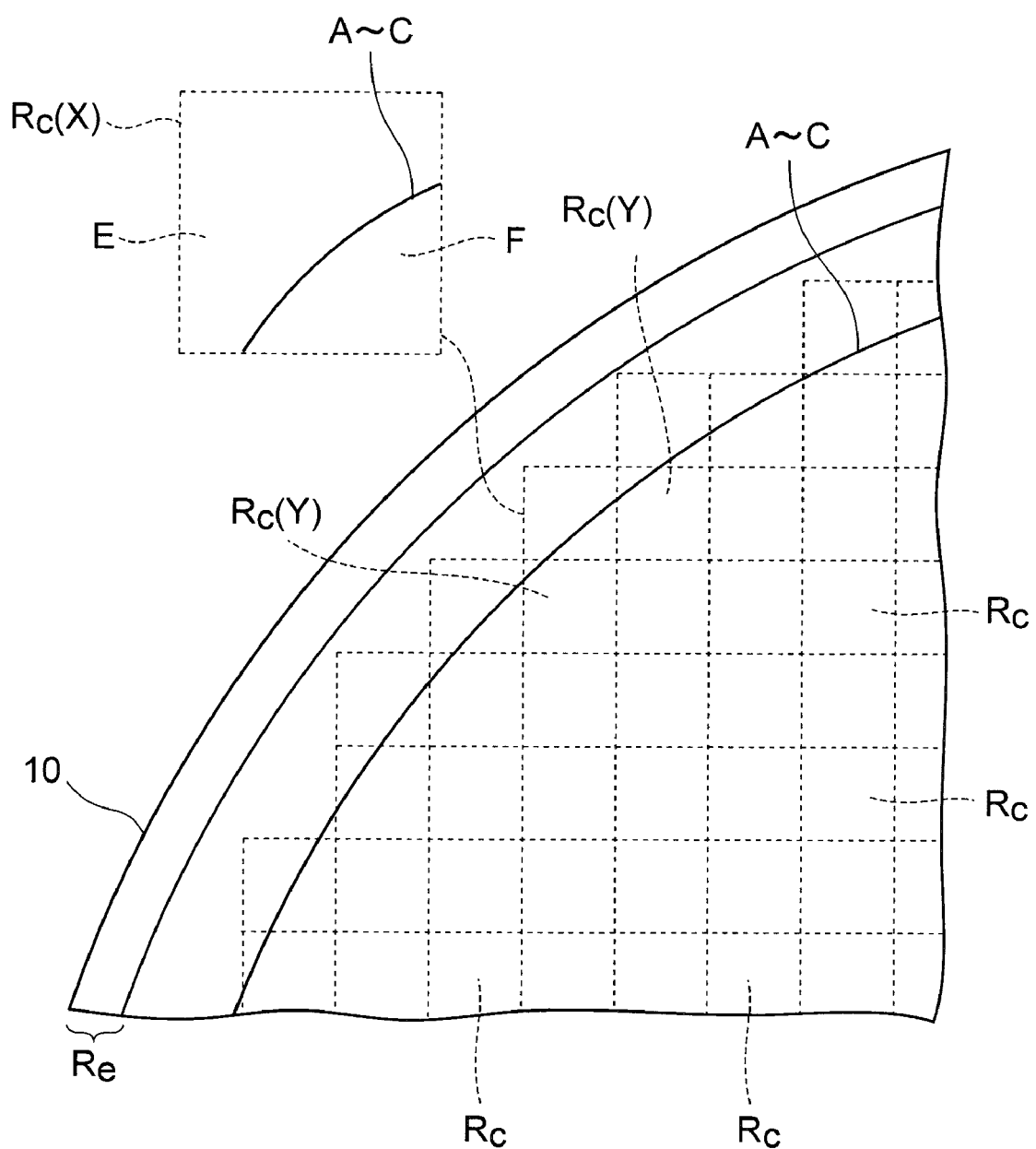
FIG. 12 is an enlarged plan view of a semiconductor wafer structure according to the first embodiment.

FIG. 12 is an enlarged plan view of this semiconductor wafer structure.

As shown in FIG. 12, a very small chip areas $R_c$ whose one side is 1 mm or less in length are defined on the silicon substrate 10. Then, the dicing is applied to the silicon substrate along the scribe area between respective chip areas $R_c$ in the later step. Thus, small FeRAMs useful to the security product such as the IC tag, the small memory, or the like are cut out as the semiconductor device.

According to the present embodiment explained as above, the thick portion 25x of the first insulating film 25 in the peripheral area I is thinned selectively in the step in FIG. 8B. Therefore, when forming the third and fourth contact holes 38c, 38d in the peripheral area I in the step of FIG. 8M, the third and fourth contact holes 38c, 38d pass through the first insulating film 24 and the etching stopper film 24 and reach the third source/drain region 19c and the wiring 16.

As a result, when the third and fourth conductive plugs 40c, 40d are formed in these contact holes 38c, 38d in the step of FIG. 8N, respective conductive plugs 40c, 40d are connected satisfactorily to the third source/drain region 19c and the wiring 16.

Accordingly, the contact resistance of respective conductive plugs 40c, 40d can be stabilized at a low value, the contact failure of these conductive plugs can be prevented, and yield of the semiconductor devices can be improved.

Furthermore, the thick portion 35x of the second insulating film 35 is thinned (FIG. 8J). Therefore, it can be prevented effectively that the contact holes 38c, 38d are not opened, and the contact failure of these conductive plugs 40c, 40d can be prevented more easily.

Also, the thick portion 48x of the third insulating film 48 on the first-layer metal wiring 45 is thinned (FIG. 8T). Therefore, the third holes 54a (FIG. 9E) on the first-layer metal wiring 45 can be opened completely by the etching. As a result, the first-layer metal wiring 45 and the fifth conductive plugs 57 can be connected without fail, and the contact failure of the fifth conductive plugs 57 can be prevented.

By the way, in the present embodiment, as shown in FIG. 12, a plurality of very small chip areas $R_c$ are defined on the silicon substrate 10. Out of them, an outermost peripheral chip area $R_c(x)$ is divided into two areas E, F by the stepped portions A to C.

In this specification, the "outermost peripheral chip area $R_c(x)$" means such a chip area that a neighboring chip region $R_c$ is absent in at least one side of its four sides. Also, the semiconductor wafer structure on which a small chip areas are defined as described above is characterized in that both the outermost peripheral chip area $R_c(X)$ and at least one of its neighboring chip areas $R_c(Y)$ overlap with the stepped portions A to C.

Here, when the chip size is small, such a possibility is increased that the stepped portions A to C cut across the center portion of the chip area $R_c(X)$, so that the size of the area E and F become close. As a consequence, such a possibility is increased that the contact holes 38c, 38d are formed in the outer side area E of two areas E and F.

When the present embodiment is not employed, the contact failure is caused easily in the area E because the film thicknesses of the first to third insulating films 25, 35, 48 in the area E are thicker than those in the area F.

In contrast, in the present embodiment, the film thicknesses of the first to third insulating films 25, 35, 48 in the area E are thinned. As a result, even when the chip size is small, the contact holes 38c, 38d are opened completely in the area E, and hence it can be prevented that the semiconductor devices being cut out from the outermost chip area $R_c(X)$ become the defective product due to the contact failure.

However, it should be noted that the present embodiment is not limited to the semiconductor device whose chip size is small.

Figure 13:
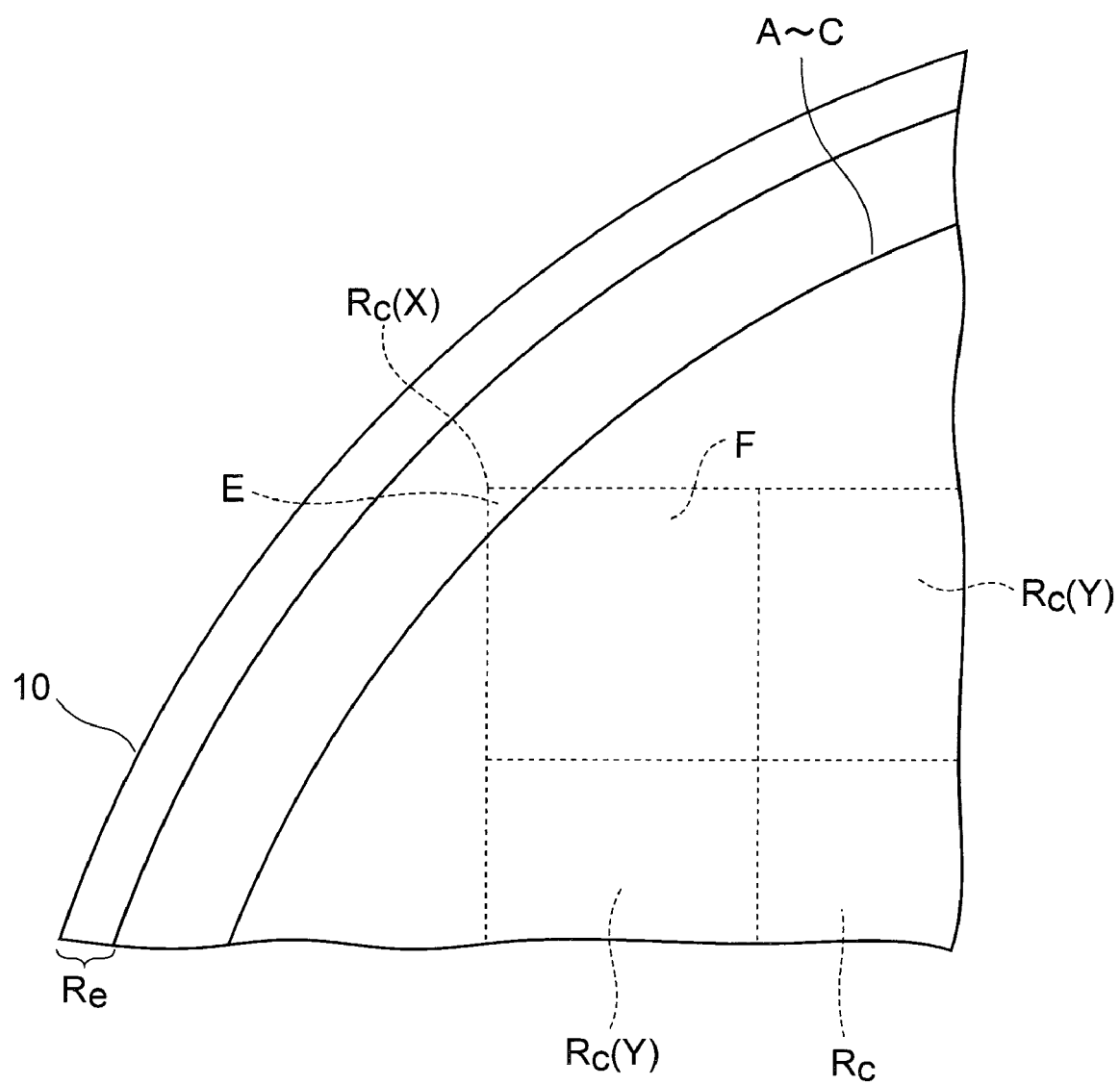
FIG. 13 is an enlarged plan view of a semiconductor wafer structure in which chips areas larger than the case in FIG. 12 are defined.

FIG. 13 is an enlarged plan view of a semiconductor wafer structure in which chips areas $R_c$ larger than the above case are defined. The semiconductor wafer structure in which the chip size is large in this manner is characterized in that all chip areas $R_c(Y)$ adjacent to the outermost chip areas $R_c(X)$ do not overlap with the stepped portions A to C.

When the chip area $R_c$ is large in this manner, the stepped portions A to C cut across the neighborhood of a corner of the outermost chip area $R_c(X)$. Therefore, a size of the area E becomes small, and the possibility that the contact holes 38c, 38d are formed in the area E is lowered. However, such possibility cannot be perfectly eliminated. Therefore, by applying the present embodiment, the contact failure can be prevented in the semiconductor wafer structure whose chip area $R_c$ is large.

In the above first embodiment, when etching the thick portions 25x, 35x, 48x of the first to third insulating films 25, 35, 48, the first, second, fifth resist patterns 23, 36, 47 are used as a mask.

In the present embodiment, a method of forming such resist patterns 23, 36, 47 will be explained hereunder.

The resist patterns 23, 36, 47 can be formed by exposing the photoresist by using the reduced projection exposure equipment such as the stepper, the scanner, or the like. However, production cost of the semiconductor device is increased if such an exposure system is employed. A cost down can be achieved by using following simple methods like first to third examples.

In the following, the method of forming the first resist pattern 23 will be explained on behalf of these resist patterns. Note that remaining second and fifth resist patterns 36, 47 can also be formed according to the following methods.

First Example

Figure 14:
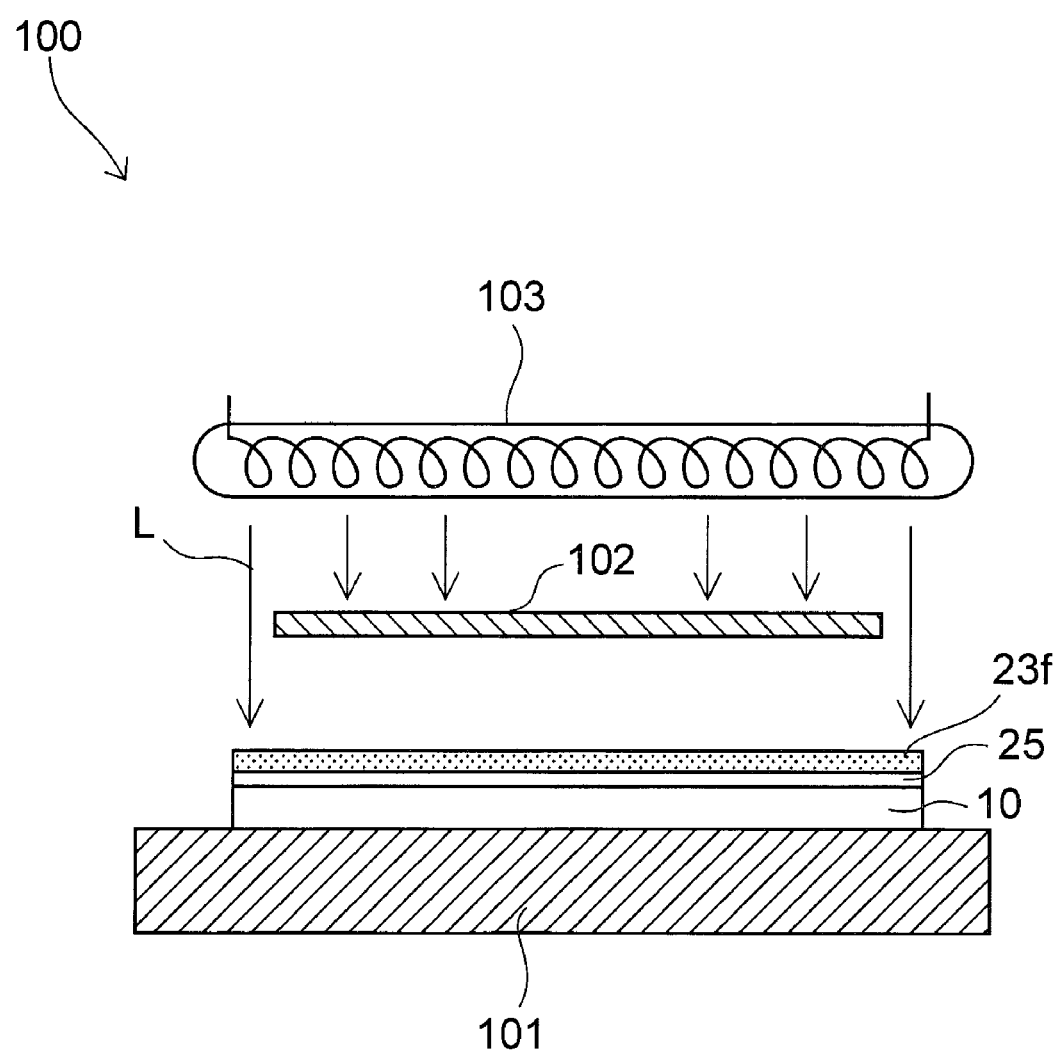
FIG. 14 is a configuration diagram of an exposure equipment used in a first example of a second embodiment.

FIG. 14 is a configurative diagram of an exposure equipment 100 used in this example.

The exposure equipment 100 has a stage 101 on which the silicon substrate 10 is loaded, and a light source 103 for emitting an exposure light L having a wavelength by which a photoresist 23f is exposed. Also, a circular shielding plate 102 whose planar size is smaller than the silicon substrate 10 is arranged between the light source 103 and the stage 101.

In such exposure equipment 100, the photoresist 23f just under the shielding plate 102 is not exposed, but only the photoresist 23f in the peripheral area II can be exposed selectively by the exposure light L that overflows the shielding plate 102.

In this example, a positive photoresist is employed as the photoresist 23f. Then, the first resist pattern 23 is formed by exposing the photoresist 23f by means of the exposure equipment 100 and developing it.

Second Example

Figure 15:
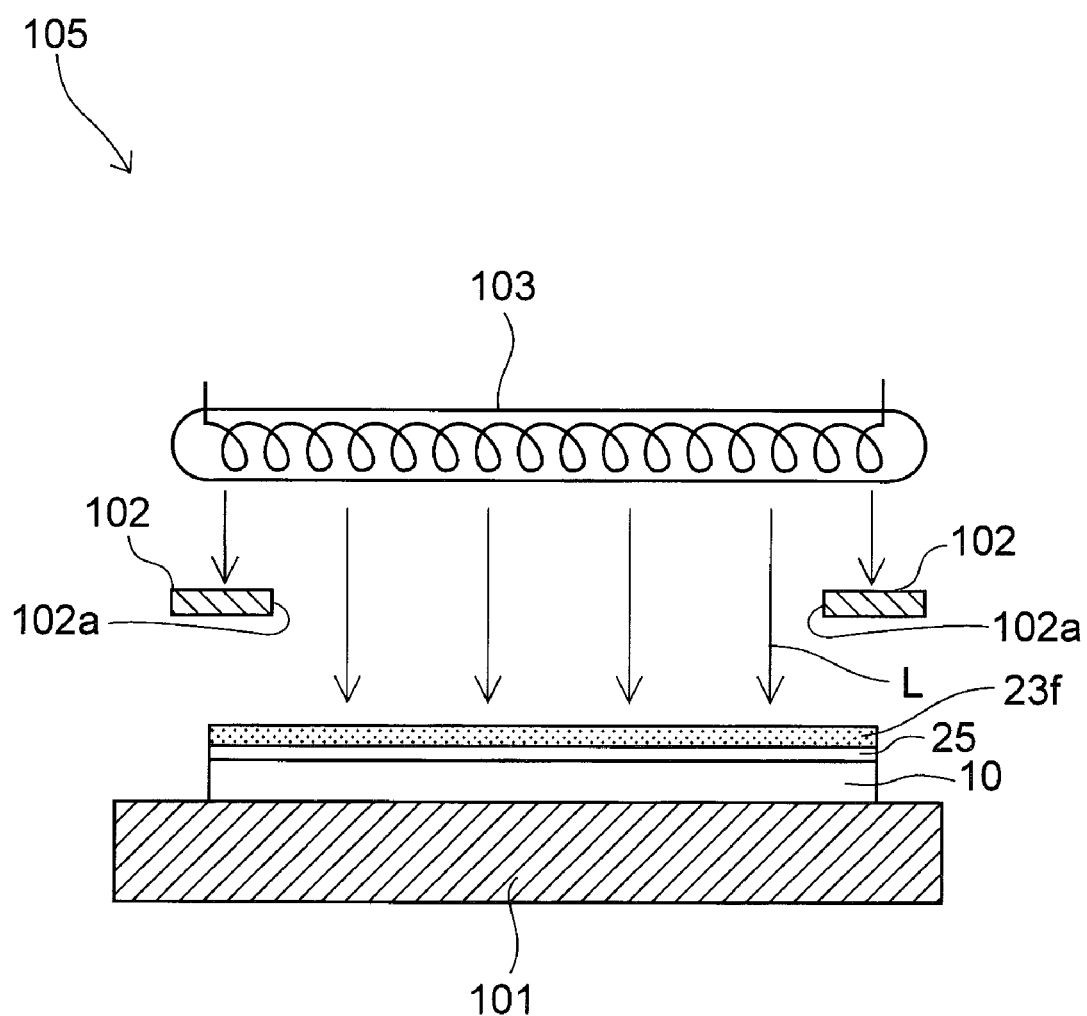
FIG. 15 is a configuration diagram of an exposure equipment used in a second example of the second embodiment.

FIG. 15 is a configuration diagram of an exposure equipment 105 used in this example.

This exposure equipment 105 differs from the exposure equipment 100 of the first example in that a diameter of the shielding plate 102 is more than a diameter of the silicon substrate 10, a circular opening portion 102a is provided in the center of the shielding plate 102 to constitute a concentric circle with the silicon substrate 10, and the exposure light is passed selectively through the opening portion 102a.

When such exposure equipment 105 is used, only the photoresist 23f just under the opening portion 102a in the center area II can be exposed selectively while preventing such an event that the photoresist 23f in the peripheral area I is exposed.

In this example, a negative photoresist is employed as the photoresist 23f. The foregoing first resist pattern 23 is formed by exposing the photoresist 23f by means of the exposure equipment 100 and developing it.

Third Example

Figure 16:
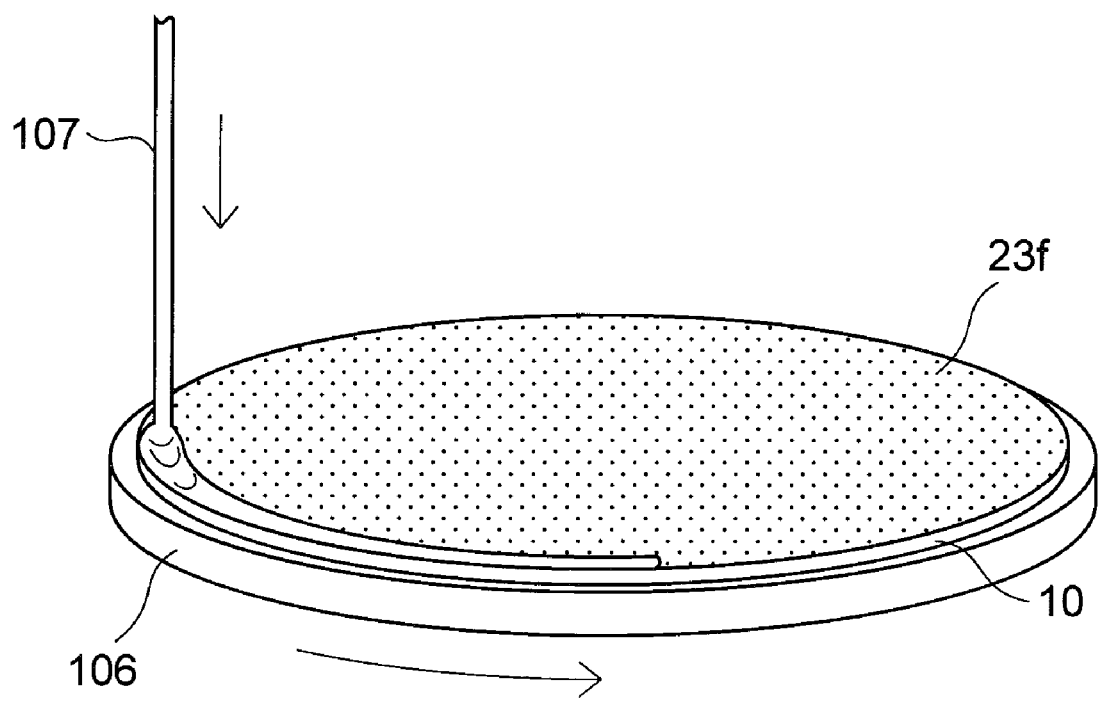
FIG. 16 is a perspective view showing a method of forming a resist pattern in a third example of the second embodiment.

FIG. 16 is a perspective view showing a method of forming a resist pattern in this example.

In this example, the silicon substrate 10 is loaded on a spinner 106 and then an organic solvent 107 is dropped on the photoresist 23f in the peripheral area while turning the silicon substrate 10. The organic solvent 107 is not particularly limited. In the present embodiment, the solvent such as ZS-50 manufactured by Nippon Zeon Co., Ltd., VFR thinner manufactured by Tokyo Ohka Kogyo Co., Ltd., butyl acetate, or the like may be used.

According to such a process, the photoresist 23f in the peripheral area is removed selectively, and the first resist pattern 23 can be obtained.

Since the reduced projection exposure equipment is not used in the first to third examples, the first, second, fifth resist patterns 23, 36, 47 can be formed while suppressing a production cost.

In the first embodiment, the CMP is applied to the first insulating film 25 (FIG. 1C), and then the thick portion 25x of the first insulating film 25 is thinned (FIG. 8B).

The order of these two steps is not particularly limited. These steps may be executed in reverse order as follows.

FIGS. 17A and 17B are sectional views of a semiconductor device according to a third embodiment in course of manufacture.

In the present embodiment, as shown in FIG. 17A, the foregoing first resist pattern 23 is formed on the first insulating film 25 before the CMP is applied. The thick portion 25x, which is thicker than the reference film thickness $\Delta T_1$ as an upper limit of the film thickness not to cause the contact failure, of the first insulating film 25 is not covered with the first resist pattern 23 and exposed.

Then, the first insulating film 25 that is not covered with the first resist pattern 23 is etched by a thickness of 20 to 150 nm, while using the first resist pattern 23 as a mask. Thus, the thick portion 25x is thinned selectively.

This etching is executed by either of the dry etching, the sputter etching, and the wet etching. The same conditions as those in the first embodiment are employed as the etching conditions for these etching.

After this, the first resist pattern 23 is removed.

Next, as shown in FIG. 17B, the upper surface of the first insulating film 25 is polished by the CMP. Thus, the in-plane uniformity of the film thickness of the first insulating film 25 is improved further.

Then, a basic structure of the semiconductor device shown in FIG. 9R is completed by performing the same steps as those in FIGS. 8C to 9R explained in the first embodiment.

In this manner, even when the step order of the thinning step of the thick portion 25x (FIG. 17A) and the CMP step applied to the first insulating film 25 (FIG. 17B) is reversed from the first embodiment, the contact failure of the third and fourth conductive plugs 40c, 40d can be prevented, as in the first embodiment.

Further, since the CMP step (FIG. 17B) is executed after the thinning step of the thick portion 25x (FIG. 17A), the stepped portion A formed on the first insulating film 25 at the time of thinning the thick portion 25x can be chamfered by the CMP step, so that the chamfering step in FIG. 8C can be omitted.

In the first embodiment, in order to prevent such a situation that the capacitor dielectric film 26a of the FeRAM is reduced by the moisture, the first to third insulating films 25, 35, 48 are formed under the conditions that reduce a content of moisture in these films. Hence, these insulating films 25, 35, 48 are formed thick in the peripheral area I.

In contrast, in the case of the semiconductor device such as a logic device in which there is no need to take care of a content of moisture in the film in contrast to the FeRAM, or the FeRAM in which a content of moisture does not become an issue, the insulating films 25, 35, 48 are formed under the film forming conditions different from those in the first embodiment in some cases. As a result, unlike the first embodiment, tendency of a film thickness distribution of these insulating films 25, 35, 48 becomes thicker in the center area I than in the peripheral area II in some cases. In the present embodiment, a method of manufacturing the semiconductor device capable of preventing the contact failure of the conductive plugs in such case will be explained hereunder.

Figure 18A:
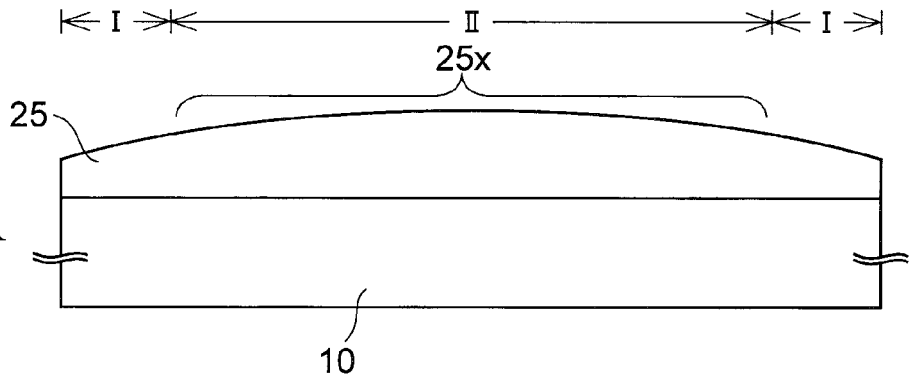
FIGS. 18A to 18C are sectional views of a semiconductor device according to a fourth embodiment in course of manufacture.
Figure 18B:
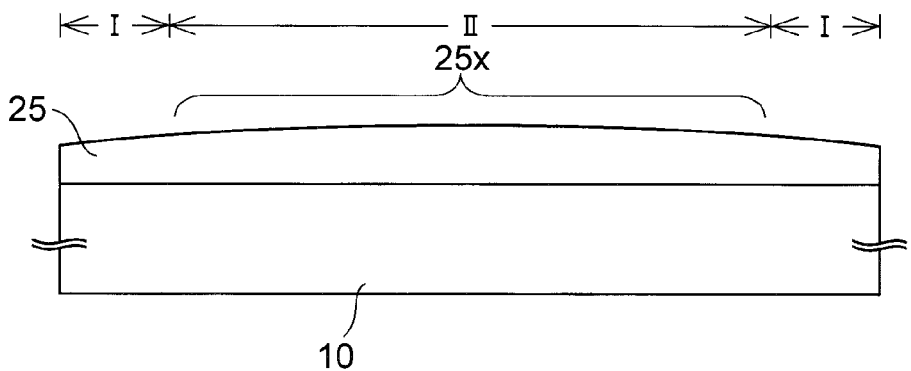
Figure 18C:
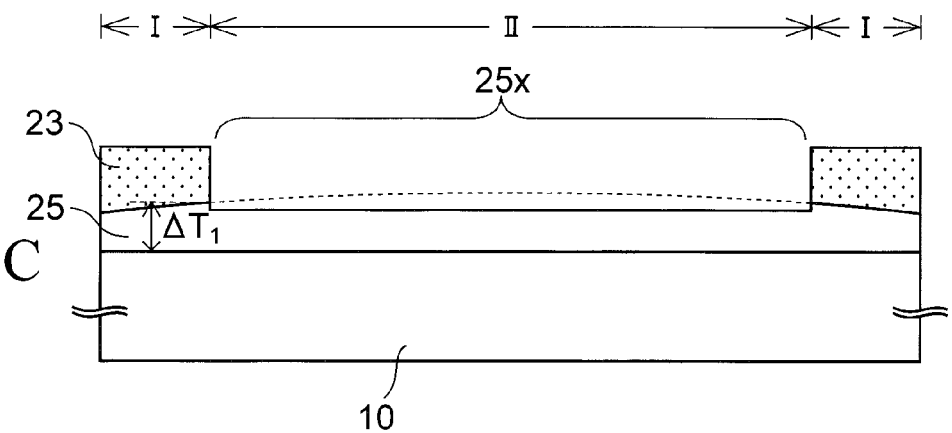

FIGS. 18A to 18C are sectional views of a semiconductor device according to a fourth embodiment in course of manufacture. In these figures, film thicknesses of the first insulating film 25 and the first resist pattern 23 are exaggerated.

As shown in FIG. 18A, in the present embodiment, the film thickness of the first insulating film 25 in the center area II becomes thicker than that in the peripheral area I. Thus, the thick portion 25x of the first insulating film 25 is formed in the center area II.

Then, as shown in FIG. 18B, in order to improve the film thickness distribution of the first insulating film 25 in the substrate plane, the upper surface of the first insulating film 25 is polished by the CMP. The flatness of the first insulating film 25 can be improved to some extent by such CMP, but the upper surface of the first insulating film 25 is not completely planarized, and normally the thick portion 25x still remains in the center area II.

Subsequently, as shown in FIG. 18C, the first resist pattern 23 is formed on the first insulating film 25 in a manner that the thick portion 25x, which is thicker than the reference film thickness $\Delta T_1$ that is upper limit of suppressing the contact failure, is exposed from the resist pattern 23.

Figure 19:
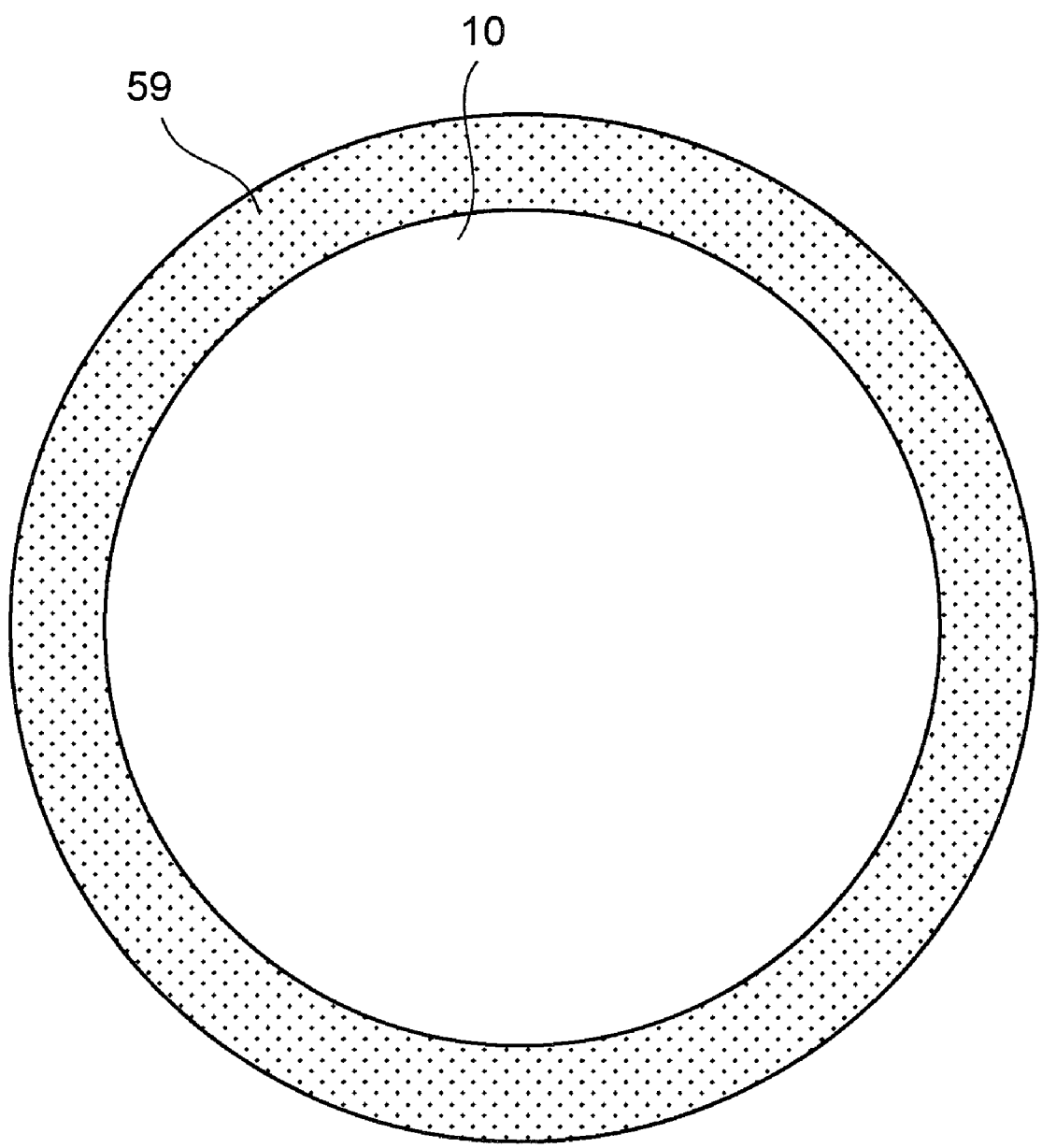
FIG. 19 is a plan view of a first resist pattern in the fourth embodiment.

FIG. 19 is a plan view of the first resist pattern 23 in the present embodiment. As shown in this figure, the first resist pattern 23 has an annular plan shape from which the thick portion 25x is exposed.

Then, the first insulating film 25 is etched by using the first resist pattern 23 as a mask. Thus, as shown in FIG. 18C, the thick portion 25x, which is thicker than the reference film thickness $\Delta T_1$, is thinned.

This etching is executed by either of the dry etching, the sputter etching, and the wet etching, and the same conditions as those in the first embodiment are employed as the etching conditions.

After this etching is ended, the first resist pattern 23 is removed.

Thereafter, the same steps as those in FIG. 8C to FIG. 9R explained in the first embodiment are executed.

In the present embodiment, the thick portion 25x of the first insulating film 25 is thinned by the etching. Therefore, such a situation can be prevented that the first to fourth contact holes 38a to 38d are not opened because of the presence of the thick portion 25x in the step in FIG. 8M. Accordingly, such a situation can be suppressed that the contact failure is generated in the first to fourth conductive plugs 40a to 40d (see FIG. 8N) buried in these contact holes 38a to 38d.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device manufacturing method, comprising:
   forming an insulating film over a semiconductor substrate;
   thinning selectively a thick portion, whose film thickness is thicker than a reference value, of the insulating film;
   forming a hole in the thinned portion of the insulating film; and
   forming a conductive plug in the hole, wherein
   in the forming of the insulating film, in a global in-plane distribution of a film thickness of the insulating film, the film thickness is increased toward a peripheral area from a center area of the semiconductor substrate.

2. A semiconductor device manufacturing method according to claim 1, wherein the thinning of the thick portion of the insulating film comprises:
   forming a resist pattern over the insulating film except the thick portion,
   etching selectively the thick portion that is not covered with the resist pattern and exposed, and
   removing the resist pattern.

3. A semiconductor device manufacturing method according to claim 2, wherein
   the resist pattern has a circular planar shape to cover the center area of the semiconductor substrate.

4. A semiconductor device manufacturing method according to claim 3, wherein the insulating film is formed by a plasma CVD method in which a mixed gas of a TEOS gas and an oxygen gas is used and a flow rate of oxygen is increased higher than a flow rate necessary for oxidation of the TEOS gas.

5. A semiconductor device manufacturing method according to claim 4, wherein the forming of the resist pattern comprises:
   coating a positive photoresist over the insulating film,
   irradiating an exposure light from a top of a shielding plate while placing the shielding plate whose planar size is smaller than the semiconductor substrate over the positive photoresist, and exposing only the peripheral area of the positive photoresist by the exposure light irradiated out of the shielding plate, and
   developing the positive photoresist to form the resist pattern.

6. A semiconductor device manufacturing method according to claim 4, wherein the forming of the resist pattern comprises:
   coating a negative photoresist on the insulating film,
   irradiating an exposure light from a top of a shielding plate while placing the shielding plate having an opening that passes selectively the exposure light to the center area of the negative photoresist, and exposing only the center area of the negative photoresist, and
   developing the negative photoresist to form the resist pattern.

7. A semiconductor device manufacturing method according to claim 4, wherein the forming of the resist pattern comprises:
   forming a photoresist over the insulating film, and removing selectively the photoresist in the peripheral area to form the resist pattern, by dropping a solvent onto the photoresist in the peripheral area while turning the semiconductor substrate.

8. A semiconductor device manufacturing method according to claim 2, further comprising:
   after removing the resist pattern and when thinning the thick portion, chamfering a stepped portion formed on an upper surface of the insulating film.

9. A semiconductor device manufacturing method according to claim 8, wherein the chamfering of the stepped portion is executed either by etching the upper surface of the insulating film or polishing the upper surface.

10. A semiconductor device manufacturing method according to claim 1, further comprising:
    polishing an upper surface of the insulating film before or after thinning the thick portion.

11. A semiconductor device manufacturing method according to claim 1, further comprising:
    forming a cap insulating film on the insulating film after thinning the thick portion,
    wherein, when forming the hole, the hole is also formed in the cap insulating film.

12. A semiconductor device manufacturing method according to claim 11, further comprising:

forming a protection insulating film that prevents an entering of a reductive substance and is thinner than the cap insulating film, on the cap insulating film.

13. A semiconductor device manufacturing method according to claim 1, further comprising:
   forming an impurity diffusion region on the semiconductor substrate before forming the insulating film;
   wherein, when forming the hole, the hole is formed over the impurity diffusion region, and
   when forming the conductive plug, the conductive plug is connected electrically to the impurity diffusion region.

14. A semiconductor device manufacturing method according to claim 1, further comprising:
   forming a capacitor having a lower electrode, a capacitor dielectric film made of ferroelectric material, and an upper electrode.

15. A semiconductor device manufacturing method, comprising:
   forming an insulating film over a semiconductor substrate;
   thinning selectively a thick portion, whose film thickness is thicker than a reference value, of the insulating film;
   forming a hole in the thinned portion of the insulating film; and
   forming a conductive plug in the hole, wherein
   in the forming of the insulating film, in a global in-plane distribution of a film thickness of the insulating film, the film thickness is increased from a peripheral area to a center area of the semiconductor substrate.

16. A semiconductor device manufacturing method according to claim 15, wherein the thinning of the thick portion of the insulating film comprises:
   forming a resist pattern over the insulating film except the thick portion,
   etching selectively the thick portion that is not covered with the resist pattern and exposed, and
   removing the resist pattern.

17. A semiconductor device manufacturing method according to claim 15, wherein the resist pattern has an annular planar shape to cover the peripheral area of the semiconductor substrate.

* * * * *